(12) United States Patent
Komatsu et al.

(10) Patent No.: US 11,059,997 B2
(45) Date of Patent: Jul. 13, 2021

(54) POLISHING COMPOSITION

(71) Applicant: JGC CATALYSTS AND CHEMICALS LTD., Kanagawa (JP)

(72) Inventors: Michio Komatsu, Fukuoka (JP); Yukihiro Iwasaki, Fukuoka (JP); Hiroyasu Nishida, Fukuoka (JP); Yuji Tawarazako, Fukuoka (JP); Kazuhiro Nakayama, Fukuoka (JP)

(73) Assignee: JGC CATALYSTS AND CHEMICALS LTD., Kanagawa (JP)

( * ) Notice: Subject to any disclaimer, the term of this patent is extended or adjusted under 35 U.S.C. 154(b) by 0 days.

(21) Appl. No.: 16/477,616

(22) PCT Filed: Dec. 28, 2017

(86) PCT No.: PCT/JP2017/047260
§ 371 (c)(1),
(2) Date: Jul. 12, 2019

(87) PCT Pub. No.: WO2018/131508
PCT Pub. Date: Jul. 19, 2018

(65) Prior Publication Data
US 2019/0367777 A1     Dec. 5, 2019

(30) Foreign Application Priority Data

Jan. 16, 2017 (JP) .............................. JP2017-005435
May 12, 2017 (JP) .............................. JP2017-095760
Aug. 15, 2017 (JP) .............................. JP2017-156691

(51) Int. Cl.
*H01L 21/321* (2006.01)
*H01L 21/3105* (2006.01)
*H01L 21/306* (2006.01)
*H01L 21/304* (2006.01)
*H01L 21/302* (2006.01)
*H01L 21/02* (2006.01)
*C09K 3/14* (2006.01)
(Continued)

(52) U.S. Cl.
CPC .............. *C09G 1/02* (2013.01); *B24B 37/044* (2013.01); *C09G 1/00* (2013.01); *C09K 3/14* (2013.01);
(Continued)

(58) Field of Classification Search
None
See application file for complete search history.

(56) References Cited

U.S. PATENT DOCUMENTS

2013/0000512 A1*  1/2013  Saiki .......................... C08J 3/05
                                                                  106/164.3
2015/0104939 A1   4/2015  Reiss et al.
(Continued)

FOREIGN PATENT DOCUMENTS

CN    105829488    8/2016
JP    9-142840     6/1997
(Continued)

OTHER PUBLICATIONS

Shimizu et al., "Preparation and characterization of TEMPO-oxidized cellulose nanofibrils with ammonium carboxylate groups", International Journal of Biological Macromolecules, vol. 59, 2013, pp. 99-104.

(Continued)

*Primary Examiner* — Stephanie P Duclair
(74) *Attorney, Agent, or Firm* — Greenblum & Bernstein, P.L.C.

(57) ABSTRACT

A polishing composition comprising an abrasive grain; a modified microfibril cellulose in which at least a part of the cellulose units has a hydroxyl group at the C6 position oxidized to a carboxyl group; and a dispersion medium, wherein each content of Na and K is 100 ppm or less relative to the solids weight.

22 Claims, 6 Drawing Sheets

(51) Int. Cl.

| | |
|---|---|
| *C09G 1/02* | (2006.01) |
| *C09G 1/00* | (2006.01) |
| *C08B 15/04* | (2006.01) |
| *C01F 17/235* | (2020.01) |
| *C01B 33/18* | (2006.01) |
| *B24B 37/04* | (2012.01) |
| *B24B 37/00* | (2012.01) |

(52) U.S. Cl.
CPC .......... *C09K 3/1454* (2013.01); *C09K 3/1463* (2013.01); *H01L 21/02013* (2013.01); *H01L 21/302* (2013.01); *H01L 21/304* (2013.01); *H01L 21/30625* (2013.01); *H01L 21/31051* (2013.01); *H01L 21/31053* (2013.01); *H01L 21/3212* (2013.01); *C08B 15/04* (2013.01)

(56) References Cited

U.S. PATENT DOCUMENTS

2016/0200944 A1* 7/2016 Zhou .................. C09K 3/1436
 438/693
2016/0208153 A1 7/2016 Hede et al.

FOREIGN PATENT DOCUMENTS

| | | | |
|---|---|---|---|
| JP | 2011-047084 | | 3/2011 |
| JP | 2013-181169 | * | 9/2013 |
| JP | 2013-249449 | | 12/2013 |
| JP | 2015-196693 | | 11/2015 |
| JP | 2016-536428 | | 11/2016 |
| WO | 99/031195 | | 6/1999 |
| WO | 2015033025 | * | 3/2015 |
| WO | 2016/111165 | | 7/2016 |
| WO | 2016/159167 | | 10/2016 |

OTHER PUBLICATIONS

International Search Report issued in International Patent Application No. PCT/JP2017/047260, dated Apr. 3, 2018.

International Preliminary Report on Patenttability issued in International Patent Application No. PCT/JP2017/047260, dated Jul. 16, 2019.

Chinese Office Action, Chinese Patent Office, Application No. 201780083133.1, dated Sep. 30, 2020, English translation.

* cited by examiner

[Figure 1]
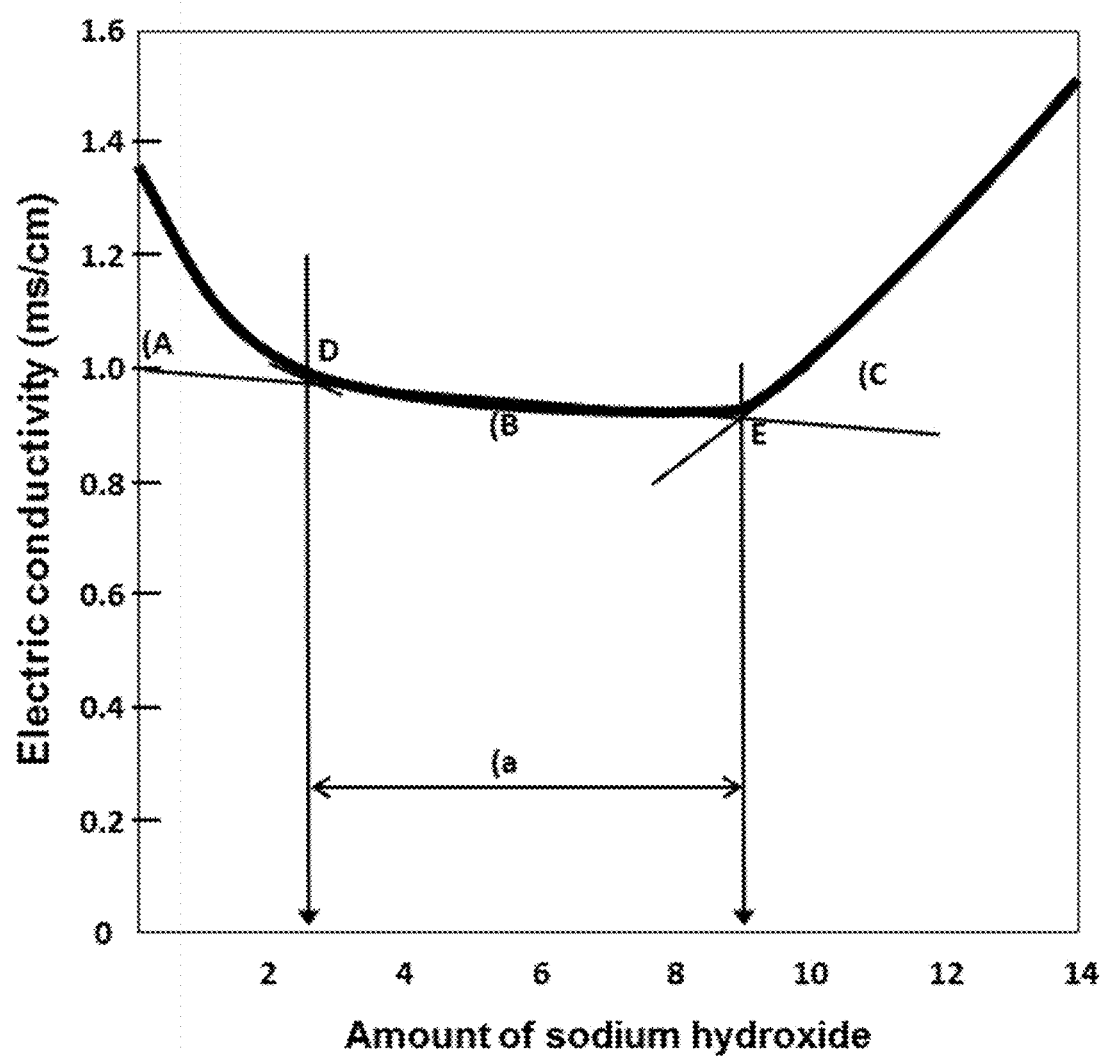

[Figure 2 (a)]
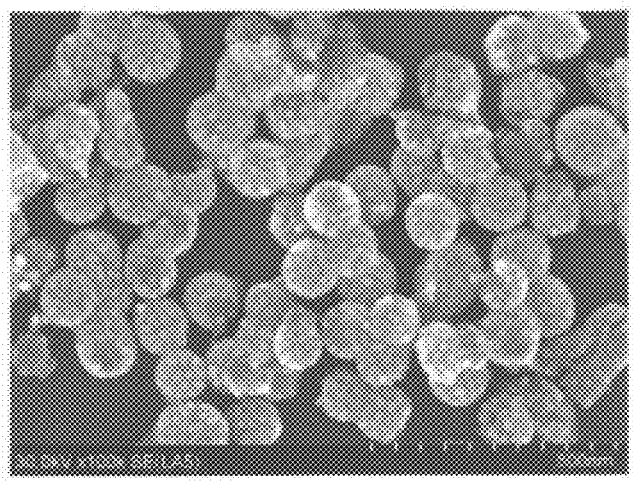
[Figure 2 (b)]
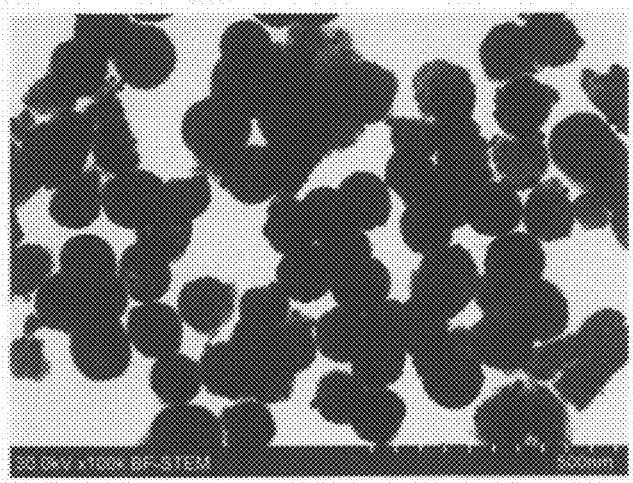
[Figure 2 (c)]
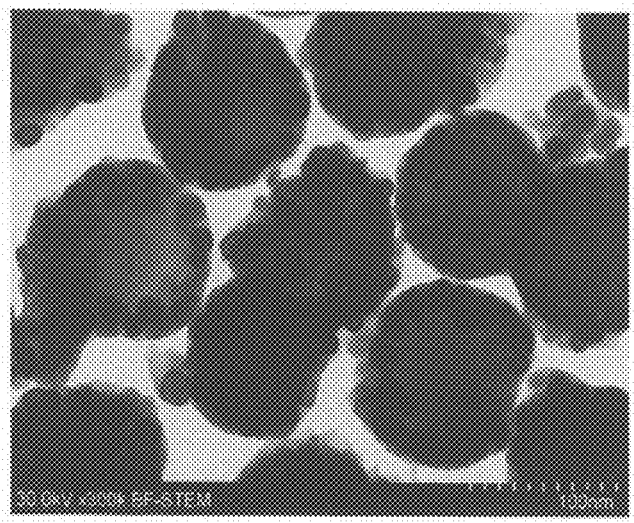

[Figure 3]
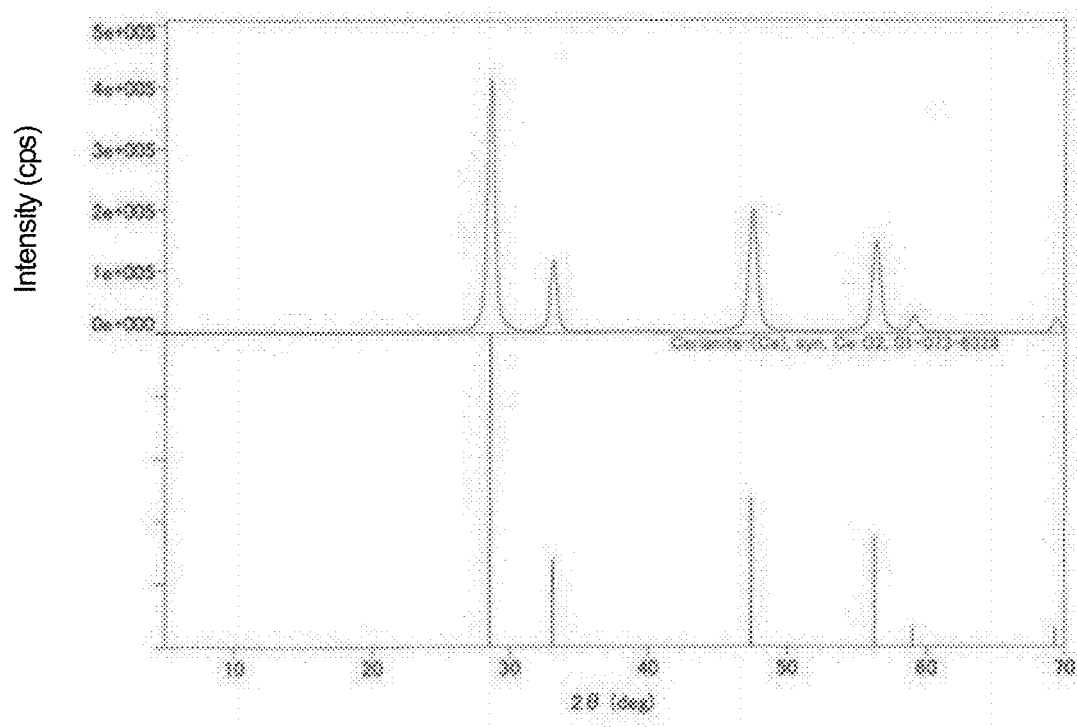

[Figure 4]
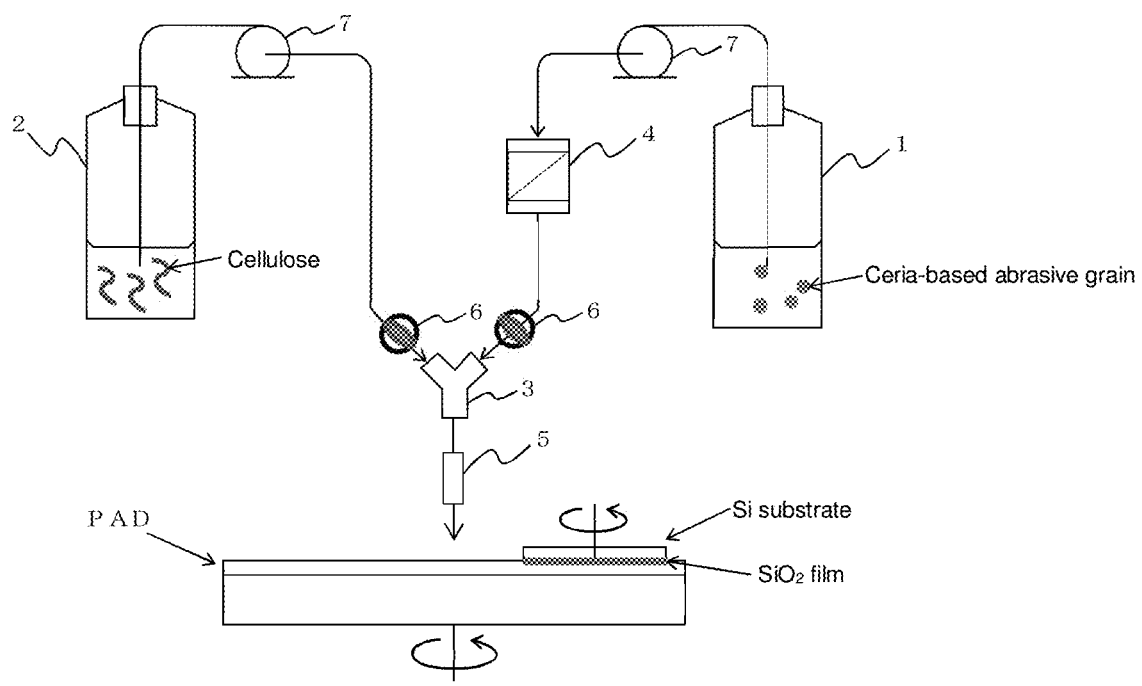

[Figure 5]
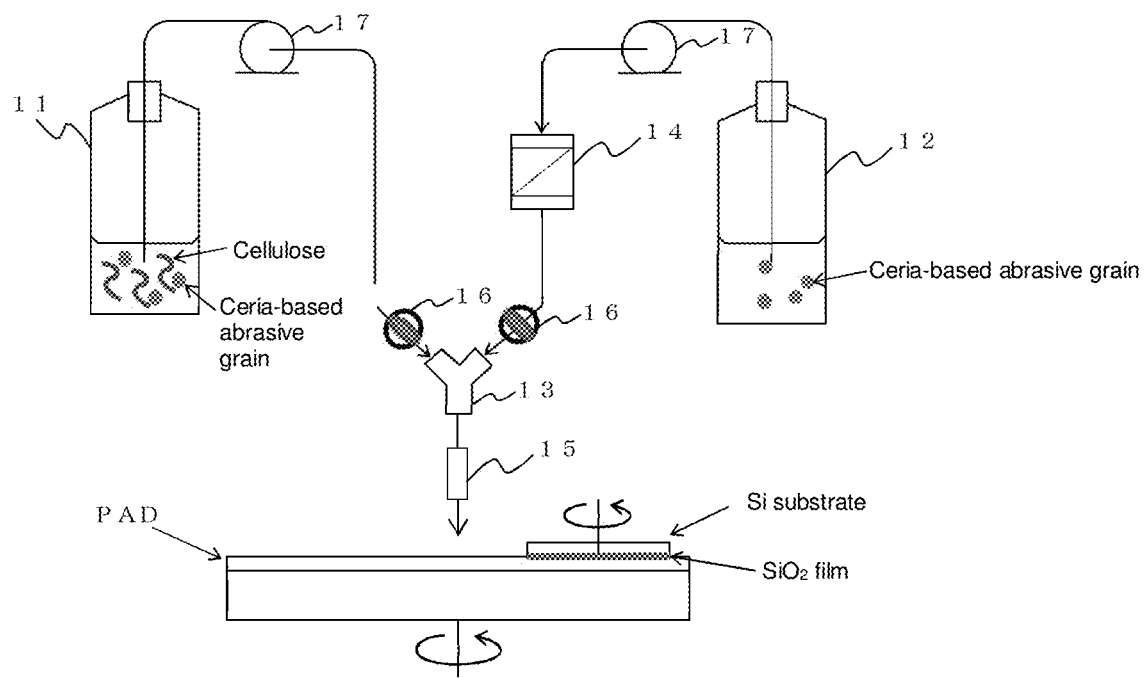

[Figure 6]
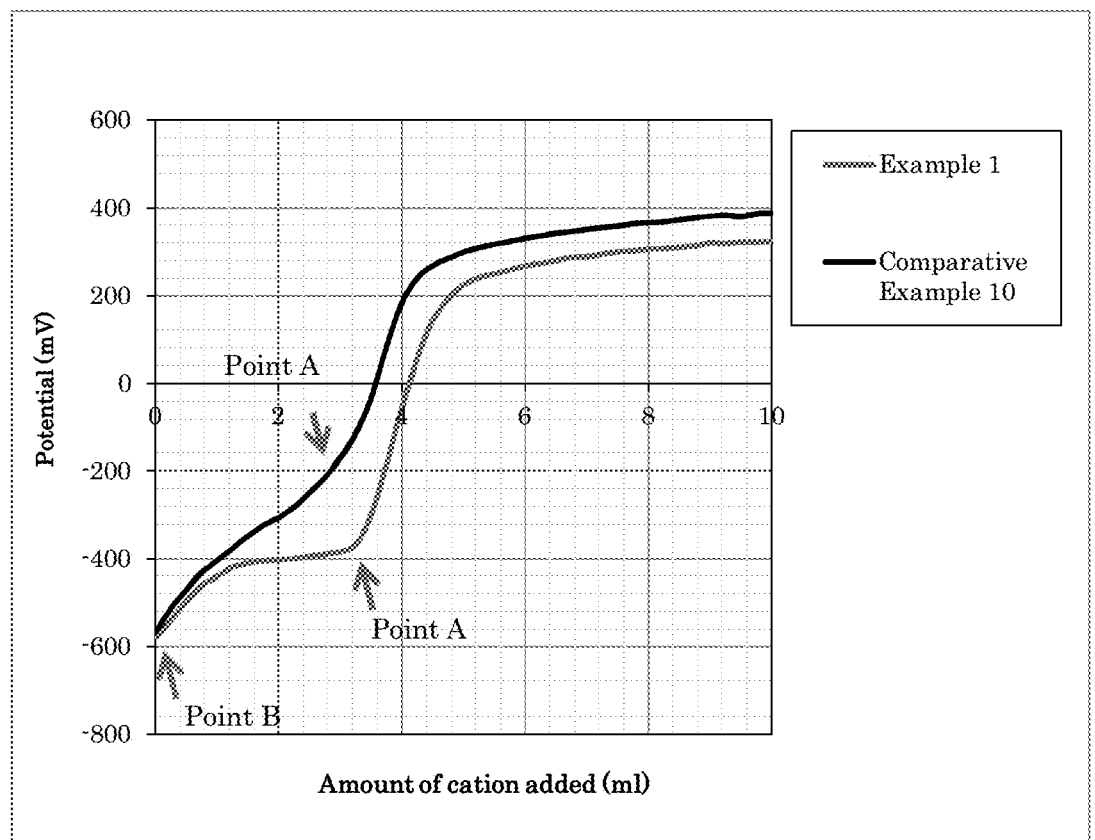

POLISHING COMPOSITION

TECHNICAL FIELD

The present invention relates to a polishing composition which, when polishing a substrate such as a substrate having a silica based film formed thereon, can polish the substrate at high speed, and causes few polishing flaws to occur in the substrate and little foreign matter residues such as abrasive grain or organic residues on the substrate.

BACKGROUND ART

Semiconductor devices such as semiconductor substrates and interconnection substrates are required to be polished on the surfaces and end surfaces of these components extremely accurately, because the state of the surfaces affect their semiconductor properties.

As a method for polishing such components, a method of subjecting them to a primary polishing process which is relatively rough, followed by a secondary polishing process which is precise, to obtain an extremely accurate surface with few flaws, for example, few scratches has been conventionally used.

As polishing agents used for such secondary polishing, for example, a colloidal silica-based polishing agent obtained by growing a silicon particle by thermal decomposition of silicon tetrachloride or the like and performing pH adjustment with an alkaline solution not containing any alkali metal such as an ammonia solution has been known. However, such polishing agents have had a problem that the polishing speed for an inorganic insulating film is not sufficient and the polishing speed is law.

On the other hand, a cerium oxide particle has a faster polishing speed in spite of lower hardness as compared with a silica particle or an alumina particle. Cerium oxide is also useful for final mirror polishing because it is less likely to damage the polishing surface. In addition, cerium oxide has chemically active properties, as known as a strong oxidizing agent. Cerium oxide is useful for application to chemical mechanical film polishing agents for insulating films, taking advantage of this point. However, application of cerium oxide to primary and secondary polishing processes for an inorganic insulating film for an LSI of 32 nm node and beyond has had a problem that it causes polishing flaws to occur due to its large primary particle diameter.

Patent Literature 1 discloses, for example, a polishing agent comprising cerium oxide particles, having a median particle diameter of 100 to 1500 nm, being composed of two or more crystallites and having crystal grain boundaries, obtained by calcining and then grinding cerium carbonate hydrate.

Patent Literature 2 discloses cerium oxide particles comprised of cerium oxide single crystals, each having a particle diameter of 10 to 80 nm, obtained by mixing under stirring, an aqueous solution of cerous nitrate and a base at such a quantitative ratio to provide a pH of 5 to 10, followed by rapid heating to 70 to 100° C. and aging at the same temperature. This Patent Literature describes that such cerium oxides particles are utilized as polishing materials for evenly finishing a glass surface, a quartz surface, a silicon surface, a tungsten surface, an electroless nickel-phosphorus plated surface, a cemented carbide surface and the like, that is, in the field of optical elements such as lenses, in the field of electronic materials that constitute display elements such as cathode ray tubes and liquid crystals, in the field of parts that constitute manufacturing equipment for electronic devices such as photomasks and in the field of data recording parts such as hard disks; as well as for planarization processing used during processing silicon wafers and manufacturing integrated circuits, that is, in the semiconductor manufacturing field.

Patent Literature 3 discloses a ceria-based composite particle dispersion comprising ceria-based composite particulates, having an average particle diameter of 50 to 300 nm, each of which has a child particle having crystalline ceria as a main component bound to the surface of a mother particle having amorphous silica as a main component. According to the ceria-based composite particulate dispersion, even Si wafers and difficult-to-process materials can be polished at high speed, while a high surface accuracy (such as low scratches) can be achieved.

CITATION LIST

Patent Literature

Patent Literature 1: International Publication WO 99/031195

Patent Literature 2: Japanese Patent Laid-Open Publication No. 9-142840

Patent Literature 3: International Publication WO 2016/159167

SUMMARY OF INVENTION

Technical Problem

However, the polishing material described in Patent Literature 1 is capable of high-speed polishing due to the large particle diameter but has been a problem that it easily causes polishing flaws to occur on the substrate. In addition, the cerium oxide particles tend to remain on a pad used for polishing because they are stuck in holes of the pad and the pad itself. Since the abrasive grains have a positive charge at a low pH, they have had a problem that they adhere to a substrate with a negative charge, causing trouble in circuit formation or lacking in polishing stability. Further, as the cerium oxide particles are rectangular in cross-section as observed with an electron microscope, they have had a problem that the abrasive grains are bad in rotational flowability and not stable in the polishing speed.

Although they may be sometimes coated with an organic material having a negative charge, there has been a concern that the organic material added contaminates the substrate.

Although the cerium oxide particles described in Patent Literature 2 do not easily causes polishing flaws to occur on a substrate due to their small particle diameter, they have had a problem that they are low in polishing speed. An increase in the polishing pressure, a decrease in pH or the like to increase the polishing speed have had a problem that the cerium oxide particles remain on the surface of the substrate and thereby increase defects in the substrate in the following steps or the like, which cannot be ignored.

For the silica-based composite particles described in Patent Literature 3, they have a large particle diameter and thus a high polishing speed; child particles having a small particle diameter come in contact with the surface to be polished and polishing flaws are thus less likely to occur on the substrate; and the child particles are bound to mother particles and the silica-based composite particles are thus less likely to remain on the substrate. In addition, the abrasive grains have good flowability and high polishing stability due to their spherical shape. However, there is a need for a polishing composition that has a still faster polishing speed, fewer polishing flaws, and fewer residual abrasive grains on the substrate.

Since cerium oxide has a large chemical polishing action, it is contemplated that the particle diameter of the child particles are reduced to increase the contact area and thereby increase the chemical polishing action, resulting in improvement in the polishing speed. However, the child particles are easily detached from the mother particles, and the detached cerium oxide child particles are easy to remain on the substrate, leading to an increase in defects and thus a decrease in yield.

If a fluorine compound or an amine compound highly reactive with silica is used to increase the chemical polishing action, the polishing speed is improved, but electrical problems due to erosion or residual contamination such as resist contamination are easy to occur.

It is also contemplated that the size of the composite particles is increased and the mechanical polishing action is thereby increased (torque for polishing by friction is increased) to improve the polishing speed. However, it leads to an increase in coarse particles and thereby an increase in defects such as scratches derived from the coarse particles.

Therefore, there is a need to improve the polishing speed by increasing the mechanical polishing action without increasing the particle size of the abrasive grain while keeping the chemical polishing effect.

A object of the invention is to provide a polishing composition that can polish a substrate having a silica film or the like thereon at high speed by increasing the mechanical friction effect with an abrasive grain not causing defects, and that can achieve high surface accuracy such as low scratches at the same time, and that is suitable for a semiconductor substrate.

Solution to Problem

The present inventors have intensively examined polishing compositions for substrates having a silica-based film formed thereon or the like, and have first focused on the relationship between a polishing pad and an abrasive grain. The surface of the polishing pad usually has irregularities formed by the dresser so that the polishing composition efficiently and uniformly spreads over the surface of the pad. The present inventors have thought that the relationship between the texture of the surface of the polishing pad and the polishing composition affects the polishing efficiency. That is, they have thought that improvement in the friction effect leads to an increase in the polishing efficiency. However, if the abrasive grain concentration and/or polishing pressure can be increased in relation to the texture of the surface of the polishing pad, the polishing efficiency can be improved, but an increase in the abrasive grain concentration has a problem that polishing flaws are increased and the polishing stability is impaired. An increase in the polishing pressure leads to an increase in the torque for polishing due to friction (increase in the mechanical polishing effect), but also to an increase in polishing flaws. Based on the above results, the present inventors have contemplated whether the friction effect could be increased without increasing the abrasive grain concentration and/or the polishing pressure.

As a result of further intensive examination under such consideration, the present inventors have found that the use of a polishing composition comprising a particular microfibril cellulose can dramatically can improve the polishing speed for a substrate having a silica-based film formed thereon, and realizing high surface accuracy (such as low scratches) at the same time, and have thereby completed the present invention.

In addition, the present inventors have found that based on this finding, both the polishing speed and a reduction in various defects which have been conventional problems to be dissolved can be achieved by using a polishing composition containing an abrasive grain and a particular microfibril cellulose for primary polishing and using a polishing composition containing an abrasive grain suitable for final polishing for secondary polishing. That is, the present inventors have found that based on the fact that the polishing composition containing an abrasive grain and a particular microfibril cellulose has a much faster polishing speed as compared to polishing with the abrasive grain alone, a substrate can be polished at high speed without causing defects such as scratches to occur, by multistage polishing including rough polishing followed by final polishing.

Furthermore, the present inventors have found that the inclusion of a particular acid component and a particular base component in a polishing composition can suppress a decrease in the polishing speed by stabilizing pH of the polishing composition while increasing the ionic strength of the polishing composition, so as to improve the polishing speed.

The present inventors have speculated the mechanism of a remarkable improvement in polishing characteristics of the present invention as follows:

(1) An abrasive grain is trapped in a modified microfibril cellulose due to the affinity between the surface of the abrasive grain and an oxidized carboxyl group at the C6 position of the modified microfibril cellulose or the like; and in polishing a substrate having a silica-based film formed thereon, the pressing pressure from a polishing pad is thereby effectively transmitted to the abrasive grain while the contact efficiency of the abrasive grain with the substrate is increased and the friction is thereby increased, resulting in improvement in the polishing speed. In addition, the modified microfibril cellulose having the abrasive grain trapped therein is retained appropriately in the texture of the polishing pad during polishing (semifixed in the convex and concave portions present in the polishing pad), so that the polishing efficiency becomes high.

(2) The polishing composition (dispersion) comprising a modified microfibril cellulose has fibers entangled and a high viscosity in a stationary state, but when a shear force is added thereto, the entanglement is released and the viscosity is extremely reduced. On the surface of the polishing pad having the convex and concave portions formed thereon, the shear force is added to this dispersion at locations where the gap between the polishing pad and the substrate is narrow (where, for example, the polishing pad is a convex portion and the substrate is a convex portion), so that the slurry (polishing composition) flows at high speed through the narrow gap between the pad and the substrate, resulting in improvement in the polishing speed. In contrast, the shear force is less likely to be added to the dispersion at locations where the gap between the polishing pad and the substrate is wide, and the polishing speed is low due to no replacement of slurry. That is, the polishing speed is fast at the locations where there is little distance between the polishing pad and the substrate (where the gap between the polishing pad and the substrate is narrow) due to a high shear rate, whereas it is low at the locations where there is some distance between the polishing pad and the substrate (where the gap between the polishing pad and the substrate is wide) due to a low shear rate, so that the effective polishing characteristics can be obtained by flattening the uneven substrate.

(3) Since a modified microfibril cellulose has a fiber length on the order of μm and a fiber diameter on the order of nm, it has a scavenging effect (hereinafter sometimes referred to as a scavenger effect) of flowing so as to sweep the substrate and removing residues such as a coarse grain that remains on the substrate, an abrasive grain (child particle) that easily adheres to the substrate, and other polishing wastes and organic matters. In addition, the residues on the substrate can be removed more efficiently with the affinity of the functional group of the modified microfibril cellulose. As a result, the retention time of the residues can be shortened, so that the occurrence rate of polishing flaws can be reduced, reducing the polishing flaws on the substrate.

(4) The polishing composition comprising a modified microfibril cellulose does not coarsen an abrasive grain in a tank and in a line due to the anti-settling and anti-agglomerating effects of the abrasive grain. That is, it has the effect of enabling the occurrence of scratches or the like to be suppressed due to its dispersion effect.

That is, the present invention is as follows.

[1] A polishing composition comprising an abrasive grain, a modified microfibril cellulose in which a cellulose unit has a carboxyl group, and a dispersion medium.

[2] The polishing composition according to [1], wherein the modified microfibril cellulose is a modified microfibril cellulose in which at least a part of the cellulose units has a hydroxyl group at the C6 position oxidized to a carboxyl group.

[3] The polishing composition according to [1] or [2], wherein each content of Na and K is 100 ppm or less relative to the solids weight.

[4] The polishing composition according to any one of [1] to [3], wherein each content of Ag, Al, Ca, Cr, Cu, Fe, Mg, Ni, Ti, Zn and Zr is 100 ppm or less relative to the solids weight.

[5] The polishing composition according to any one of [1] to [4], wherein the modified microfibril cellulose is an ammonium-type modified microfibril cellulose in which the hydrogen atom of the carboxyl group is replaced by ammonium.

[6] The polishing composition according to any one of [1] to [5], wherein the modified microfibril cellulose has a carboxyl group content of 0.5 to 2.8 mmol/g.

[7] The polishing composition according to any one of [1] to [6], wherein the modified microfibril cellulose is a cellulose fiber having a number average fiber diameter of 1 to 100 nm, a number average fiber length of 0.01 to 300 μm, and a ratio of the number average fiber length to the number average fiber diameter (number average fiber length/number average fiber diameter) of 10 to 3000.

[8] The polishing composition according to any one of [1] to [7], wherein the abrasive grain comprises at least one of cerium oxide, chromium oxide, silica, aluminum oxide, titanium oxide and iron oxide.

[9] The polishing composition according to any one of [1] to [8], wherein the abrasive grain is a ceria-based composite particulate having a mother particle having amorphous silica as a main component and a silica layer having amorphous silica as a main component provided on the surface of the mother particle, the silica layer having a child particle having crystalline ceria as a main component dispersed therein.

[10] The polishing composition according to [9], wherein the ceria-based composite particulate has:
an average particle diameter of 50 to 350 nm,
a mass ratio of silica to ceria ($M_{SiO2}:M_{CeO2}$) of 100:11 to 100:316, and an average crystallite size of ceria of 10 to 50 nm.

[11] The polishing composition according to any one of [9] or [10], wherein a flow potential curve obtained by cationic colloid titration is a curve in which the ratio of the amount of change in flow potential ($\Delta PCD$) to the amount (V) of a cation colloid titrant ($\Delta PCD/V$) added at the knick represented by the following formula (1) is −110.0 to −15.0:

$$\Delta PCD/V=(I-C)/V \quad \text{Formula (1)}$$

wherein C represents a flow potential (mV) at the knick; I represents a flow potential (mV) at the starting point of the flow potential curve; and V represents the amount (ml) of the cation colloid titrant added at the knick.

[12] The polishing composition according to any one of [1] to [11], wherein the polishing composition comprises:
an acid component comprising 0.0001 to 0.13 mol/L of an acetic acid group or nitric acid group; and
a base component comprising 0.003 to 0.13 mol/L of ammonium or an amine.

[13] The polishing composition according to any one of [1] to [12], wherein the polishing composition is used for polishing a semiconductor substrate having a silica film formed thereon.

[14] The polishing composition according to any one of [1] to [13], wherein a mass ratio of the modified microfibril cellulose to the abrasive grain (modified microfibril cellulose/abrasive grain) is 0.002 to 20.

[15] A modified microfibril cellulose in which at least a part of the cellulose units has a hydroxyl group at the C6 position oxidized to a carboxyl group, wherein each content of Na and K is 100 ppm or less.

[16] The modified microfibril cellulose according to [15], wherein each content of Ag, Al, Ca, Cr, Cu, Fe, Mg, Ni, Ti, Zn and Zr is 100 ppm or less.

[17] The modified microfibril cellulose according to [15] or [16], wherein the modified microfibril cellulose is an ammonium-type modified microfibril cellulose in which the hydrogen atom of the carboxyl group is replaced by ammonium.

[18] A method of producing a polishing composition comprising an ammonium-type modified microfibril cellulose, comprising: subjecting to ion exchange using an ion exchange resin, a dispersion comprising a modified microfibril cellulose in which at least a part of the cellulose units has a hydroxyl group at the C6 position oxidized to a carboxyl group; and then adding ammonia or an amine and adding an abrasive grain.

[19] A method of producing a polishing composition comprising an ammonium-type modified microfibril cellulose, comprising: subjecting to ion exchange with an ion exchange resin, a dispersion comprising a modified microfibril cellulose in which at least a part of the cellulose units has a hydroxyl group at the C6 position oxidized to a carboxyl group and an abrasive grain; and then adding ammonia or an amine.

[20] A method of producing an ammonium-type modified microfibril cellulose, comprising: subjecting to ion exchange with an ion exchange resin, a dispersion comprising a modified microfibril cellulose in which at least a part of the cellulose units has a hydroxyl group at the C6 position oxidized to a carboxyl group; and then adding ammonia or an amine.

[21] A method for producing a polished substrate comprising:
   a primary polishing step of polishing a substrate with a first polishing composition comprising the polishing composition according to any of [1] to [14]; and
   a secondary polishing step of polishing the substrate with a second polishing composition comprising an abrasive grain and a dispersion medium.

[22] The method for producing a polished substrate according to [21], wherein the abrasive grain in the first polishing composition and/or the second polishing composition has an average particle diameter of 10 nm or more and 350 nm or less and a number of coarse particles of 0.51 μm or more 100 million particles/mL or less of the abrasive grain on dry basis.

[23] The method for producing a polished substrate according to [21] or [22], wherein the polishing speed with the first polishing composition is higher by 1.2 times or more than that with the second polishing composition.

[24] The method of producing a polished substrate according to any one of [21] to [23], comprising using a polishing composition feeding device comprising: a particulate holding means for holding a dispersion comprising an abrasive grain; a cellulose holding means for holding a dispersion comprising a modified microfibril cellulose; a mixing section in communication with the particulate holding means and the cellulose holding means; a discharging means provided downstream of the mixing section; and a filtering means provided between the particulate holding means and the mixing section;
   wherein the primary polishing step is a step of feeding the dispersion comprising the abrasive grain from the particulate holding means through the filtering means to the mixing section while feeding the dispersion comprising the modified microfibril cellulose from the cellulose holding means to the mixing section to form the first polishing composition in the mixing section; and feeding the first polishing composition on a polishing pad from the discharging means to polish the first polishing composition; and
   wherein the secondary polishing step is a step of feeding the dispersion comprising the abrasive grain as the second polishing composition from the particulate holding means and passing it through the filtering means, and then feeding the second polishing composition from the discharging means onto the polishing pad to polish the second polishing composition.

[25] The method for producing a polished substrate according to any one of [21] to [23], comprising using a polishing composition feeding device comprising: a first polishing composition holding means for holding the first polishing composition; a second polishing composition holding means for holding the second polishing composition; a discharging means in communication with the first polishing composition holding means and the second polishing composition holding means; and a filtering means provided between the second polishing composition holding means and the discharging means;
   wherein the primary polishing step is a step of feeding the first polishing composition from the first polishing composition holding means and feeding the first polishing composition from the discharging means onto a polishing pad to polish the first polishing composition; and
   wherein the secondary polishing step is a step of feeding the second polishing composition from the second polishing composition holding means and passing it through the filtering means, and then feeding the second polishing composition from the discharging means onto the polishing pad to polish the second polishing composition.

[26] A method for producing a polished substrate, comprising polishing a substrate by dropping the polishing composition according to any one of [1] to [14] onto a polishing pad.

[27] The method for producing a polished substrate according to [26], wherein an abrasive grain has an average particle diameter of 10 nm or more and 350 nm or less and a number of coarse particles of 0.51 μm or more of 100 million particles/mL or less of the abrasive grain on dry basis.

Advantageous Effect of Invention

According to a polishing composition of the present invention, a substrate having a film formed thereon can be polished at high speed while a high surface accuracy such as low scratches can be achieved.

BRIEF DESCRIPTION OF DRAWINGS

FIG. 1 is an example of a graph used for measuring the content of the carboxyl group in a modified microfibril cellulose of the present invention.

FIG. 2(a) is an SEM image of a ceria-based composite particulate obtained in Preparatory Example 1, and FIG. 2(b) and FIG. 2(c) are TEM images of a ceria-based composite particulate obtained in Preparatory Example 1.

FIG. 3 is an X-ray diffraction pattern obtained in Example 1.

FIG. 4 is a schematic diagram showing a device (1) according to one embodiment used for a polishing method (1) of the present invention.

FIG. 5 is a schematic diagram showing a device (2) according to one embodiment used for a polishing method (2) of the present invention.

FIG. 6 is a graph showing a change in the flow potential plotted against the amount of a cation added for each of polishing slurries according to Example 1 and Comparative Example 10.

DESCRIPTION OF EMBODIMENTS

A polishing composition of the present invention is characterized by comprising an abrasive grain, a modified microfibril cellulose in which one or more cellulose units have a carboxyl group, and a dispersion medium. The modified microfibril cellulose is preferably a modified microfibril cellulose in which at least a part of the cellulose units has a hydroxyl group at the C6 position oxidized to a carboxyl group. The polishing composition of the present invention preferably has each content of Na and K of 100 ppm or less relative to the solids weight and has preferably each content of Ag, Al, Ca, Cr, Cu, Fe, Mg, Ni, Ti, Zn and Zr of 100 ppm or less relative to the solids weight.

The metal content (content rate) of the polishing composition is calculated based on the amount of ignition residues (solids content) at 200° C. of the polishing composition. The content (weight) of each metal such as Na comprised in the polishing composition can be measured in accordance with the measurement of that in a mother particle of a ceria-silica composite oxide particulate (1) described later.

The polishing composition of the present invention can be used as a polishing composition for a substrate having a silica-based film, a copper-based film, a tungsten-based film or the like formed thereon (including a semiconductor substrate and other substrates), and can be suitably used as a polishing composition for a substrate having a silica-based film thereon. More specifically, it can be suitably used for planarization of a semiconductor substrate having a $SiO_2$-based insulating film (such as CVD film, a thermal oxide film or a low dielectric constant film) formed thereon. The polishing composition of the present invention is preferably fed by a dropping method (not limited to intermittent feeding in the form of droplet, but including continuous feeding in the form of non-droplet).

The use of an abrasive grain in combination with a particular modified microfibril cellulose in the polishing composition of the present invention can realize: (a) a high polishing speed due to improvement in flowability and improvement in pressure transmissibility, (b) low defects (such as suppression of occurrence of scratches) due to improvement in flowability; (c) low abrasive grain residues due to the scavenger effect caused by the fiber shape of the modified microfibril cellulose; (d) storage stability, redispersibility and suppression of segregation in the polishing pad due to the abrasive grain-dispersing effect of the modified microfibril cellulose; (e) improvement in circuit substrate flatness based on non-Preston effect (pseudoplastic flow); (f) prolonged working life of the polishing pad due to the fact that a particle is less likely to remain on the polishing pad; and the like.

The polishing composition of the present invention preferably has a content of an alkali metal such as Na and K of 100 ppm or less relative to the solids weight, and is therefore useful for polishing a semiconductor substrate. Usually, when producing a modified microfibril cellulose, the treatment with sodium bromide or sodium hypochlorite, or NaOH or KOH is performed, and as a result, the produced modified microfibril cellulose dispersion contains Na or K. These Na or K ion and compounds thereof are not only fixed by ion exchange with a proton of carboxylic acid, but also physically fixed in the cellulose layer constituting the microfibril. The polishing composition of the present invention preferably has them removed, and therefore, it can prevent metal contamination and can further improve the polishing speed. The polishing composition prepared with the conventional modified microfibril cellulose dispersion usually contains over 100 ppm to about 5% by mass of Na or K relative to solids weight.

«Abrasive Grain»

The abrasive grain is, for example, a particulate having an average particle diameter of about 10 to 500 nm, and the material thereof can be appropriately selected depending on the material for the substrate to be polished or the compatibility with the modified microfibril cellulose. Specifically, the material of the abrasive grain preferably comprises at least one of cerium oxide (ceria), chromium oxide, silica, aluminum oxide, titanium oxide and iron oxide. That is, the abrasive grain is preferably comprised of one of such oxides or a composite oxide thereof. Among these, a particulate comprising ceria (ceria-based particulate) is preferable.

The abrasive grain comprised in the polishing composition of the present invention has a number of coarse particles of 0.51 μm or more of 100 million particles/mL or less, and preferably 70 million particles/mL of the abrasive grain or less on dry basis. Defects such as scratches can be thereby reduced.

For a method of measuring the number of coarse particles, each sample is diluted and adjusted with pure water so as to have 0.1% by mass of oxides (for example, for a ceria-based particulate, the sum of $CeO_2$ and silica), and 5 ml aliquots are then collected and each aliquot is injected into a conventionally known device for measuring the number of coarse particles. The number of coarse particles of 0.51 μm or more is then measured. This measurement is performed three times, a simple average value is determined, and the value multiplied by 1000 is defined as a value of number of coarse particles of 0.51 μm or more. For a ceria-based particulate, specifically, it is determined by the method described below.

<Number of Coarse Particles>

The number of coarse particles for a composite particulate is measured with Accusizer 780 APS manufactured by Particle Sizing System Inc. Each sample to be measured is diluted and adjusted with pure water to 0.1% by mass, and each of 5 ml aliquots is then injected into a measuring device and is subjected to measurement under the following conditions. After three measurements, the average value of the number of coarse particles of 0.51 μm or more is calculated from the measurement data obtained. The average value multiplied by 1000 is defined as a number of coarse particles of the ceria-based particulate on dry basis.

<System Setup>

Stir Speed Control/Low Speed Factor 1500/High Speed Factor 2500

<System Menu>

Data Collection Time 60 Sec.
Syringe Volume 2.5 ml
Sample Line Number: Sum Mode
Initial $2^{nd}$-Stage Dilution Factor 350
Vessel Fast Flush Time 35 Sec.
System Flush Time/Before Measurement 60 Sec./After Measurement 60 Sec.
Sample Equilibration Time 30 Sec./Sample Flow Time 30 Sec.

The content of an abrasive grain in the polishing composition of the present invention is preferably 0.1 to 10% by mass, and more preferably 0.2 to 3% by mass. The concentration lower than 0.1% by mass is effective against polishing flaws or the like, but decreases the polishing speed. The concentration higher than 10% by mass tends to make the redispersibility of settling slurry poor and polishing flaws (defects) large.

The content rate of each element of Na, Ag, Ca, Cr, Cu, Fe, K, Mg, Ni, Ti, Zn, Al and Zr in the abrasive grain is preferably 10 ppm or less, more preferably 5 ppm or less and still more preferably 1 ppm or less. When the content rate of each element is in this range, metal contamination can be prevented and the stability of the abrasive grain is more increased, so that the occurrence of scratches is more suppressed when the abrasive grain is applied to the polishing composition.

In addition, the content rate of each of U, Th, Cl, $NO_3$, $SO_4$ and F is preferably 1 ppm or less.

The content rate of each element refers to a value determined by the same method as that for a mother particle of a ceria-silica composite oxide particulate (1) described later.

«Ceria-Based Particulate»

The ceria-based particulate is not particularly limited in its form or the like as long as it is an oxide particulate comprising crystalline cerium oxide (ceria).

Examples of such a ceria-based particulate can include a particulate comprised of a substantially crystalline cerium oxide (ceria) such as colloidal ceria (ceria particulate) or a calcined ceria particulate, and a ceria-silica composite oxide particulate.

Examples of the particulate consisting of a substantially crystalline cerium oxide (ceria) include calcined ceria obtained by calcining and disintegrating a cerium salt such as cerium carbonate, cerium hydroxide, colloidal ceria or the like; and colloidal ceria obtained by synthesis by reaction of a ceria salt with an alkali source followed by disintegration. The particulate consisting of a substantially crystalline cerium oxide (ceria) preferably has an average particle diameter of 10 to 500 nm. The ceria preferably has a crystallite size of 10 to 300 nm.

The ceria-silica composite oxide particulate is an oxide particulate comprising at least crystalline ceria and silica, and may comprise other metals such as lanthanum, zirconium, aluminum or iron. The ceria may have silicon, lanthanum, zirconium or other elements solid-dissolved therein. Specific examples of the ceria-silica composite oxide particulate can include those having the following forms:

1) one having a silica layer as the outer layer of a silica particulate and having a ceria particulate dispersed in the silica layer (hereinafter referred to as "ceria-silica composite oxide particulate (1)";
2) one having a ceria particulate imbedded in a silica particulate;
3) one having a ceria particulate supported on the surface of a silica particulate;
4) one having a ceria layer as the outer layer of a silica particulate; and
5) one having a silica component and ceria component solid-dissolved.

Each of the ceria particulate having the form of 1), 2), 3) and 5) preferably has an average crystallite size of 10 to 50 nm. The average crystallite size of a ceria particulate can be measured using the measuring method for a child particle of a ceria-silica composite oxide particulate (1) described later can be used.

The ceria-silica composite oxide particulate preferably has an average particle diameter of 50 to 350 nm and more preferably 70 to 260 nm.

The average particle diameter is determined from a particle size distribution obtained by measuring an integrated particle size distribution (on volume basis) by laser diffraction/scattering. Specifically, it can be determined by the same method as that for a mother particle of a ceria-silica composite oxide particulate (1) described later. However, the calculation refractive index is used for measuring the composite particulate, which is a refractive index obtained by calculating the volume ratio of ceria to silica from the composition ratio of ceria to silica charged and calculating the refractive indexes of ceria and silica proportional divided to the volume ratio.

The ceria-based particulate may be any of the particulates exemplified above and may be a crystalline ceria particulate, but is preferably a ceria-silica composite oxide particulate and particularly preferably a ceria-silica composite oxide particulate (1).

The ceria-silica composite oxide particulate (1) is excellent in stability because it has its outermost layer covered with the silica layer and its surface thus has a negative potential. The silica layer of the outermost layer is easily detached or peeled off by pressure or frictional force during polishing and crystalline ceria is thus easily exposed, resulting in development of the polishing effect of ceria. Since the silica layer which is the outermost layer is formed on the silica mother particle, it is equivalent in size to crystalline ceria and exhibits a sufficient polishing force (polishing speed). By using a silica mother particle with a uniform particle size as a core, the particle diameter distribution becomes sharp, so that the occurrence of defects can be suppressed.

Hereinafter, the ceria-silica composite oxide particulate (1) will be described in detail.

The ceria-silica composite oxide particulate (1) has a mother particle having amorphous silica as a main component and a silica layer having amorphous silica as a main component provided on the surface of the mother particle, and the silica layer has a child particle having crystalline ceria as a main component dispersed therein.

The ceria-silica composite oxide particulate (1) can be produced, for example, by the method described in WO 2016-159167.

<Mother Particle>

The mother particle in the ceria-silica composite oxide particulate (1) is a particle having amorphous silica as a main component. Silica, which is spherical and uniform in particle diameter and particle diameter variation, is easily obtained.

The fact that the silica contained in the mother particle is amorphous is confirmed, for example, by grinding the mother particle with a mortar and subjecting to X-ray diffraction with a conventionally known X-ray diffractometer (for example, RINT 1400, manufactured by Rigaku Corporation) to obtain an X-ray differential pattern. If it is amorphous silica, such a peak of crystalline silica as appears for Cristobalite does not appear.

The term "main component" means that the component is present in the content rate of 90% by mass or more. That is, the content rate of amorphous silica in the mother particle is 90% by mass or more.

The mother particle preferably has a content rate of 95% by mass or more, more preferably 98% by mass or more and still more preferably 99.5% by mass or more, and further more preferably consists substantially of amorphous silica. As used herein, the term "substantially" means that although impurities or damaged materials from the raw materials or the production process may inevitably be contained, the others are not contained. The terms "main component" and "substantially" are intended to be used in such meanings in the following description of the present invention.

The mother particle has amorphous silica as a main component and may contain other substances such as crystalline silica and impurity elements. For example, the content rate of each element of Na, Ag, Ca, Cr, Cu, Fe, K, Mg, Ni, Ti, Zn and Al in the mother particle is preferably 10 ppm or less, more preferably 5 ppm or less, and still more preferably 1 ppm or less.

In addition, the content rate of each of U, Th, Cl, $NO_3$, $SO_4$ and F is preferably 1 ppm or less.

If the content rate of each element of Na, Ag, Ca, Cr, Cu, Fe, K, Mg, Ni, Ti, Zn, Al, U and Th in the mother particle is in the range of the above content rate, a child particle is tightly bound to the mother particle.

The content rate of each of the above-described elements in the mother particle is measured by the following method.

First, about 1 g of silica sol sample (solids content: 20% by mass) containing a silica particulate (mother particle) is collected in a platinum dish. To the sample are added 3 ml of phosphoric acid, 5 ml of nitric acid and 10 ml of hydrofluoric acid, and heated on a sand bath. Once dried and hardened, a small amount of water and 50 ml of nitric acid are added thereto to dissolve it and placed in a 100 ml volumetric flask, and water is added thereto until the total volume is 100 ml. Na and K in this solution are measured by an atomic absorption spectrophotometer (for example, Z-2310, manufactured by Hitachi, Ltd.). Next, the operation of separating a 10 ml-aliquot from 100 ml of the solution and transferring it in a 20 ml volumetric flask is repeated five times to obtain five 10 ml-aliquots. Each element of Ag, Ca, Cr, Cu, Fe, Mg, Ni, Ti, Zn, U and Th is then measured by a standard addition method with an ICP plasma emission analyzer (for example, SPS 5520, manufactured by Seiko Instruments, Inc.). The blank is also measured by the same method. The value obtained above by measurement for each element is adjusted by subtracting the value for the blank therefrom to use it as a measurement value for each element.

Hereinafter, unless otherwise noted, the content rate (content) of each component of Na, Ag, Ca, Cr, Cu, Fe, K, Mg, Ni, Ti, Zn, U and Th in the present invention is intended to mean the value obtained by measurement by such a method.

The mother particle preferably has an average particle diameter of 30 to 350 nm and more preferably 60 to 300 nm.

When the average particle diameter of the mother particle is in the above range, the dispersion of the present invention used as a polishing agent causes fewer scratches to occur and is excellent in dispersibility. Too small average particle diameter of the mother particle is not preferable, because the polishing rate is insufficient and a problem in the stability of the particles occurs. Too large average particle diameter tends to easily cause scratches to occur.

The average particle diameter of the mother particle is intended to mean the value obtained by measuring by the following method.

First, nitric acid is added to a ceria-silica composite oxide particulate (1) to dissolve only a child particle. Further, pure water is added thereto and stirred, and a mother particle is then caused to settle by centrifugation to remove a supernatant liquid. This is repeated followed by heating on a sand bath and drying to provide only a mother particle. Thereafter, the mother particle is dispersed in water to provide an aqueous dispersion having a solids concentration of 1% by mass. An integrated particle size distribution (on volume basis) is measured for this dispersion by laser diffraction/scattering with a known laser diffraction/scattering device (for example, LA-950, manufactured by HORIBA, Ltd.), and an average particle diameter (median diameter) is obtained from the particle size distribution.

The specific measurement conditions are as follows.

i) Measurement is performed with a measurement sequence in which the following are set in advance: the LA-950 V2 software version: 7.02; the algorithm option: standard operation; the refractive index of silica: 1.450; the refractive index of a solvent (pure water): 1.333; number of repetitions: 15; the circulation speed of the sample charging bath: 5; and the stirring speed: 2.

ii) A sample is placed in a sample inlet of the device so that the value of transmission (R) is 90%.

iii) After the value of transmission (R) becomes stable, the sample is irradiated with an ultrasonic wave for 5 minutes and the particle diameter is measured.

The mother particle is not particularly limited in its shape and may be spherical, bale-shaped, cocoon-shaped, short fiber-shaped, tetrahedron-shaped (triangular pyramid-shaped), hexahedron-shaped, octahedron-shaped and shapeless as well as it may have verrucose protrusions on its surface or be "konpeito"-shaped or porous, but it may be preferably spherical. The term spherical means that the proportion by number of mother particles having a short diameter/long diameter ratio of 0.8 or less is 10% or less. The proportion by number of mother particles having a short diameter/long diameter ratio of 0.8 or less is more preferably 5% or less and still more preferably 0%.

The short diameter/long diameter ratio is measured in same manner as in the measuring method (image analysis method) for a short diameter/long diameter ratio of the ceria-silica composite oxide particulate (1) described later.

<Child Particle>

The ceria-silica composite oxide particulate (1) has a child particle, having crystalline ceria as a main component, dispersed in the silica layer provided on the surface of the mother particle as described above. That is, the child particle is bound to the surface of the mother particle being dispersed in the silica layer.

The crystalline ceria can be confirmed as follows.

The crystalline phase of ceria can be detected by grinding ceria-silica composite oxide particulate (1) with a mortar and subjecting to x-ray diffraction with a conventionally known X-ray diffractometer (for example, RINT 1400, manufactured by Rigaku Corporation) to obtain an X-ray differential pattern. Particularly preferably, only the crystalline phase of ceria is detected.

Examples of the crystalline phase of ceria include Cerianite.

The child particle has crystalline ceria (crystalline cerium oxide) as a main component, and may contain other elements, for example, elements other than cerium.

However, as described above, it is preferable that when the ceria-silica composite oxide particulate (1) is subjected to X-ray diffraction, only the ceria crystalline phase is detected. That is, in such a case, even if the child particle contains a crystalline phase other than ceria, its content rate is low or the crystalline phase is in a solid solution state, and it therefore falls outside the detection range by X-ray diffraction.

The "main component" is defined as the same manner as described above.

As measured for a child particle by subjecting the ceria-silica composite oxide particulate (1) to X-ray diffraction, the maximum peak height of crystalline ceria, for example, the crystallite size on the (111) plane is 10 to 50 nm (full width at half maximum is 0.86 to 0.17°), preferably 12 to 30 nm (full width at half maximum is 0.72 to 0.28°) and more preferably 13 to 22 nm (full width at half maximum is 0.66 to 0.38°). The maximum peak may appear on another crystal plane such as the (100) plane. The average crystallite size of ceria in the present invention refers to the average crystallite size determined from the full width at half maximum of the crystal peak on the crystal plane on which the maximum peak height appears.

For example, the average crystallite size on the (111) plane of crystalline ceria can be obtained by the method described below.

First, the ceria-silica composite oxide particulate (1) is ground with a mortar and subjected to x-ray diffraction with a conventionally known X-ray diffractometer (for example, RINT 1400, manufactured by Rigaku Corporation) to obtain an X-ray differential pattern. The full width at half maximum on the (111) plane peak near 2θ=28 degrees in the obtained X-ray diffraction pattern is then measured, and the average crystallite size is determined by the following Scherrer equation:

$$D = k\lambda/\beta \cos\theta$$

wherein:
D: crystallite size (angstrom);
K: Scherrer constant (K=0.94 for the present invention);
λ: X-ray wavelength (1.5419 angstrom, Cu lamp);
β: full width at half maximum (rad); and
θ: reflection angle.

The apparent average size of the child particle is preferably 10 to 55 nm and more preferably 15 to 30 nm. The child particle may be spherical or rectangular but preferably rectangular from the viewpoint of achieving a high polishing speed. The ceria particle on the mother particle may be monodispersed or a plurality of ceria particles may be connected. The size of the ceria child particle larger than 55 nm causes ceria-silica composite oxide particulates (1) to coagulate together to make disintegration difficult, and tends to increase scratches.

The size of the child particle refers to a value obtained by measuring the average particle diameter for any 50 child particles in a photographic projection (for example, FIG. 2 (C) described later) of child particles obtained at a magnification of 300,000 times with a transmission electron microscope and simply averaging them.

<Silica Layer>

The silica layer provided on the surface of the mother particle has amorphous silica as a main component. The "main component" is defined as the same manner as described above. When the silica layer contains cerium, lanthanum, zirconium or the like, the bond of the silica layer with the mother particle becomes tight. The silica layer of the present invention is particularly preferably a layer containing cerium (cerium containing-silica layer). The production process of a ceria-silica composite oxide particulate (1) includes a process of adding a cerium metal salt to form a crystalline ceria particle (child particle), but this process leaves a cerium atom, which has not completely become a crystalline ceria particle, in the silica layer, and the silica layer is likely to become a cerium-containing layer. When the calcination temperature is high, ceria may diffuse from the silica layer and cerium may not be left in the layer, but even in such a case, the strength is not impaired as long as the above process is performed.

The ceria-silica composite oxide particulate (1) has a silica layer, which acts as a binder between the mother particle and the child particle, formed on the mother particle, and has a ceria particle which has grown dispersed in the silica layer. The silica mother particle and ceria child particle are thereby tightly bound, and the stability of the ceria-silica composite oxide particulate (1) is kept more. When it is applied to the polishing composition, the ceria particle is less detached and the occurrence of scratches due to the agglomeration of the ceria particle is more suppressed, as well as the abrasive grain residues on the substrate is less in spite of the fact that the ceria child particle is small in size. Even if a part of the silica layer is missing, there is no problem in terms of polishing function, since the other part of the silica layer that causes the ceria child particle to be bound to the mother particle sufficiently fixes the ceria child particle.

In the image (TEM image) obtained by observing the ceria-silica composite oxide particulate (1) with a transmission electron microscope, the child particle appears as a dark image on the surface of the mother particle, but the silica layer appears as a relatively thin image outside the child particle, that is, on the outer surface of the ceria-silica composite oxide particulate (1). In addition, when the ceria-silica composite oxide particulate (1) is subjected to EDS analysis to obtain an elemental distribution, a Ce-concentrated portion appears on the surface of the particulate, but a Si-concentrated portion appears further outside thereof.

Further, when the portion of the silica layer specified by the transmission electron microscope as described above is subjected to EDS measurement, in which an electron beam is selectively applied to the portion, to determine the atomic % of Si and the atomic % of Ce in the portion, it can be confirmed that the atomic % of Si is very high. Specifically, the ratio of the atomic % of Si to the atomic % of Ce (atomic % of Si/atomic % of Ce) is 0.9 or more.

It is thought that, in such a silica layer, the binding (force) of the child particle (ceria crystal particle) dispersed and grown in the silica layer to the mother particle (silica particle) is promoted in the calcination process. It is therefore thought that for example, in the step of obtaining a dispersion of the present invention, in which the ceria-silica composite oxide particulate (1) obtained by calcination can be subjected to wet disintegration (an operation of degrading an agglomerate back to the original primary particles) to provide a dispersion of the ceria-silica composite oxide particulate (1), the silica layer has an effect of preventing the child particle (ceria crystal particles) from being detached from the mother particle (silica particle). In this case, the local dropout of the child particle does not cause any problem, and the surface of the child particle may not be covered with the silica layer. It is sufficient that the child particle is bound tightly to the extent that it is not detached from the mother particle in the disintegration step.

It is thought that, when using the ceria-silica composite oxide particulate (1) in the polishing composition, such a structure increases the polishing speed and reduces the deterioration in surface accuracy and scratches. Generally, a calcined ceria particle has few —OH groups on the particle surface due to being crystallized, and ceria is different in potential from silica, a polished substrate and a polishing pad and is decreasing in a negative zeta potential at an alkaline to nearly neutral pH and has a positive potential opposite thereto in a weakly acidic pH. Therefore, the calcined ceria particle adheres to the polished substrate and the polishing pad due to the difference in potential and the difference in polarity, and it easily remains on the polished substrate and the polishing pad. On the other hand, the ceria-silica composite oxide particulate (1) keeps the negative potential due to the potential of the outermost layer covered by the negative charge provided by silica, and it less likely causes an abrasive grain to remain on the polished substrate and polishing pad.

As described above, the silica layer covers a part or the whole of the particulate having the child particle bound to the surface of the mother particle, but the silica layer may not necessarily cover completely the whole of the particulate having the child particle bound to the surface of the mother particle. That is, the silica layer is present on the outermost surface of the ceria-silica composite oxide particulate (1), but it is sufficient that the silica layer has such a form that it is easily detached, even if present, during polishing to cause the substrate and ceria child particles to react with each other. A part of the silica component may be also released into the abrasive grain dispersion. The silica is deposited on the surface of the ceria particle, mainly when the pH is adjusted to 4 to 9 during slurry preparation. The silica can make the potential of the ceria abrasive grain negative as well as it is not an inhibition factor for polishing but is rather expected to improve the polishing speed.

The outermost layer, that is, the silica layer is preferably a layer comprised of easily soluble silica (easily soluble silica-layer). It is expected that the easily soluble silica has an effect of causing the abrasive grain to adhere to the substrate and further to promote formation of a hydrated layer (fragile layer) on the polished substrate, resulting in improvement in the friction force during polishing and thereby an increase in the polishing speed.

<Ceria-Silica Composite Oxide Particulate (1)>

The mass ratio of the mother particles to the child particles in the ceria-silica composite oxide particulate (1) is preferably 100:11 to 100:316, more preferably 100:30 to 100:230, still more preferably 100:30 to 100:150, and particularly preferably 100:60 to 100:120. Too small amount of the child particles relative to mother particles may cause the mother particles to be bound with each other and thus cause coarse particles to occur. In such a case, the polishing composition of the present invention (polishing slurry) may cause defects (deterioration of surface accuracy such as an increase in scratches) to occur on the surface of the polished substrate. Too large amount of the child particles relative to the mother particles is not only costly but also increases the resource risk. In addition, it may promote fusion between particles, coarsen the particles and cause defects (scratches) to occur on the surface of the polished substrate.

The ceria-silica composite oxide particulate (1) has an irregular surface shape because it has a silica layer disposed on the surface of a silica particulate (mother particle) and crystalline ceria being in particle form (a child particle) is dispersed in the silica layer.

The particle size distribution of the ceria-silica composite oxide particle (1) may be either of a "particle-coupling type" or of a "monodispersed-type". However, it is desirably of a particle-coupling type because it can keep a high contact area with the substrate and has a high polishing speed. The particle-coupling type refers to a distribution of the ceria-silica composite oxide particulate (1) in which two or more mother particles are partially coupled to each other, and the number of coupling is preferably 3 or less. The mother particles are thought to be tightly bound to each other by having a history that at least one (preferably both) of the mother particles has been welded at their contact points or has been solidified due to the ceria interposed between the mother particles. The particle-coupling type also include the ceria-silica composite oxide particulate (1) in which the mother particles have been bound to each other before a cerium containing-silica layer is formed on the surface of each mother particle and in which a cerium containing-silica layer has been formed on the surface of each mother particle before one mother particle is bound to another mother particle.

Since the particle-coupling type can have a large contact area with a substrate, it can efficiently transmit polishing energy to the substrate and thereby have a high polishing speed.

It is preferable in the ceria-silica composite oxide particulate (1) that the proportion by number of particles having a short diameter/long diameter ratio of less than 0.80 (preferably 0.67 or less) as measured by an image analysis method is 45% or more.

The particles having a short diameter/long diameter ratio of less than 0.80 as measured by image analysis are thought to be of the particle-coupling type.

The ceria-silica composite oxide particulate (1) is not particularly limited in its shape, and may be a particle-coupling type particle or a single particle (uncoupling particle) and is usually a mixture of both.

Here, when emphasizing the improvement in the polishing rate for the substrate to be polished, the proportion by number of particles having a short diameter/long diameter ratio of ceria-silica composite oxide particulate (1) of less than 0.80 (preferably 0.67 or less) as measured by the image analysis method is preferably 45% or more (more preferably 51% or more).

When emphasis is on the fact that the surface roughness on the polished substrate is at a low level, the proportion by number of particles having a short diameter/long diameter ratio of ceria-silica composite oxide particulate (1) of 0.80 or more (preferably 0.9 or more) as measured by the image analysis method is preferably 40% or more and more preferably 51% or more.

The above-described particle-coupling type particles refer to particles coupled to each other as a result of chemical bonds occurring between the particles to such an extent that they cannot be redispersed (aggregated particles). The single particle does not refer to one in which plural particles are coupled to each other but to one which is not agglomerated regardless of the morphology of the particle.

When emphasizing the improvement in the polishing rate for the substrate to be polished, examples of the composite oxide particulate dispersion of the present invention can include the following variation 1.

[Variation 1] The dispersion of the present invention further characterized that the proportion by number of particles having a short diameter/long diameter ratio of less than 0.8 as measured by an image analysis method is 45% or more.

When emphasis is on the fact that the surface roughness on the polished substrate is at a low level, examples of the composite oxide particulate dispersion of the present invention can include the following variation 2.

[Variation 2] The dispersion of the present invention further characterized that the proportion by number of particles having a short diameter/long diameter ratio of 0.8 or more as measured by an image analysis method is 40% or more.

The measuring method of a short diameter/long diameter ratio by an image analysis method will be now described. In a photographic projection obtained by photographing a composite oxide particulate of the present invention at a magnification of 300,000 times (or 500,000 times) with a transmission electron microscope, the maximum diameter of the particle is defined as its long axis, and the length is measured and the measured value is defined as a long diameter (DL). The point on the long axis at which the long axis is bisected is specified, two points at which the straight line orthogonal thereto intersects the outer edge of the particle are determined, and the distance between the two points is measured and the measured value is defined as a short diameter (DS). The short diameter/long diameter ratio (DS/DL) is calculated from these values. For any 50 particles observed in the photographic projection, the proportion by number (%) of particles having a short diameter/long diameter ratio of less than 0.80 or 0.80 or more is determined.

The composite oxide particulate of the present invention is more preferably of the particle-coupling type described above, but may comprise those of other shapes such as a spherical particle.

The ceria-silica composite oxide particulate (1) preferably has a specific surface area of 4 to 100 $m^2/g$ and more preferably 20 to 70 $m^2/g$.

The measuring method of a specific surface area (BET specific surface area) will now be described.

First, a dried sample (0.2 g) is placed in a measuring cell, subjected to a degassing process at 250° C. for 40 minutes under a nitrogen gas flow, and is then kept at liquid nitrogen temperature under a flow of a mixed gas with 30% by volume of nitrogen and 70% by volume of helium to achieve the equilibrium adsorption of nitrogen to the sample. Next, while causing the above mixed gas to flow, the temperature of the sample is gradually raised to room temperature. The amount of nitrogen desorbed during that time is detected, and the specific surface area of the sample is measured with a calibration curve prepared in advance.

Such a measuring method of a BET specific surface area (nitrogen adsorption method) can be performed, for example, with a conventionally known device for measuring a surface area.

The specific surface area in the present invention is intended to mean a value obtained by measuring by such a method, unless otherwise noted.

The ceria-silica composite oxide particulate of the present invention preferably has an average particle diameter of 50 to 350 nm and more preferably 170 to 260 nm. The ceria-silica composite oxide particulate (1) preferably has an average particle diameter in the range of 50 to 350 nm because when applied to the polishing composition, the polishing speed of the abrasive grain is high.

Generally, when the polishing particle has an average particle diameter of 50 nm or less, the number of the abrasive grain is increased, but its size is too small and the polishing force of individual abrasive grain is insufficient, resulting in a slow polishing speed. The average crystallite size of the ceria-silica composite oxide particulate ceria of the present invention is as small as 10 to 50 nm, but ceria is dispersed in the silica layer at the outermost layer formed on the silica mother particle which is a core. The size of the silica composite oxide particulate (1) is therefore equivalent to that of crystalline ceria particulate (calcined ceria particulate), which is a sufficient size suitable for polishing. In addition, the silica layer covering the ceria child particle is easily detached due to the pressure and friction force during polishing to expose ceria, exhibiting a high polishing speed.

The average particle diameter of ceria-silica composite oxide particulate (1) is determined from a particle size distribution obtained by measuring an integrated particle size distribution (on volume basis) by laser diffraction/scattering. Specifically, it can be determined by the same method as that for the average particle diameter of a mother particle. However, the refractive index used for measuring the average particle diameter of the composite particulate was a refractive index obtained by calculating the volume ratio of ceria to silica from the composition ratio of ceria to silica charged and calculating the refractive indexes of ceria and silica proportional to the volume ratio. Specifically, in the case of the ceria-silica composite oxide particulate (1) in Preparatory Example 1, the refractive index of 1.651 was used.

«Modified Microfibril Cellulose»

The modified microfibril cellulose of the present invention is one in which each cellulose unit has a carboxyl group and preferably one in which at least a part of the cellulose units has a hydroxyl group at the C6 position oxidized to a carboxyl group.

The modified microfibril cellulose in which at least a part of the cellulose units has a hydroxyl group at the C6 position oxidized to a carboxyl group may have a hydroxyl group or an organic group other than the carboxyl group if desired. The hydroxyl group described above refers to a cellulose-specific hydroxyl group which has not been subjected to modification such as oxidation. Specifically, it refers to the hydroxyl group at the C2 position or C3 position of the cellulose unit or the hydroxyl group at the C6 position which is not oxidized to carboxyl group. The organic group is bound to directly or via a linking group to a carbon atom at the C2 position or C3 position of the cellulose unit or at the C6 position of the cellulose unit that is not oxidized to the carboxyl group at the cellulose unit. Examples of such a linking group include —$CH_2$—O—$CH_2$—.

As described later, the modified microfibril cellulose in which at least a part of the cellulose units has a hydroxyl group at the C6 position oxidized to a carboxyl group may have a structure in which the hydrogen atom of the carboxyl group is replaced by ammonium.

In the modified microfibril cellulose in which at least a part of the cellulose units has a hydroxyl group at the C6 position oxidized to a carboxyl group (including one having a structure in which the hydrogen atom of the carboxyl group is replaced by ammonium), the carboxyl group may be also bound to the carbon atom at the C6 position via a linking group. Examples of such a linking group include —$CH_2$—O—$CH_2$—.

The modified microfibril cellulose of the present invention is obtained, for example, by mechanically disintegrating a naturally occurring cellulose solid (pulp) raw material and then oxidizing it to deflocculate it, and it is a finely divided fiber having an oxidized group on its surface. In the process of biosynthesis of natural cellulose, a nanofiber referred to as a microfibril is first formed almost exclusively, and multiple nanofibers are bundled to form a higher-order solid structure. However, oxidation (surface modification) weakens the hydrogen bond between the surfaces of the above microfibrils which is a driving force of strong cohesive force between the microfibrils (deflocculation), so that multiple cellulose molecules are bundled to form a microfibril, and a part of the hydroxyl groups on the cellulose surface (hydroxyl groups at the C6 position of each of glucose units in the cellulose molecule) are oxidized to a carboxyl group.

It is thought that the modified microfibril cellulose of the present invention, in which the primary hydroxyl group at the C6 position or the like is oxidatively modified, has an affinity for an abrasive grain, so that the abrasive grain is trapped in the structure of an aqueous dispersion of the cellulose. This can also be understood from the fact that mixing them changes the surface potential and reduces the viscosity. This modified microfibril cellulose has also a high negative flow potential due to the presence of the oxidized group in its outermost layer and has thus good dispersibility. Since the modified microfibril cellulose is kept fibrous, it exhibits a structural viscosity (thickening effect) due to fiber entanglement but also exhibits a pseudoplastic flow in which the viscosity is rapidly reduced by an increase in the shear rate.

Therefore, the use of the modified microfibril cellulose of the present invention can realize: (a) a high polishing speed due to improvement in flowability and improvement in pressure transmissibility, (b) low defects (such as suppression of occurrence of scratches) due to improvement in flowability; (c) low abrasive grain residues due to the scavenger effect caused by the fiber shape of the modified microfibril cellulose; (d) storage stability, redispersibility and suppression of segregation in the polishing pad due to the abrasive grain-dispersing effect of the modified microfibril cellulose; (e) improvement in circuit substrate flatness based on non-Preston effect (pseudoplastic flow); (f) prolonged working life of the polishing pad due to the fact that a particle is less likely to remain on the polishing pad; (g) prevention of occurrence of defects by preventing abrasive grains from agglomerating and coarsening during storage or transportation, and the like, as described above.

The modified microfibril cellulose of the present invention alone has almost no polishing effect.

There is also a microfibril cellulose that can be obtained by mechanical grinding. However, such cellulose has not been subjected to such oxidization (surface-modification) as in the modified microfibril cellulose used in the present invention, and is thought to be different in affinity with the abrasive grain from the modified microfibril cellulose in the present invention. The present inventors examined the effect of the surface-unmodified microfibril cellulose by using a ceria-based composite particle as an abrasive grain, but no improvement in the polishing speed was observed (Comparative Examples 4 and 5).

A certain patent discloses that common celluloses such as carboxymethylcellulose (CMC) can improve the polishing speed by taking advantage of the property of exhibiting high structural viscosity in an aqueous solution due to their fibrous shape and the presence of —OH groups on the side chain. However, examination with a ceria-based composite particle as an abrasive grain by the present inventors did not show improvement in the polishing speed (Comparative Example 6).

These celluloses are thought to have no interaction with abrasive grains because they have no oxidized group on the side chain.

The content of the modified microfibril cellulose in the polishing composition of the present invention is preferably 100 to 10000 ppm, more preferably 500 to 8000 ppm, still more preferably 1000 to 6000 ppm, and most preferably 1000 to 4000 ppm. The content lower than 100 ppm may not improve the polishing characteristics or may only slightly improve them if any, and the content higher than 10000 ppm tends to deteriorate the handling property due to increase in viscosity.

The modified microfibril cellulose of the present invention has each content of Na and K of 100 ppm or less, preferably 50 ppm or less and more preferably 10 ppm or less. The content of each element of Ag, Al, Ca, Cr, Cu, Fe, Mg, Ni, Ti, Zn and Zr is preferably 100 ppm or less, more preferably 50 ppm or less and still more preferably 10 ppm or less.

The metal content (content rate) of such a modified microfibril cellulose is calculated as a content per weight of the modified microfibril cellulose, based on the amount of ignition residues at 200° C. of the polishing composition. The content (weight) of each metal such as Na comprised in the modified microfibril cellulose can be measured in accordance with the measurement of that in a mother particle of a ceria-silica composite oxide particulate (1).

Suitable examples of such a modified microfibril cellulose include an ammonium-type modified microfibril cellulose in which the hydrogen atom of the carboxyl group is replaced by ammonium. Specifically, in the production of a usual modified microfibril cellulose, which includes the treatment with a reagent containing Na or K, the hydrogen atom of the carboxyl group is replaced by Na or K, and the modified microfibril produced thereby contains more than 100 ppm of Na or K. In the present invention, Na or K is converted to ammonium to remove Na or K or the like. Herein, the ammonium contains, in addition to $NH_4^+$, an organic ammonium in which one or more hydrogen atoms of $NH_4^+$ are replaced by an organic group. As a result, metal contamination can be prevented as well as the polishing speed can be further improved. At the same time as removing Na and K, other metals can be removed.

The modified microfibril cellulose of the present invention may be sometimes oxidatively modified so that a part of hydroxyl groups may be converted to an aldehyde group or a ketone group. However, the oxidatively modified carboxyl group is important in the present invention. The carboxyl group in the modified microfibril cellulose of the present invention includes one having a salt form such as ammonium.

It can be confirmed whether the hydroxyl group at the C6 position of each glucose unit in the modified microfibril cellulose of the present invention molecule is selectively oxidized, for example, by a 13C-NMR chart.

The peak at 62 ppm corresponding to the primary hydroxyl group at the C6 position of the glucose unit, which can be confirmed by the 13C-NMR chart of the cellulose before oxidized, is disappeared after the oxidation reaction, and at the same time, the peak derived from the carboxyl group (at 178 ppm) appears.

The content of the carboxyl group in the modified microfibril cellulose of the present invention is preferably 0.5 to 2.8 mmol/g, more preferably 0.8 to 2.8 mmol/g and still more preferably 1.0 to 2.8 mmol/g. The content of the carboxyl group in the above range can realize polishing characteristics (high polishing speed, low abrasive grain residue, etc.) specific to the prevent invention more effectively. High storage stability, redispersibility or the like can be achieved.

The content of the carboxyl group can be measured, for example, by the method described in paragraph [0044] of WO 2011/074301. However, when a sample used for the measurement contains a weak acid and a weak base together, the sample is previously treated with a cation resin, and the resulting solution is further treated with an amphoteric ion exchange resin and adjusted back to the original pH with a 0.1 N aqueous sodium hydroxide solution to obtain a sample to be measured. Specifically, it is as follows.

A cellulose slurry (50 mL) having a solids concentration of 0.1% is prepared and a 0.1 M hydrochloric acid solution is added thereto to adjust the pH to 2.5. Then, electric conductivity is measured with an electric conductivity meter (model: F54, manufactured by HORIBA, Ltd.) while dropping a 0.05 N of aqueous sodium hydroxide solution. The measurement is continued until the pH reaches 11. By this operation, a graph as shown in FIG. 1 can be obtained.

As shown in the curved portion (A) in FIG. 1, at the initial stage of addition of sodium hydroxide, the electric conductivity is decreased sharply due to neutralization of protons derived from hydrochloric acid. Subsequently, as shown by the curved portion (B), a weak acid (carboxyl group) is neutralized, resulting in a slow decrease in the electric conductivity. Once neutralization of the weak acid is completed, the electric conductivity begins to be increased by addition of sodium hydroxide, as shown in curved portion (C). For the measuring of the carboxyl group content in the present invention, the carboxyl group content is calculated from the amount of sodium hydroxide (a) consumed between the intersection point D on the approximate line of curved portion (A) and the approximate line of curved portion (B) and the intersection point E on the approximate line of curved portion (B) and approximate line of curved portion (C) (that is, the amount of sodium hydroxide (a) consumed in the neutralization stage of the weak acid), using the following equation:

Carboxyl group content (mmol/g pulp)=$a$(ml)×0.05/ weight(g) of cellulose

The content of the carboxyl group determined by colloid titration (cationic polymer titration method by flow potential) is preferably 1.0 to 2.5 mmol, and more preferably 1.0 to 2.0 mmol. Specific measuring method is as follows. A cellulose slurry (100 mL) having a solids concentration of 0.1% is prepared and a 0.1% aqueous ammonia is added thereto to adjust the pH to 7. Then, 0.001 N cationic polymer (diallyldimethyl ammonium chloride, manufactured by Wako Pure Chemical Industries, Ltd.) is dropped to the resulting solution under stirring using a flow potentiometer (PCD-500 manufactured by Kyoto Denshi Kogyo Co., Ltd.)

to obtain the amount added (a) which causes the flow potential to be zero as a result of neutralization.

Carboxyl group content (mmol/g)=$a$(ml)×0.001/cellulose weight (g)

The carboxyl group content can be adjusted by controlling the amount of the co-oxidant added and reaction time used in the oxidation step of the cellulose fiber, as described later.

A part of hydroxyl groups of the modified microfibril cellulose of the present invention may be sometimes converted to aldehyde groups or ketone groups, but a part or all of the aldehyde groups or ketone groups may be converted back to hydroxyl groups using a reducing agent. The total content of the aldehyde group and the ketone group measured, for example, by the semicarbazide method is preferably 0.5 mmol/g or less, more preferably 0 to 0.2 mmol/g, and still more preferably substantially zero. The content of an aldehyde group or ketone group can be measured, for example, by the method described in Japanese Patent No. 5744775.

The shape of the modified microfibril cellulose of the present invention is a cellulose fiber having a number average fiber diameter of 1 to 100 nm, a number average fiber length of 0.01 to 300 μm, and a ratio of the number average fiber length to the number average fiber diameter (number average fiber length/number average fiber diameter) of 10 to 3000.

The number average fiber diameter is preferably 1 to 100 nm as described above, but from the viewpoint of dispersion stability, more preferably 2 to 100 nm and still further preferably 3 to 80 nm.

It is very difficult to produce a modified microfibril cellulose having a number average fiber diameter of less than 1 nm. Even if it can be produced, it may not contribute to the improvement in the polishing speed. In contrast, when the number average fiber diameter exceeds 100 nm, the amount of oxidized groups per cellulose molecule decreases and the interaction with the abrasive grain may be reduced. The maximum fiber diameter of the cellulose fiber is preferably 1000 nm or less and more preferably 500 nm or less.

The number average fiber length (longitudinal length of fiber) is preferably 0.01 to 300 μm as described above, but from the viewpoint of dispersion stability, more preferably 0.03 to 100 μm and still more preferably 0.05 to 50 μm. That is, when the number average fiber length is less than the above range, the rheological effect of pseudoplastic flow may be reduced, whereas when the number average fiber length exceeds the above range, the cellulose fiber may settle and may not develop the functionality caused by compounding a cellulose fiber. The maximum fiber length of the cellulose fiber is preferably 3000 μm or less and more preferably 500 μm or less.

The ratio of a number average fiber length to a number average fiber diameter (number average fiber length/number average fiber diameter) is preferably 10 to 3000 as described above, but from the viewpoint of polishing characteristics and handling, more preferably 10 to 1000 and still more preferably 10 to 500.

It is very difficult to produce a modified microfibril cellulose having the value of number average fiber length/number average fiber diameter of less than 10. Even if it can be produced, it cannot effectively transmit the pressure from the polishing pad to the abrasive grain and may not improve the polishing speed. In contrast, when the value of number average fiber length/number average fiber diameter exceeds 1000, the cellulose fiber may settle and the viscosity may be increased, so that the polishing composition may not be uniformly spread over the polishing pad, making it difficult to be handled.

The proportion by mass of the modified microfibrils in the polishing composition of the present invention is preferably 200 ppm by mass to 2.0% by mass from the viewpoint of exhibiting excellent polishing performance. The polishing composition having the proportion of the modified microfibril cellulose of less than 200 ppm by mass may not be improved in the polishing effect. The polishing composition having the proportion of the modified microfibril cellulose exceeding 2.0% by mass tend to be too high in the viscosity to be applied for a polishing use. In particular, it may be too high in the friction during polishing for a substrate to be rotated well and polished.

The mass ratio of the modified microfibril cellulose to the abrasive grain in the polishing composition of the present invention (modified microfibril cellulose/abrasive grain) is preferably in the range of 0.002 to 20, more preferably in the range of 0.005 to 15, still further preferably in the range of 0.01 to 10, and most preferably in the range of 0.01 to 5 from the viewpoint of exhibiting excellent polishing performance. When the amount of the modified microfibril cellulose to the abrasive grain is less than 0.002, the amount of the modified microfibril cellulose relative to the abrasive grain tends to be insufficient, making the polishing speed difficult to increase. When the amount of the modified microfibril cellulose to the abrasive grain exceeds 20, the amount of the modified microfibril cellulose relative to the number of abrasive grains tends to be too large to improve the polishing performance.

Specifically, the number average fiber diameter, number average fiber length, maximum fiber length and maximum fiber diameter of the modified microfibril cellulose of the present invention can be measured, for example, by the method described in paragraph [0023] of Japanese Patent No. 5744775 (fiber diameter) and a method pursuant thereto (fiber length).

The number average fiber diameter can be measured, for example, as follows. An aqueous dispersion of fine cellulose fibers having a solid fraction of 0.05 to 0.1% by mass is prepared and cast on a hydrophilized carbon film-coated grid to provide a sample for observation with a transmission electron microscope (TEM). When fibers having a large fiber diameter are contained, a scanning electron microscope (SEM) image on the surface of the dispersion cast onto glass may be observed. Each of the fibers is observed with an electron microscope image at a magnification of 5,000 times, 10,000 times or 50,000 times depending on the size of the constituent fibers. At this time, axes of arbitrary image widths in the vertical and horizontal directions are assumed in the obtained image, and the sample and observation conditions (such as a magnification) are adjusted so that 20 or more fibers intersect with each of the axes. After obtaining observation images that satisfy this condition, two random axes in each of the vertical and horizontal directions are drawn for each image and the fiber diameter of the fiber intersecting with the axis is visually read. In this way, the images of at least three non-overlapping surface portions are taken with an electron microscope, and each fiber diameter value of the fiber crossing two axes is read (at least 20 fibers×2×3=120 data of fiber diameters is thereby obtained). The number average fiber diameter and the maximum fiber diameter are calculated from the fiber diameter data obtained in this way.

The modified microfibril cellulose of the present invention usually has a type I crystal structure. For example, the modified microfibril cellulose having a type I crystal structure exhibits typical peaks at two positions near 2θ of 14 to 17° and near 2θ of 22 to 23° in WAXD (Wide Angle X-ray Diffraction) and can be therefore identified based thereon.

Next, a method for producing a modified microfibril cellulose used in the present invention described above will be described. The method for producing such a modified microfibril cellulose is not particularly limited as long as it can oxidize the hydroxyl groups at the C6 position of at least a part of cellulose units, and it can be produced by a conventionally known method. Specific examples of the method include the method described in Japanese Patent Laid-Open Publication No. 2009-243014 and the method described in Japanese Patent Laid-Open Publication No. 2013-181169.

The modified microfibril cellulose used in the present invention can be produced through a mechanical disintegration step, an oxidation reaction step, a purification step, a finely dividing step, and the like.

[Mechanical Disintegration Step]

A glucose structure (microfibril cellulose, chitin, chitosan or the like) having a fiber bundle structure is dispersed in water (a dispersion medium), and then slurried in a disintegration machine with high shear force such as a kneader or a wet disintegration machine. This step is terminated when it can be checked that natural cellulose has been increased in viscosity and dispersed. Examples of the natural cellulose can include cellulose derived from a plant, specifically such as softwood pulp, hardwood pulp, bagasse pulp, straw pulp or bamboo.

[Oxidation Reaction Step]

The natural cellulose slurry obtained in the above step and an N-oxyl compound are dispersed in water (a dispersion medium), and a co-oxidant is then added thereto to start the reaction. As the reaction proceeds, the carboxyl group is generated and the pH is lowered. Therefore, while the pH is kept at 9 to 12 and preferably 10 to 11 with an aqueous alkali solution or the like, and the reaction is allowed to proceed until the pH is not lowered. The co-oxidant is a substance, used as an oxidation catalyst, which oxidizes an N-oxyl compound. Examples of the co-oxidant used herein include hypohalous acid, halogenous acid, perhalogenic acid and a salt thereof. Among them, an alkali metal hypohalite such as sodium hypochlorite and sodium hypobromite are preferred.

The treatment in the oxidation reaction step is not limited to the above, and may be treatment with ozone and an ozone or oxygen-containing micro-nanobubble.

Examples of the N-oxyl compound can include a compound having a nitroxy radical generally used as an oxidation catalyst. The N-oxyl compound is preferably a water-soluble compound. Specifically, piperidine nitroxy oxy radical is preferable, and 2,2,6,6-tetramethylpiperidino oxy radical (TEMPO) is particularly preferable.

[Reduction Step]

After the oxidation reaction step, reduction treatment can be performed if necessary. In this step, an aldehyde group or a ketone group generated by the treatment in the oxidation reaction step are reduced to a hydroxyl group. Specifically, the cellulose after the oxidation reaction is dispersed in water, adjusted to a pH of about 10, and reduced with any of various reducing agents such as $NaBH_4$.

[Purification Step]

In this step, various by-products such as an unreacted co-oxidant are removed. Purification method can be performed by using any usual purification method such as water washing.

[Finely Dividing Step]

In this step, the purified cellulose fiber is dispersed (disintegrated) in a dispersion medium to provide a dispersion of a finely divided cellulose fiber. Water or an organic solvent can be used as the dispersion medium. A dispersing device that can be used is a high pressure homogenizer, an ultrahigh pressure homogenizer, a high speed shear mixer, an ultrasonic dispersion processor, a refiner, a beater or the like. The dispersion can be dried to provide a modified microfibril cellulose used in the present invention. The dispersion may be used for the polishing composition as it is without drying.

[Step for Removing Impurities]

The alkali metals contained in the dispersion obtained in the finely dividing step are preferably removed. Since the dispersion contains an alkali metal such as Na due to its production process, it is not preferable for use in the semiconductor field and the like. The dispersion can be used in the semiconductor field by removing an alkali metal and the like in this step. It is also preferable to remove an alkaline earth metal and a transition metal as well as an alkali metal.

Specifically, an ion exchange method and a washing method can be used, but the ion exchange method is preferable in terms of efficiency. The ion exchange method to be used may be any method which has an ion exchange capacity at least for an alkali metal, and if necessary, an ion exchange resin having an ion exchange capacity for an alkali metal, alkaline earth metal or transition metal may be used. A strong acid type cation exchange resin is preferable for efficiently removing an alkali metal or alkaline earth metal, and a chelate ion exchange resin is preferable for efficiently removing a transition metal. It is most preferably to perform ion exchange using a combination thereof.

Examples of the ion exchange method include a batch-type method and a column-type method, but it is not particularly limited as long as impurities can be removed. The concentration of the cellulose fiber during ion exchange is preferably 0.05 to 3%. When the concentration is higher than this concentration, the viscosity of the cellulose fiber is high and the ion exchange resin is not be sufficiently contacted with impurities. As a result, ion exchange takes longer than necessary, and the impurities may not be completely removed. Further, when the concentration is too low, the amount of the cellulose fiber obtained after the treatment is small, and the number of treatments thus needs to be increased, and is economically inefficient.

The pH condition during ion exchange is not particularly limited as long as impurities can be removed, but the pH is preferably less than 7 (pH<7) and more preferably less than 4 (pH<4). The pH less than 4 (pH<4) makes it possible to easily remove impurities in the microfibril cellulose.

When setting the pH of the modified microfibril dispersion to less than 4(pH<4), the modified microfibril cellulose of the present invention becomes gel-like substance, so that it can be separated from the supernatant. Coarse grains such as silica and impurities that cause scratches are dispersed in water because they are negatively charged at a pH more than 4 (pH>4). Therefore, this operation makes it possible to reduce coarse grains. This operation is preferably performed about two to four times.

Since the glucose structure having a fiber bundle structure is of natural origin, it contains not only an alkali metal and alkaline earth metal but also uranium, thorium or the like more or less, but they can be removed by treatment with a cation exchange resin, chelate resin, and the like as described above. The glucose structure may also contain an anion in a rare case. In this case, an anion exchange resin is preferably used in combination.

[Ammonia Conversion Step]

The modified microfibril cellulose is preferably converted to an ammonium-type modified microfibril cellulose at the same time as or after the step for removing impurities. For example, a dispersion comprising a modified microfibril cellulose is subjected to ion exchange with an ion exchange resin, and ammonia or an amine is added thereto to form a ammonium-type modified microfibril cellulose in which the hydrogen atom of the carboxyl group is converted to ammonium or the like. The ion exchange resin is preferably a strongly acidic cation exchange resin.

When preparing a polishing composition comprising an ammonium-type modified microfibril cellulose, an abrasive grain may be added at any time. That is, the abrasive grain may be added before or after ion exchange, or may be performed before or after adding ammonia or an amine.

Specifically, it is possible that after a dispersion comprising a modified microfibril cellulose is subjected to ion exchange with an ion exchange resin, ammonia or an amine is added and an abrasive grain is then added. It is also possible that after a dispersion comprising a modified microfibril cellulose is subjected to ion exchange with an ion exchange resin, an abrasive grain is added and ammonia or an amine is then added. It is further possible that after a dispersion comprising a modified microfibril cellulose and an abrasive grain is subjected to ion exchange with an ion exchange resin, ammonia or an amine is then added.

[Centrifugation Step]

The cellulose fiber in which impurities has been removed after the finely dividing step is preferably subjected to centrifugation. In this step, a cellulose fiber short in fiber length and a cellulose fiber long in fiber length are separated from each other. By providing this step, it is possible to obtain a cellulose fiber having an optimal fiber length and thereby further improve the polishing speed.

Centrifugation methods are classified into a batch-type method and a continuous-type method. Continuous-type centrifuges are classified into various types, such as a sediment automatic discharge-type centrifuge, a supernatant automatic discharge-type centrifuge, a centrifuge equipped with a separation plate inside a rotor, and a centrifuge having a cylindrical or bowl rotor. The method is not particularly limited as long as sufficient centrifugal acceleration is applied and in addition thereto, a component long in fiber length and a component short in the fiber length can be sufficiently separated. However, it is preferable that a batch-type centrifugation method is performed followed by adding water and decantation, in order to separate them almost completely. The layer containing a cellulose fiber short in fiber length (a slightly cloudy supernatant layer) has low viscosity and the layer containing a cellulose fiber long in fiber length (a semi-transparent underlayer) has very high viscosity, so that separation by decantation is easy. It is preferred that the centrifugal acceleration is 3000 G or more, preferably 5000 G or more, more preferably 7000 G or more, and most preferably 8000 G or more, although it depends on the centrifugal treatment time. The concentration of cellulose fibers in the centrifugation step is preferably 0.05 to 3%. When the concentration is higher than this concentration, the viscosity of a cellulose fiber dispersion is high and a cellulose fiber long in fiber length and a cellulose fiber short in fiber length may not be sufficiently separated. When the concentration is lower than this concentration, the method increase in the loading and is thereby uneconomical. By performing the centrifugation operation in two steps, coarse grains of 0.5 μm or more contained in the abrasive grains can be removed.

[pH Adjustment Step and the Like]

After the decantation step, the pH can be adjusted with an inorganic acid, an organic acid, ammonia, an amine or the like if necessary. When the pH of the cellulose fiber, which is almost neutral, is largely different from the pH of the abrasive grain, it may be matched to the pH of the abrasive grain in advance, because the abrasive grain may be agglomerated due to pH shock at the time of mixing the cellulose fiber with the abrasive grain.

Since the cellulose fiber in the underlayer obtained by decantation has a very high viscosity and is thereby difficult to handle, the viscosity can also be adjusted by adding ion-exchanged water thereto to decrease the concentration.

«Dispersion Medium»

The dispersion medium preferably has water as a main component. The "main component" is defined as the same manner as described above. Examples of the dispersion medium to be used include water such as pure water, ultrapure water or ion-exchanged water. The dispersion medium may contain an organic solvent. Examples of the organic solvent include alcohols such as methanol, ethanol, isopropanol, n-butanol and methylisocarbinol; ketones such as acetone, 2-butanone, ethyl amyl ketone, diacetone alcohol, isophorone and cyclohexanone; amides such as N, N-dimethylformamide and N, N-dimethylacetamide; ethers such as diethyl ether, isopropyl ether, tetrahydrofuran, 1,4-dioxane and 3,4-dihydro-2H-pyran; glycol ethers such as 2-methoxyethanol, 2-ethoxyethanol, 2-butoxyethanol and ethylene glycol dimethyl ether; glycol ethers acetate such as 2-methoxyethyl acetate, 2-ethoxyethyl acetate and 2-butoxyethyl acetate; esters such as methyl acetate, ethyl acetate, isobutyl acetate, amyl acetate, ethyl lactate and ethylene carbonate; aromatic hydrocarbons such as benzene, toluene and xylene; aliphatic hydrocarbons such as hexane, heptane, isooctane and cyclohexane; halogenated hydrocarbons such as methylene chloride, 1,2-dichloroethane, dichloropropane and chlorobenzene; sulfoxides such as dimethyl sulfoxide; and pyrrolidones such as N-methyl-2-pyrrolidone and N-octyl-2-pyrrolidone.

«Other Components and Conditions and the Like in the Polishing Composition of the Present Invention»

<pH Conditions>

The polishing composition of the present invention has a pH of 4 to 9. The pH of less than 4 of the polishing composition may cause ceria in the ceria-based composite particle of the present invention to elute as well as it may cause the oxidation-reduction potential to be changed. The polishing speed may thereby be decreased or the destabilization may occur. Further, the modified microfibril cellulose tends to be decreased in flow potential. The pH exceeding 9 of the polishing composition is likely to cause the pH change due to the elution of silica in the ceria-based composite particle of the present invention as well as it is likely to cause the pH change due to ion exchange or the like at the —CO—ONa group or —CO—OH group of the modified microfibril cellulose of the present invention. The polishing characteristics may thereby change.

When the polishing composition is adjusted to pH 7 or more, the pH adjusting agent to be used is alkaline. An amine such as aqueous ammonia, ammonium carbonate, ethylamine, methylamine, triethylamine or tetramethylamine is desirably used.

When the polishing composition is adjusted to less than pH 7, the pH adjusting agent to be used is an acidic pH adjusting agent. For example, an organic acid like hydroxy acids such as acetic acid, lactic acid, citric acid, malic acid, tartaric acid or glyceric acid, and a mineral acid such as hydrochloric acid or nitric acid are used.

<pH Buffering and Ionic Strength Conditions>

The polishing composition of the present invention preferably comprises an acid component comprising 0.0001 to 0.13 mol/L of and preferably 0.0003 to 0.1 mol/L of an acetic acid group or nitric acid group and a base component comprising 0.003 to 0.13 mol/L and preferably 0.01 to 0.1 mol/L of ammonium or an amine. This stabilizes the polishing characteristics due to pH stabilization while improving the polishing speed due to an increase in the ionic strength.

A nitrate, an acetate or the like can be used as an acid component. A compound containing ammonium or an amine, or the like can be used as a base component. Specifically, a nitrate or an acetate containing ammonium or an amine or the like can be used. Ammonium nitrate and ammonium acetate which are monobasic acids are particularly preferred.

The ionic strength of the polishing composition of the present invention (polishing slurry) is preferably 0.007 or more. When the ionic strength of the polishing composition is 0.007 or more, the improvement in the polishing speed is observed. The ionic strength has the upper limit of about 0.1 and is more preferably 0.01 to 0.04. The ionic strength of the polishing composition of the present invention is intended to mean the value calculated from the following equation.

$$J = \tfrac{1}{2} \Sigma C_i Z_i^2 \qquad \text{[Expression 1]}$$

Here, J represents an ionic strength; Ci represents a molar concentration of each ion; and Zi represents a valence of each ion. The molar concentration of each ion refers to an ion concentration of each substance that is dissociated at the pH of the polishing composition comprising the substance, and is therefore calculated using the acid dissociation constant pKa or base dissociation constant pKb of each substance. When a salt that is dissociated into $A^-$ and $B^+$ is added to the polishing composition, it is divided into an acid AH and a base BOH, and the ion concentrations of $A^-$ and $H^+$, and $B^+$ and $OH^-$ are calculated, respectively. The same applies to an acid to be used for pH adjustment or the like, and AH is divided into $A^-$ and $H^+$ and each concentration is calculated by application of the above equation.

<Polishing Promoter>

A conventionally known polishing promoter can be used if necessary in the polishing composition of the present invention, depending on the type of material to be polished. Such examples can include hydrogen peroxide, peracetic acid, urea peroxide and a mixture thereof. The use of the polishing composition containing such a polishing promoter such as hydrogen peroxide can effectively improve the polishing speed when the material to be polished is a metal.

Other examples of the polishing promoter can include an inorganic acid such as sulfuric acid, nitric acid, phosphoric acid, oxalic acid or hydrofluoric acid, an organic acid such as acetic acid, and a sodium salt, potassium salt, ammonium salt and amine salt thereof, and a mixture thereof. If the polishing composition contains such a polishing promoter, when polishing a material to be polished comprised of composite components, the finally flat polished surface is achieved by promoting the polishing speed for a particular component of the material to be polished.

When the polishing composition of the present invention contains a polishing promoter, the content thereof is preferably 0.1 to 10% by mass, and more preferably 0.5 to 5% by mass.

<Surfactant and/or Hydrophilic Compound>

In order to improve the dispersibility and stability of the polishing composition of the present invention, a cationic, anionic, nonionic or amphoteric surfactant or a hydrophilic compound can be added thereto. Both the surfactant and the hydrophilic compound have the effect of reducing the contact angle against the surface to be polished, and have the effect of promoting uniform polishing. Examples of the surfactant and/or the hydrophilic compound that can be used include those selected from the following group.

Examples of the anionic surfactant include a carboxylate salt, sulfonate salt and a sulfate ester salt. Examples of the carboxylate salt can include a soap, an N-acyl amino acid salt, a polyoxyethylene or polyoxypropylene alkyl ether carboxylate salt and an acylated peptide. Examples of the sulfonate salt can include an alkyl sulfonate salt, alkyl benzene or alkyl naphthalene sulfonate salt, a naphthalene sulfonate salt, a sulfosuccinate salt, an α-olefin sulfonate salt and an N-acyl sulfonate salt. Examples of the sulfate ester salt can include a sulfated oil, an alkyl sulfate salt, an alkyl ether sulfate salt, a polyoxyethylene or polyoxypropylene alkyl allyl ether sulfate salt and an alkyl amide sulfate salt.

Examples of the cationic surfactant can include an aliphatic amine salt, an aliphatic quaternary ammonium salt, benzalkonium chloride salt, benzethonium chloride, a pyridinium salt and an imidazolinium salt. Examples of the amphoteric surfactant can include a carboxybetaine-type amphoteric surfactant, a sulfobetaine-type amphoteric surfactant, amino carboxylate salt, imidazolinium betaine, lecithin and an alkylamine oxide.

Examples of the nonionic surfactant include an ether-type, ether ester-type, ester-type and nitrogen-containing type nonionic surfactant. Examples of the ether-type nonionic surfactant include a polyoxyethylene alkyl or alkyl phenyl ether, an alkylallyl formaldehyde-condensed polyoxyethylene ether, a polyoxyethylene/polyoxypropylene block polymer and a polyoxyethylene polyoxypropylene alkyl ether. Examples of the ether ester-type nonionic surfactant include a polyoxyethylene ether of a glycerin ester, a polyoxyethylene ether of a sorbitan ester and a polyoxyethylene ether of a sorbitol ester. Examples of the ester-type nonionic surfactant include a polyethylene glycol fatty acid ester, glycerin ester, polyglycerin ester, sorbitan ester, propylene glycol ester and sucrose ester. Examples of the nitrogen-containing type nonionic surfactant include a fatty acid alkanolamide, polyoxyethylene fatty acid amide and a polyoxyethylene alkylamide. Other examples include a fluorine-based surfactant.

The surfactant is preferably an anionic surfactant or nonionic surfactant, and the salt is preferably an ammonium salt, a potassium salt or a sodium salt and particularly preferably an ammonium salt or a potassium salt.

Further examples of the other surfactant and hydrophilic compound include an ester such as a glycerin ester, a sorbitan ester and alanine ethyl ester; an ether such as polyethylene glycol, polypropylene glycol, polytetramethylene glycol, a polyethylene glycol alkyl ether, a polyethylene glycol alkenyl ether, an alkyl polyethylene glycol, an alkyl polyethylene glycol alkyl ether, an alkyl polyethylene glycol alkenyl ether, an alkenyl polyethylene glycol, an alkenyl polyethylene glycol alkyl ether, an alkenyl polyethylene glycol alkenyl ether, a polypropylene glycol alkyl ether, a polypropylene glycol alkenyl ether, an alkyl polypropylene glycol, an alkyl polypropylene glycol alkyl ether, an alkyl polypropylene glycol alkenyl ether and an alkenyl polypropylene glycol; a polysaccharide such as alginic acid, pectic acid, carboxymethylcellulose, curdlan and pullulan; an amino acid salt such as glycine ammonium and glycine sodium; a polycarboxylic acid and its salt such as polyaspartic acid, polyglutamic acid, polylysine, polymalic acid, polymethacrylic acid, ammonium polymethacrylate, sodium polymethacrylate, polyamide acid, polymaleic acid, polyitaconic acid, polyfumaric acid, poly (p-styrenecarboxylic acid), polyacrylic acid, polyacrylamide, aminopolyacrylamide, ammonium polyacrylate, sodium polyacrylate, polyamide acid, ammonium salt of polyamide acid, sodium salt of polyamide acid or polyglyoxylic acid; a vinyl polymer such as polyvinyl alcohol, polyvinyl pyrrolidone or polyacrolein; a sulfonic acid and its salt such as ammonium methyl taurate, sodium methyl taurate, sodium methyl sulfate, ammonium ethyl sulfate, ammonium butyl sulfate, sodium vinyl sulfonate, sodium 1-allyl sulfonate, sodium 2-allyl sulfonate, sodium methoxymethyl sulfonate, ammonium ethoxymethyl sulfonate or sodium 3-ethoxypropyl sulfonate; and an amide such as propionamide, acrylamide, methylurea, nicotinamide, succinamide or sulfanylamide.

In the case of a semiconductor integrated circuit silicon substrate or the like, if the influence of contamination by an alkali metal, an alkaline earth metal or a halide or the like is not preferred, a surfactant based on acid of its ammonium salt is desirably used.

When the polishing composition of the present invention contains a surfactant and/or a hydrophilic compound, the total content thereof is preferably 0.001 to 10 g, more preferably 0.01 to 5 g and particularly preferably 0.1 to 3 g in 1 L of a polishing slurry.

The content of surfactant and/or hydrophilic compound is preferably 0.001 g or more in 1 L of polishing slurry from the viewpoint of obtaining sufficient effects, and preferably 10 g or less from the viewpoint of preventing a decrease in the polishing speed.

The surfactant or hydrophilic compound may be used alone or in combination of two or more, or used in combination with that of a different type.

<Heterocyclic Compound>

When the substrate to be polished contains a metal, the polishing composition of the present invention may contain a heterocyclic compound, for the purpose of forming a passive layer or a dissolution suppressing layer to suppress the erosion of the substrate to be polished. As used herein, the term "heterocyclic compound" refers to a compound having a heterocycle containing one or more hetero atoms. The hetero atom refers to any atom other than a carbon atom and a hydrogen atom. The heterocycle refers to a cyclic compound having at least one hetero atom. The hereto atom refers to only an atom that form a part of the ring system of the heterocycle, and does not refer to an atom that is located outside of the ring system, is separated from the ring system by at least one non-conjugated single bond or is a part of a substituent of the ring system. Preferred examples of the hetero atom include, but are not limited to, a nitrogen atom, a sulfur atom, an oxygen atom, a selenium atom, a tellurium atom, a phosphorus atom, a silicon atom and a boron atom. Examples of the heterocyclic compound that can be used include imidazole, benzotriazole, benzothiazole and tetrazole. More specific examples include, but are not limited to, 1,2,3,4-tetrazole, 5-amino-1,2,3,4-tetrazole, 5-methyl-1,2,3,4-tetrazole, 1,2,3-triazole, 4-amino-1,2,3-triazole, 4,5-diamino-1,2,3-triazole, 1,2,4-triazole, 3-amino-1,2,4-triazole and 3,5-diamino-1,2,4-triazole.

When the polishing composition of the present invention contains a heterocyclic compound, the content of the heterocyclic compound is preferably 0.001 to 1.0% by mass, more preferably 0.001 to 0.7% by mass and more still preferably 0.002 to 0.4% by mass.

<Nanobubble (Fine Bubble)>

The polishing composition of the present invention may have a nanobubble(fine bubble) added for the purpose of improvement in polishing performance; prevention of organic contamination of a substrate due to its inhibitory effect on the development and growth of algae, fungi such as molds and oomycetes with time in the polishing composition; stability such as filterability, maintenance of appearance, or improvement in concentration stability or filterability, due to an algicidal or sterilizing effect by using an aqueous nanobubble solution in the manufacturing process or product dilution process. The nanobubble having an average bubble diameter in the range of 50 to 500 nm is suitably used. The type of gas contained in a nanobubble is not particularly limited as long as the gas can exhibit the effect of disintegrating a microgel derived from the composition component by the rupture of the nanobubble, but it is generally preferable that it consists substantially of at least one selected from the group consisting of air, $N_2$, $H_2$ and $O_2$. The gas contained in the nanobubble is preferably a non-oxidizing gas. Such examples may include $N_2$ or $H_2$.

The method of adding a nanobubble to the polishing composition is not particularly limited, but, for example, is a method in which an aqueous solution containing a nanobubble (hereinafter, also referred to as "aqueous nanobubble solution") is added to and mixed with the polishing composition while keeping the polishing composition at 5 to 80° C. The aqueous nanobubble solution containing $10^5$/mL or more of a nanobubble having an average bubble diameter in the range of 50 to 500 nm is suitably used. <Solids Concentration of Polishing Composition of the Present Invention>

The concentration of the solids contained in the polishing composition of the present invention is preferably in the range of 0.1 to 30% by mass. Too low solids concentration may cause the polishing speed to be decreased. In contrast, too high solids concentration is uneconomical because it does not further improve the polishing speed in proportion to the concentration.

The concentration of solids contained in the polishing composition can be measured by weighing the ignition residues at 200° C.

<Flow Potential of Polishing Composition of Present Invention>

The polishing composition of the present invention is preferably one in which a flow potential curve obtained by cationic colloid titration is a curve in which the ratio of the amount of change in flow potential ($\Delta PCD$) to an amount (V) of a cation colloid titrant added ($\Delta PCD/V$) at the knick represented by the following formula (1) is −110.0 to −15.0:

$$\Delta PCD/V = (I-C)/V \qquad \text{Formula (1)}$$

wherein C represents a flow potential (mV) at the knick; I represents a flow potential (mV) at the starting point of the flow potential curve; and V represents an amount (ml) of the cation colloid titrant added at the knick.

Here, the cationic colloid titration is performed by adding the cationic colloid titrant to 80 g of the polishing composition of the present invention having the solids concentration adjusted to 1% by mass. A 0.001 N poly(diallyldimethylammonium chloride) solution is used as the cation colloid titrant.

The flow potential curve obtained by the cationic colloid titration is a graph in which the addition amount (ml) of the cationic titrant is taken on the X axis and the flow potential (mV) of the polishing composition of the present invention is taken on the Y axis.

As used herein, the term "knick" refers to a point (inflection point) at which the flow potential changes sharply in the flow potential curve obtained by the cationic colloid titration. Specifically, a point A on the flow potential curve shown in FIG. 6 is an inflection point, which is the knick. The flow potential at the point A is C (mV), and the addition amount of the cation colloid titrant at the point A is V (ml).

As used herein, the term "the starting point of the flow potential curve" is the flow potential of the polishing composition of the present invention before titration. Specifically, the start point is a point at which the addition amount of the cation colloid titrant is 0, as is the point B on the flow potential curve shown in FIG. 6. The flow potential at the point B is I (mV).

The value of ΔPCD/V of −110.0 to −15.0 further improves the polishing speed when the polishing composition of the present invention is used as a polishing agent. The ΔPCD/V is thought to reflect the degree of coating of the silica layer on the surface of the composite particle (for example, ceria-silica composite oxide particle) of the present invention, and/or the degree of exposure of the child particle (for example, ceria) or the presence of a silica layer which is easily detached, on the surface of the composite particle.

In addition, when the value of ΔPCD/V is in the above range, it is thought that the child particles are less likely to be detached during wet disintegration/grinding and the polishing speed is thereby high. On the other hand, when the absolute value of ΔPCD/V is larger than the absolute value of −110.0, it is thought that the composite particulate surface is entirely covered with the silica layer, so that dropout of child particles is less likely to occur in the disintegration/grinding process but the silica layer is less likely to be detached during polishing and the child particles is less likely to be exposed, resulting in a decrease in the polishing speed. In contrast, when the absolute value of ΔPCD/V is smaller than the absolute value of −15.0, dropout of child particles is thought to easily occur during wet disintegration/grinding. The present inventors estimate that when the value of ΔPCD/V is within the above range, the surface of the child particle is appropriately exposed and the dropout of child particles is small during polishing, resulting in further improvement in the polishing speed. The value of ΔPCD/V is more preferably −100.0 to −15.0 and still more preferably −100.0 to −20.0.

The polishing composition of the present invention preferably has a pH of 4 to 9 as described above. In this case, the current potential before starting the cationic colloid titration, that is, the flow potential when the titration amount is zero is preferably a negative potential. This is because when this flow potential keeps a negative potential, the abrasive grain (ceria-based composite particulate) is less likely to remain on the polished substrate which also shows a negative surface potential.

Hereinafter, the polishing method of the present invention using an abrasive grain and a modified microfibril cellulose (the method for producing a polished substrate) as described above will be described.

The first polishing method according to the present invention is characterized by comprising: a primary polishing step of polishing a substrate with a first polishing composition comprising an abrasive grain, a modified microfibril cellulose and a dispersion medium; and a secondary polishing step of polishing the substrate with a second polishing composition comprising an abrasive grain and a dispersion medium. The method of the present invention may further comprise a third step or the like.

The particulate used as the abrasive grain in the primary polishing step may be the same as or different from that used as the abrasive grain in the secondary polishing step. When the same particulate is used, the conditions for the first polishing composition are preferably matched with the conditions for the second polishing composition that requires more stringent conditions, from the viewpoint of a decrease in defects. On the other hand, when a different particulate is used, the conditions for the first polishing composition may be milder from the viewpoint of placing great importance on the polishing speed and of a decrease in defects. A ceria-based particulate is preferable as the abrasive grain.

The polishing method of the present invention can be applied to a substrate having a silica-based film, a copper-based film, a tungsten-based film or the like formed thereon (including a semiconductor substrate and other substrates), and can be suitably used for polishing a substrate having a silica-based film thereon. More specifically, it can be used for planarization of a semiconductor substrate having a $SiO_2$-based insulating film (such as CVD film, a thermal oxide film or a low dielectric constant film) formed thereon, and it can be particularly suitably used for polishing STI (Shallow Trench Isolation) substrate.

[Primary Polishing Step]

In the primary polishing step, the first polishing composition that places great importance on the polishing speed is used. The first polishing composition is characterized by comprising a ceria-based particulate; a modified microfibril cellulose in which at least a part of the cellulose units has a hydroxyl group at the C6 position oxidized to a carboxyl group; and a dispersion medium.

The first polishing composition of the present invention can realize improvement in flowability, and a high polishing speed due to improvement in pressure transmissibility and an increase in the number of contacts, by combining an abrasive grain with a modified microfibril cellulose that have a high affinity for the abrasive grain. For example, the first polishing composition has the polishing speed which is preferably higher by 1.2 times or more, more preferably higher by 1.5 times or more and still more preferably 2 times or more than that of the second polishing composition. As a result, compared to the use of the second polishing composition alone, it is possible to achieve a significant reduction in the polishing time with the same or higher surface accuracy.

In addition, the first polishing composition of the present invention can realize: low defects (such as suppression of occurrence of scratches) due to improvement in flowability; low abrasive grain residues due to the scavenger effect caused by the fiber shape of the modified microfibril cellulose; storage stability, redispersibility and suppression of segregation in the polishing pad due to the abrasive grain-dispersing effect of the modified microfibril cellulose; improvement in circuit substrate flatness based on non-Preston effect (pseudoplastic flow); prolonged working life of the polishing pad due to the fact that a particle is less likely to remain on the polishing pad; and the like.

[Secondary Polishing Step]

In the secondary polishing step, a second polishing composition that that places great importance on a decrease in defects such as scratches is used. The second polishing composition is characterized by comprising an abrasive grain and a dispersion medium.

[Specific Polishing Method]

The first polishing method according to the present invention can be performed using, for example, the following devices:

(1) A polishing composition feeding device comprising: a particulate holding means for holding a dispersion comprising an abrasive grain; a cellulose holding means for holding a dispersion comprising a modified microfibril cellulose; a mixing section in communication with the particulate holding means and the cellulose holding means; a discharging means provided downstream of the mixing section; and a filtering means provided between the particulate holding means and the mixing section.

(2) A polishing composition feeding device comprising: a first polishing composition holding means for holding a first polishing composition; a second polishing composition holding means for holding a second polishing composition; a discharging means in communication with the first polishing composition holding means and the second polishing composition holding means; and a filtering means provided between the second polishing composition holding means and the discharging means.

Hereinafter, a method using the polishing composition feeding device (1) is referred to as a polishing method (1), a method using the polishing composition feeding device (2) is referred to as a polishing method (2), and each of the polishing methods will be described.

[Polishing Method (1)]

The polishing method (1) can be performed using a device (1) according to one embodiment as shown in FIG. 4. As shown in FIG. 4, the device (1) comprises a particulate holding means 1 and a cellulose holding means 2. The particulate holding means 1 holds a dispersion comprising an abrasive grain (for example, a ceria-based abrasive grain). The cellulose holding means 2 holds a dispersion comprising a modified microfibril cellulose. Downstream of the particulate holding means 1 and the cellulose holding means 2 is provided a mixing section 3 in communication with them. During a primary polishing step, the abrasive grain dispersion from the particulate holding means 1 and the modified microfibril cellulose dispersion from the cellulose holding means 2 are mixed at the mixing section 3 to prepare a first polishing composition. The mixing section 3 may or may not comprise a stirring means. Between the particulate holding means 1 and the mixing section 3 is provided a filtering means (POU-filter) 4, which makes it possible to eliminate the coarse particles contained in the abrasive grain dispersion so as to suppress particularly the occurrence of defects such as scratches in the secondary polishing step. A discharging means 5 is provided downstream of the mixing section 3 and usually feeds the polishing composition on the polishing pad by the dropping method (including not only intermittent feeding in a droplet state but also continuous feeding in a non-droplet state).

The symbol 6 indicates a switching cock and the symbol 7 indicates a pump. The pumps 7 are preferably separate pumps to stabilize the feed rate depending on the viscosity of the dispersion. Each pump 7 is preferably a volumetric pump due to its high quantitativity.

In the primary polishing step, a substrate is polished by feeding the dispersion comprising the abrasive grain from the particulate holding means 1 through the filtering means 4 to the mixing section 3 while feeding the modified microfibril cellulose dispersion from the cellulose holding means 2 to the mixing section 3 to form a first polishing composition in the mixing section 3; and feeding the first polishing composition on a polishing pad from the discharging means 5. In this step, polishing is performed with a polishing composition of which the polishing speed is improved by the combination of the abrasive grain and the modified microfibril cellulose, by giving priority to the polishing speed.

In the secondary polishing step, the substrate is polished by feeding an abrasive grain dispersion as a second polishing composition from a particulate holding means 1 and passing it through a filtering means 4, and then feeding the second polishing composition from the discharging means 5 on the substrate. In this step, final polishing is performed with a polishing composition that does not comprise a modified microfibril cellulose but comprises an abrasive grain that has passed through the filtering means 4, by giving priority to achievement of high surface accuracy such as low scratches.

[Polishing method (2)]

The polishing method (2) can be performed using a device (2) according to one embodiment as shown in FIG. 5. As shown in FIG. 5, the device (2) comprises a first polishing composition holding means 11 for holding a first polishing composition, and a second polishing composition holding means 12 for holding a second polishing composition, and a discharging means 15 is provided downstream thereof. The discharging means 5 is common to the first polishing composition holding means 11 and the second polishing composition holding means 12 for holding the second polishing composition via a junction 13, but it may be separately provided for each polishing composition holding means, which case is also comprised in the present invention. The discharging means 5 usually feeds the polishing composition by the dropping method as in the device (1). Between the second polishing composition holding means 12 and the discharging means 15 is also provided a filtering means 14, which makes it possible to eliminate the coarse particles contained in the abrasive grain dispersion so as to suppress the occurrence of defects such as scratches. The symbol 6 indicates a switching cock and the symbol 7 indicates a pump.

In the primary polishing step, the first polishing composition is fed from the first polishing composition holding means 11, and it is fed from discharging means 15 to the substrate to polish it. In this step, polishing is performed with a polishing composition of which the polishing speed is improved by the combination of the abrasive grain and the modified microfibril cellulose, by giving priority to the polishing speed.

In the secondary polishing step, the second polishing composition is fed from the second polishing composition holding means 12 and passed through the filtering means 14, and it is then fed from the discharging means 15 on substrate to polish it. In this step, final polishing is performed with a polishing composition that does not comprise a modified microfibril cellulose but comprises an abrasive grain that has been passed through the filtering means 14, by giving priority to achievement of high surface accuracy such as low scratches.

Next, a polishing method according to the second polishing method of the present invention will be described.

The second polishing method according to the present invention is characterized by dropping a polishing composition comprising an abrasive grain, a modified microfibril cellulose and a dispersion medium on a polishing pad to polish the substrate.

As used herein, the term "dropping" is not limited to intermittent feeding in a droplet state but also includes continuous feeding in a non-droplet state, but it does not include spraying. For example, Japanese Patent Application Laid-Open Publication No. 2013-181169 describes a polishing agent composition containing a modified microfibril cellulose. However, as is apparent from the fact that the problem to be solved is sprayability and prevention of dripping, this publication discloses a substantially spray-type polishing composition. That is, the invention of the spray-type polishing composition disclosed in Japanese Patent Application Laid-Open Publication No. 2013-181169 is different from the dropping-type polishing composition of the prevent invention. It has been found that the present invention can realize improvement in various polishing characteristics, including improvement in the polishing speed, which are neither described nor suggested in Japanese Patent Application Laid-Open Publication No. 2013-181169.

The polishing method according to the second polishing method of the present invention can realize the following by using a polishing composition comprising an abrasive grain in combination of a modified microfibril cellulose that has a high affinity for the abrasive grain: (a) a high polishing speed due to improvement in flowability and improvement in pressure transmissibility, (b) low defects (such as suppression of occurrence of scratches)due to improvement in flowability; (c) low abrasive grain residues due to the scavenger effect caused by the fiber shape of the modified microfibril cellulose; (d) storage stability, redispersibility and suppression of segregation in the polishing pad due to the abrasive grain-dispersing effect of the modified microfibril cellulose; (e) improvement in circuit substrate flatness based on non-Preston effect (pseudoplastic flow); (f) prolonged working life of the polishing pad due to the fact that a particle is less likely to remain on the polishing pad; and the like.

The polishing composition used for the second polishing method according to the present invention is the same as the first polishing composition in the first polishing method according to the present invention as described above.

EXAMPLES

<Preparatory Example 1> Preparation of Ceria-Based Composite Particulate (Ceria-Silica Composite Oxide Particulate)

Preparation of «Silica Sol (Average Particle Diameter: 60 nm)»

Ethanol (12,090 g) and 6,363.9 g of ethyl orthosilicate were mixed to obtain a mixed liquid a1.

Then, 6,120 g of ultrapure water and 444.9 g of 29% aqueous ammonia were mixed to obtain a mixed solution b1.

Next, 192.9 g of ultrapure water and 444.9 g of ethanol were mixed to obtain a heel water (pre-charged water).

The heel water was adjusted to 75° C. under stirring, and the mixed liquid a1 and the mixed liquid b1 was simultaneously added thereto so that each addition was completed in 10 hours. After completion of addition, the resulting liquid was aged while keeping the temperature at 75° C. for 3 hours and the concentration of $SiO_2$ solids is then adjusted to 19% by mass to obtain 9,646.3 g of silica sol having an average particle diameter of 60 nm as measured by dynamic light scattering. The measurement by dynamic light scattering was performed with PAR-III manufactured by Otsuka Electronics Co., Ltd., using a liquid obtained by diluting the obtained silica sol with a 0.56% aqueous ammonia to a solids concentration of 1.0%.

Preparation of «Silica Sol (Average Particle Diameter: 108 nm)»

2,733.3 g of methanol and 1,822.2 g of ethyl orthosilicate were mixed to obtain a mixed liquid a2.

Then, 1,860.7 g of ultrapure water and 40.6 g of 29% aqueous ammonia were mixed to obtain a mixed liquid b2.

Next, 59 g of ultrapure water and 1,208.9 g of methanol were mixed to obtain a heel water, and 922.1 g of the silica sol having an average particle diameter of 60 nm obtained in the above step was added thereto.

The heel water containing the silica sol was adjusted to 65° C. under stirring, and the mixed liquid a2 and the mixed liquid b2 was simultaneously added thereto so that each addition was completed in 18 hours. After completion of addition, the liquid was aged while keeping the temperature at 65° C. for 3 hours, and the concentration of solids ($SiO_2$ solids concentration) is then adjusted to 19% by mass to obtain 3,600 g of high-purity silica sol.

The particles contained in this high-purity silica sol had an average particle diameter of 108 nm as measured by dynamic light scattering (PAR-III, manufactured by Otsuka Electronics Co., Ltd.). The content rate of each of alkalis, alkaline earth metals and the like as well as U, Th, Cl, $NO_3$, $SO_4$ and F was 1 ppm or less as measured by atomic absorption spectrometry or ICP measurement.

Then, 114 g of a cation exchange resin (SK-1BH, manufactured by Mitsubishi Chemical Corporation) was gradually added to 1,053 g of the high-purity silica sol and stirred for 30 minutes to separate a resin. At this time, the pH was 5.1.

Ultrapure water was added to the obtained silica sol to obtain 6,000 g of a liquid A having a $SiO_2$ solids concentration or 3% by mass.

<Preparation of Ceria-Based Composite Particulate>

Next, ion-exchanged water was added to cerium (III) nitrate hexahydrate (4N high-purity reagent, manufactured by KANTO CHEMICAL CO., INC.) to obtain a liquid B of 2.5% by mass in terms of $CeO_2$.

Next, the temperature of the liquid A (6,000 g) was increased to 50° C., and $CeO_2$ was added to solution B (8,453 g; in which $CeO_2$ corresponded to 117.4 parts by mass relative to 100 parts by mass of $SiO_2$) while vigorously stirring over 18 hours. During this time, the liquid temperature was kept at 50° C., and 3% aqueous ammonia was added if necessary to keep the pH 7.85.

After completion of addition of the liquid B, the temperature of the liquid was increased to 93° C. and it was aged for 4 hours. After completion of aging, it was left to stand in a room to be cooled. After cooled to room temperature, it was then washed with an ultrafiltration membrane while supplying ion-exchanged water. The precursor particle dispersion obtained after completion of washing had a solids concentration of 7% by mass, a pH of 9.1 (at 25° C.) and an electric conductivity of 67 μs/cm (at 25° C.)

Then, 5% by mass acetic acid was added to the obtained precursor particle dispersion to adjust the pH to 7, dried in a dryer at 100° C. for 16 hours, and then calcined with a muffle furnace at 1090° C. for 2 hours to obtain a powder.

375 g of ion-exchanged water was added to 125 g of the obtained powder, was further adjusted to pH 9 with a 3% aqueous ammonia solution, and then subjected to wet disintegration (on a batch-type bench sand mill, manufactured by Kansai Paint Co., Ltd.) with φ0.22 mm high-purity silica beads (manufactured by DAIKEN CHEMICAL CO., LTD.) to obtain 540 g of a ceria-based composite particulate dispersion having a solids concentration of 20% by mass. After disintegration, the beads were separated by passing them through a 44 mesh wire mesh and flushed with ion-exchanged water. The obtained dispersion has a solids concentration of 3.1% by mass. During disintegration, the pH was kept at 9.0 by adding aqueous ammonia.

The dispersion obtained by disintegration of the calcined powder was further subjected to centrifugation with a centrifuge (model number "CR21G", manufactured by Hitachi Koki Co., Ltd.) at 1700 G for 102 seconds to collect a light liquid. The collected light liquid was concentrated with a rotary evaporator, then diluted with ion-exchanged water to adjust the concentration to 20%, and filtered through a 3 μm filter (CCP-3-D1B, manufactured by Advantec Toyo Kaisha, Ltd.) to obtain a ceria-based composite particulate dispersion. The obtained ceria-based composite particulate dispersion had a solids concentration of 20%.

As the ceria-based composite particulate contained in the obtained ceria-based composite particulate dispersion was measured by an X-ray diffraction method, the diffraction pattern of Cerianite was seen.

The ceria-based composite particulate contained in the ceria-based composite particulate dispersion obtained in Preparatory Example 1 was observed with SEM and TEM. The SEM and TEM images (×100,000) are shown in FIGS. 2(a) and 2(b). In addition, a transmission electron microscopic image (×300,000) used for measuring a particle diameter of a child particle is shown in FIG. 2(c).

Furthermore, the X-ray differential pattern of the ceria-based composite particulate contained in the ceria-based composite particulate dispersion obtained in Preparatory Example 1 is shown in FIG. 3.

The X-ray diffraction pattern in FIG. 3 appears to show a fairly sharp Cerianite crystal. The TEM and SEM images appear to show that a mother particle has a cerium containing-silica layer on the surface thereof and a ceria child particle is dispersed in the cerium containing-silica layer.

It was observed, from FIG. 2, that a thin silica film was present so as to cover most of the outermost surface of the ceria-based composite particulate.

<Preparatory Example 2> Preparation of Modified Microfibril Cellulose

A mixture obtained by adding 0.50 g of sodium bromide and 0.05 g of 2,2,6,6-tetramethylpiperidine (TEMPO) to 300 ml of water was added to 4 g of softwood pulp and stirred to disperse the softwood pulp, and a 13% by mass aqueous sodium hypochlorite solution was added thereto so that the amount of sodium hypochlorite was 12.0 mmol/g relative to 1.0 g of the pulp, to start the reaction. The reaction was allowed to proceed for 120 minutes until the pH did not change while adding dropwise sodium hydroxide so as to keep the pH at 10.5 during the reaction. After completion of the reaction, the mixture was neutralized by adding 0.1 N hydrochloric acid. The neutralized liquid was filtered, suspended in ion-exchanged water, and filtered again for washing. This filtration and washing with water were repeated for purification to obtain a cellulose fiber having its surface oxidized.

Then, solid-liquid separation was performed by centrifugation, and ion-exchanged water was added to adjust solid concentration to 2.0% by mass. Thereafter, the pH of the resulting slurry was adjusted to 10 with a 5% aqueous sodium hydroxide solution. The slurry was subjected to reduction treatment by adding sodium borohydride in the amount of 0.2 mmol/g cellulose fiber to the slurry at a slurry temperature of 30° C. After the reaction, the mixture was neutralized by adding 0.1 N hydrochloric acid, and then purification was performed by repeating the filtration and washing with water, to obtain a purified cellulose fiber. Next, the purified cellulose fiber was diluted to 1% by adding ion-exchanged water thereto and treated once at a pressure of 100 MPa with a high pressure homogenizer. The obtained dispersion was concentrated with a rotary evaporator to obtain 2.0% by mass of a TEMPO oxidized modified microfibril cellulose (cellulose fiber (A)). The concentration of the cellulose fiber was determined from the ignition residues at 200° C.

The obtained cellulose fiber had a short diameter of about 6 nm as observed by TEM.

The cellulose fiber (A) obtained was diluted to 0.1% by mass by adding ultrapure water thereto. Then, a cation exchange resin (SK1BH, manufactured by Mitsubishi Chemical Corporation) was added thereto under stirring, and the addition was stopped when the pH reached 3.5.

Thereafter, the mixture was allowed to stand for 1 hour to separate a resin therefrom, and aqueous ammonia and ion-exchanged water was added thereto to obtain an ammonium-type high-purity cellulose fiber (A1) having a concentration of 2.0% by mass and a pH of 7.0.

The obtained high-purity cellulose fiber (A1) had a short diameter of about 6 nm as observed by TEM. The concentration of the cellulose fiber was determined from the ignition residues at 200° C.

The carboxyl group content in the cellulose fiber (A) was quantified according to the following procedure. The carboxyl group content in the high-purity cellulose fiber (A1) was also quantified according to the same procedure.

11 g of 2.0% by mass cellulose fiber (A) and 189 g of ion-exchanged water were mixed to prepare 200 g of a solution having a solids concentration of 0.11% by mass. Then, 13 g of a regenerated strong acid cation exchange resin (Diaion SK1BH, manufactured by Mitsubishi Chemical Corporation) was added thereto, and continued to be stirred until the pH was stable. At this time, the pH was 3.4. The cation exchange resin was separated from this solution, and 13 g of an amphoteric ion-exchange resin (SMNUPB, manufactured by Mitsubishi Chemical Corporation) was further added to this solution, and the solution was stirred until the pH was stable. At this time, the pH was 3.5. The amphoteric ion-exchange resin was separated from this solution to obtain a solution for measuring a carboxyl group having a solid concentration of 0.1% by mass.

Electric conductivity was measured by collecting 50 ml of the solution for measuring a carboxyl group having a solid concentration of 0.1% by mass, adding a 0.1 M hydrochloric acid solution thereto to adjust the pH to 2.5 and then dropping a 0.05 N aqueous sodium hydroxide solution thereto. The measurement is continued until the pH was about 11. From a graph of the measured electric conductivity plotted against the amount of a 0.05 N aqueous sodium hydroxide solution added, the amount of sodium hydroxide (V) consumed in the neutralization stage with a weak acid in which a change in electric conductivity was slow was read, and the carboxyl group content was determined using the following equation.

$$\text{Carboxyl group content (mmol/g cellulose fiber}(A)) = a(\text{ml}) \times 0.05/\text{cellulose fiber}(A)(g)$$

Table 1 shows the physical properties of and the content rate of impurities in the cellulose fiber (A) and high-purity cellulose fiber (A1). The terms "long diameter" and "short diameter" in Table 1 refer to "number average fiber length" and "number average fiber diameter", respectively (the same applies to the subsequent tables).

TABLE 1

| Measurement target | | | Cellulose fiber (A) | High-purity cellulose fiber (A1) | Cellulose fiber (B) | Cellulose fiber (C) | CMC |
|---|---|---|---|---|---|---|---|
| Physical properties of cellulose fiber | Concentration | % | 2.0 | 2.0 | 1.0 | 1.0 | 2.1 |
| | Long diameter | μm | 0.4 | 0.4 | 12.5 | 1.5 | Not measurable due to not being fiber |
| | Short diameter | nm | 6.4 | 6.4 | 25 | 33 | |
| | Long diameter/short diameter ratio | — | 63 | 63 | 500 | 45 | |
| | Carboxyl group content (NaOH titration method) | mmol/g | 1.7 | 1.7 | <0.1 | <0.1 | Not measurable*1) |
| | Carboxyl group content (Colloid titration method) | mmol/g | 1.5 | 1.5 | <0.1 | <0.1 | — |
| Impurities per cellulose fiber (dry) | Na | ppm | 37500 | 1 or less | 800 | 710 | 21430 |
| | Ag | ppm | 1 or less | 1 or less | 1 or less | 1 or less | 1 or less |
| | Al | ppm | 1 or less | 1 or less | 1 or less | 1 or less | 1 or less |
| | Ca | ppm | 1 or less | 1 or less | 1 or less | 1 or less | 1 or less |
| | Cr | ppm | 1 or less | 1 or less | 1 or less | 1 or less | 1 or less |
| | Cu | ppm | 1 or less | 1 or less | 1 or less | 1 or less | 1 or less |
| | Fe | ppm | 1 or less | 1 or less | 1 or less | 1 or less | 1 or less |
| | K | ppm | 1 or less | 1 or less | 1 or less | 1 or less | 1 or less |
| | Mg | ppm | 1 or less | 1 or less | 1 or less | 1 or less | 1 or less |
| | Ni | ppm | 1 or less | 1 or less | 1 or less | 1 or less | 1 or less |
| | Ti | ppm | 1 or less | 1 or less | 1 or less | 1 or less | 1 or less |
| | Zn | ppm | 1 or less | 1 or less | 1 or less | 1 or less | 1 or less |
| | U | ppm | 1 or less | 1 or less | 1 or less | 1 or less | 1 or less |
| | Th | ppm | 1 or less | 1 or less | 1 or less | 1 or less | 1 or less |
| | SO4 | ppm | 1 or less | 1 or less | 1 or less | 1 or less | 1 or less |
| | NO3 | ppm | 1 or less | 1 or less | 1 or less | 1 or less | 1 or less |
| | Cl | ppm | 1 or less | 1 or less | 1 or less | 1 or less | 1 or less |
| | F | ppm | 1 or less | 1 or less | 1 or less | 1 or less | 1 or less |

*1)Not measurable: The region (B) of a slow decrease in electric conductivity is not clear.

<Preparatory Example 3> Preparation of Ceria Particulate

Preparatory Example 3-1

500 g of cerium (III) carbonate octahydrate (manufactured by KANTO CHEMICAL CO., INC.) was calcined in a muffle furnace at 700° C. for 2 hours to obtain a calcined powder. The crystallite size of the obtained calcined powder was measured to be 46.3 nm. The average crystallite size was measured using the same method as the measuring method for a child particle of the ceria-silica composite oxide particulate (1) described above.

Next, this calcined powder was dry ground using Nanojet Miser model NJ-50, manufactured by Aishin Nano Technologies CO., LTD. The grinding process was performed under the conditions: a powder loading: 120 g/h; a pressing pressure: 1.3 MPa; a grinding pressure: 0.2 MPa; a working gas: air; and a maximum pressure: 1.37 MPa.

Thereafter, ion-exchanged water was added to the obtained disintegrated powder to dilute it to a concentration of 10% by mass, and was then subjected to dispersion treatment with an ultrasonic wave for 30 minutes. The integrated powder dispersion obtained by the treatment with the ultrasonic wave was centrifuged at 1700 G with a centrifuge. A sediment was removed and a supernatant liquid was collected to obtain a ceria particulate dispersion.

Preparatory Example 3-2

Cerium carbonate was calcined in a muffle furnace at 710° C. for 2 hours to obtain a calcined powder. Next, 100 g of the calcined powder and 300 g of ion-exchanged water were placed in a 1 L beaker with a handle, and irradiated with an ultrasonic wave under stirring for 10 minutes in an ultrasonic bath.

Then, it was subjected to wet disintegration (on a batch-type table-top sand mill manufactured by Kansai Paint Co., Ltd.) with ϕ0.25 mm quartz beads (manufactured by DAI-KEN CHEMICAL CO., LTD.) for 30 minutes.

After disintegration, the beads were separated by passing them through a 44 mesh wire mesh and flushed with ion-exchanged water to obtain a ceria particulate precursor dispersion. The obtained dispersion has a solids concentration of 5.6% by mass.

The obtained ceria particulate precursor dispersion was then subjected to centrifugation with a centrifuge (model number "CR21G", manufactured by Hitachi Koki Co., Ltd.) at 1700 G for 102 seconds. A sediment was removed and a solution left after the removal thereof was concentrated to 1.6% by mass with a rotary evaporator to obtain a ceria particulate dispersion.

Example 1

Ion-exchanged water was added to the cellulose fiber (A) obtained in Preparatory Example 2 to adjust its concentration to 0.25% by mass.

Next, 70 g of ion-exchanged water was added to 4.5 g (dry mass: 0.9 g) of the ceria-based composite particulate dispersion obtained in Preparatory Example 1, and 60 g of 0.25% cellulose fiber (dry mass: 0.15 g) was further added thereto under stirring. Then, 3% nitric acid and 3% aqueous ammonia were added thereto, and ion-exchanged water was finally added thereto to obtain 150 g of a polishing slurry having a pH of 5.0 and an abrasive grain concentration of 0.6% by mass. The polishing slurry has a nitric acid concentration of 0.0014 mol/L and an ammonia concentration of 0.035 mol/L, and the amount of cellulose fiber added therein was 1000 ppm.

The polishing test was performed using the obtained slurry. Specifically, the polishing test was performed as follows (the same applies to the following Examples and Comparative Examples).

[Polishing Test Method]
<Polishing of SiO$_2$ Film>

A SiO$_2$ insulating film (thickness: 1 μm) substrate prepared by a thermal oxidation method was provided as a substrate to be polished.

Next, the substrate to be polished was set on a polishing device (NF300, manufactured by Nano Factor Co., LTD), and was polished with a substrate load of 0.5 MPa at a table rotation speed of 90 rpm for 1 minute using a polishing pad ("IC-1000/SUBA400 concentric circle type", manufactured by Nitta Haas Incorporated), while feeding a polishing slurry at a rate of 50 ml/min by a dropping method.

Then, the polishing speed was calculated from a change in weight of the substrate to be polished before and after the polishing.

Smoothness (surface roughness Ra) of the surface of the polished substrate was also measured using an atomic force microscope (AFM, manufactured by Hitachi High-Tech Science Corporation). The surface roughness was described in the results of polishing evaluation (Tables 4 to 6 and 9) because the smoothness and the surface roughness Ra are approximately proportional to each other.

Polishing flaws were observed by observing the surface of the insulating film with an optical microscope.

<Polishing of Aluminum Hard Disk>

The substrate for an aluminum hard disk was set on a polishing device (NF300, manufactured by Nano Factor Co., LTD), and was polished with a substrate load of 0.05 MPa at a table rotation speed of 30 rpm for 5 minutes using a polishing pad ("Polytex φ12", manufactured by Nitta Haas Incorporated), while feeding a polishing slurry at a rate of 20 ml/min by a dropping method. The entire surface was observed using an ultrafine defects-visualization macro device (product name: Micro-Max, manufactured by Vision Psytec) with Zoom 15, and the number of scratches (linear marks) present on the surface of the polished substrate having a surface area which corresponds to 65.97 cm$^2$ was counted and evaluated according to the following criteria.

| Number of linear marks | Evaluation |
| --- | --- |
| Less than 50 | "Very few" |
| 50 to less than 80 | "Few" |
| 80 or more | "Numerous" |

Example 2

Example 1 was repeated except that the amount of cellulose fiber (A) added in the polishing slurry was 2000 ppm.

Example 3

Ion-exchanged water was added to the cellulose fiber (A) obtained in Preparatory Example 2 to adjust its concentration to 0.5% by mass.

Example 1 was repeated except that the concentration of the cellulose fiber (A) in the polishing slurry was 0.5% by mass and the amount of cellulose fiber added was 3000 ppm relative to the liquid weight.

Example 4

Example 3 was repeated except that the amount of cellulose fiber added in the polishing slurry was 4000 ppm.

Example 5

Example 1 was repeated except that the pH of the slurry was adjusted to 6.0.

Example 6

Example 1 was repeated except that the pH of the slurry was adjusted to 7.0.

Example 7

Ion-exchanged water was added to the cellulose fiber (A) obtained in Preparatory Example 2 to adjust its concentration to 0.25% by mass.

Next, 70 g of ion-exchanged water was added to 4.5 g (dry mass: 0.9 g) of the ceria-based composite particulate dispersion obtained in Preparatory Example 1, and 60 g of 0.25% cellulose fiber (dry mass: 0.15 g) was further added thereto under stirring. Then, 10% acetic acid and 3% aqueous ammonia were added thereto, and ion-exchanged water was finally added thereto to obtain 150 g of a polishing slurry having a pH of 5.0 and an abrasive grain concentration of 0.6% by mass.

The polishing slurry has an acetic acid concentration of 0.0084 mol/L and an ammonia concentration of 0.035 mol/L, and the amount of cellulose fiber added therein was 1000 ppm.

The polishing test was performed using the obtained slurry.

Example 8

Example 1 was repeated except that the ceria particulate obtained in Preparatory Example 3-1 was used as an abrasive grain in the polishing slurry and the amount of cellulose fiber (A) added in the polishing slurry was 2000 ppm.

Example 9

Example 8 was repeated except that the addition amount of cellulose fiber in the polishing slurry was 4000 ppm.

Comparative Example 1

The polishing test was performed using the polishing slurry obtained by adding ion-exchanged water to the ceria-based composite particulate obtained in Preparatory Example 1 to adjust its concentration to 0.6% by mass and adjusting the pH to 5.0 with 3% nitric acid.

Comparative Example 2

The polishing test was performed using the polishing slurry obtained by adding ion-exchanged water to the cellulose fiber (A) obtained in Preparatory Example 2 to adjust its concentration to 1000 pm and adjusting the pH to 5.0 with 3% nitric acid.

Comparative Example 3

The polishing test was performed using the polishing slurry obtained by adding ion-exchanged water to high-purity silica sol having an average particle diameter of 108 nm obtained in the middle of the process of Preparatory Example 1 to dilute it to 0.6% by mass and adjusting the pH to 5.0 with 3% nitric acid.

Comparative Example 4

Example 1 was repeated except that CeNF-1 manufactured by Chuetsu Pulp & Paper Co., Ltd. (cellulose fiber (B)) was used as a cellulose fiber in which the hydroxyl group at the C6 position of the cellulose unit was not oxidatively modified.

Comparative Example 5

Example 1 was repeated except that CEOLUS DF-17 manufactured by Asahi Kasei Corporation (cellulose fiber (C)) was used as a cellulose fiber in which the hydroxyl group at the C6 position of the cellulose unit was not oxidatively modified.

Comparative Example 6

Example 1 was repeated except that 60 ppm of carboxymethylcellulose (CMC) ammonium (KICCOLATE NA-L, manufactured by NICHIRIN CHEMICAL INDUSTRIES, LTD.) was added instead of adding 1000 ppm of the cellulose fiber (A).

Comparative Example 7

Example 1 was repeated except that 1000 ppm of chitin (SFo-20002, manufactured by SUGINO MACHINE LIMITED) was added instead of adding 1000 ppm of the cellulose fiber (A).

Tables 2 to 4 show various results of Examples 1 to 9 and Comparative Examples 1 to 7. Table 2 shows data of the silica mother particle of each ceria-based composite particulate. Table 3 shows data of each ceria-based composite particulate and its child particle. Table 4 shows data of each slurry used for the polishing test and results of its polishing evaluation.

TABLE 2

| | Measurement target | | | Example 1 | Example 2 | Example 3 | Example 4 | Example 5 | Example 6 | Example 7 | Example 8 |
|---|---|---|---|---|---|---|---|---|---|---|---|
| Silica mother particle | Average particle diameter of silica mother particle | | nm | 108 | 108 | 108 | 108 | 108 | 108 | 108 | — |
| | Property of silica mother particle | | — | Amorphous | Amorphous | Amorphous | Amorphous | Amorphous | Amorphous | Amorphous | — |
| | Impurities in silica mother particle | Na | ppm | 1 ppm or less | 1 ppm or less | 1 ppm or less | 1 ppm or less | 1 ppm or less | 1 ppm or less | 1 ppm or less | — |
| | | Ag | ppm | 1 ppm or less | 1 ppm or less | 1 ppm or less | 1 ppm or less | 1 ppm or less | 1 ppm or less | 1 ppm or less | — |
| | | Al | ppm | 1 ppm or less | 1 ppm or less | 1 ppm or less | 1 ppm or less | 1 ppm or less | 1 ppm or less | 1 ppm or less | — |
| | | Ca | ppm | 1 ppm or less | 1 ppm or less | 1 ppm or less | 1 ppm or less | 1 ppm or less | 1 ppm or less | 1 ppm or less | — |
| | | Cr | ppm | 1 ppm or less | 1 ppm or less | 1 ppm or less | 1 ppm or less | 1 ppm or less | 1 ppm or less | 1 ppm or less | — |
| | | Cu | ppm | 1 ppm or less | 1 ppm or less | 1 ppm or less | 1 ppm or less | 1 ppm or less | 1 ppm or less | 1 ppm or less | — |
| | | Fe | ppm | 1 ppm or less | 1 ppm or less | 1 ppm or less | 1 ppm or less | 1 ppm or less | 1 ppm or less | 1 ppm or less | — |
| | | K | ppm | 1 ppm or less | 1 ppm or less | 1 ppm or less | 1 ppm or less | 1 ppm or less | 1 ppm or less | 1 ppm or less | — |
| | | Mg | ppm | 1 ppm or less | 1 ppm or less | 1 ppm or less | 1 ppm or less | 1 ppm or less | 1 ppm or less | 1 ppm or less | — |
| | | Ni | ppm | 1 ppm or less | 1 ppm or less | 1 ppm or less | 1 ppm or less | 1 ppm or less | 1 ppm or less | 1 ppm or less | — |
| | | Ti | ppm | 1 ppm or less | 1 ppm or less | 1 ppm or less | 1 ppm or less | 1 ppm or less | 1 ppm or less | 1 ppm or less | — |
| | | Zn | ppm | 1 ppm or less | 1 ppm or less | 1 ppm or less | 1 ppm or less | 1 ppm or less | 1 ppm or less | 1 ppm or less | — |
| | | U | ppm | 1 ppm or less | 1 ppm or less | 1 ppm or less | 1 ppm or less | 1 ppm or less | 1 ppm or less | 1 ppm or less | — |
| | | Th | ppm | 1 ppm or less | 1 ppm or less | 1 ppm or less | 1 ppm or less | 1 ppm or less | 1 ppm or less | 1 ppm or less | — |
| | | SO4 | ppm | 1 ppm or less | 1 ppm or less | 1 ppm or less | 1 ppm or less | 1 ppm or less | 1 ppm or less | 1 ppm or less | — |
| | | NO3 | ppm | 1 ppm or less | 1 ppm or less | 1 ppm or less | 1 ppm or less | 1 ppm or less | 1 ppm or less | 1 ppm or less | — |
| | | Cl | ppm | 1 ppm or less | 1 ppm or less | 1 ppm or less | 1 ppm or less | 1 ppm or less | 1 ppm or less | 1 ppm or less | — |
| | | F | ppm | 1 ppm or less | 1 ppm or less | 1 ppm or less | 1 ppm or less | 1 ppm or less | 1 ppm or less | 1 ppm or less | — |

| | Measurement target | | | Example 9 | Comp. Example 1 | Comp. Example 2 | Comp. Example 3 | Comp. Example 4 | Comp. Example 5 | Comp. Example 6 | Comp. Example 7 |
|---|---|---|---|---|---|---|---|---|---|---|---|
| Silica mother particle | Average particle diameter of silica mother particle | | | — | 108 | — | 108 | 108 | 108 | 108 | 108 |
| | Property of silica mother particle | | | — | Amorphous | — | Amorphous | Amorphous | Amorphous | Amorphous | Amorphous |
| | Impurities in silica mother particle | Na | | — | 1 ppm or less | — | 1 ppm or less | 1 ppm or less | 1 ppm or less | 1 ppm or less | 1 ppm or less |
| | | Ag | | — | 1 ppm or less | — | 1 ppm or less | 1 ppm or less | 1 ppm or less | 1 ppm or less | 1 ppm or less |

TABLE 2-continued

|  |  |  |  |  |  |  |  |  |  |
|---|---|---|---|---|---|---|---|---|---|
|  | Al |  | 1 ppm or less | — | 1 ppm or less | 1 ppm or less | 1 ppm or less | 1 ppm or less | 1 ppm or less |
|  | Ca |  | 1 ppm or less | — | 1 ppm or less | 1 ppm or less | 1 ppm or less | 1 ppm or less | 1 ppm or less |
|  | Cr |  | 1 ppm or less | — | 1 ppm or less | 1 ppm or less | 1 ppm or less | 1 ppm or less | 1 ppm or less |
|  | Cu |  | 1 ppm or less | — | 1 ppm or less | 1 ppm or less | 1 ppm or less | 1 ppm or less | 1 ppm or less |
|  | Fe |  | 1 ppm or less | — | 1 ppm or less | 1 ppm or less | 1 ppm or less | 1 ppm or less | 1 ppm or less |
|  | K |  | 1 ppm or less | — | 1 ppm or less | 1 ppm or less | 1 ppm or less | 1 ppm or less | 1 ppm or less |
|  | Mg |  | 1 ppm or less | — | 1 ppm or less | 1 ppm or less | 1 ppm or less | 1 ppm or less | 1 ppm or less |
|  | Ni |  | 1 ppm or less | — | 1 ppm or less | 1 ppm or less | 1 ppm or less | 1 ppm or less | 1 ppm or less |
|  | Ti |  | 1 ppm or less | — | 1 ppm or less | 1 ppm or less | 1 ppm or less | 1 ppm or less | 1 ppm or less |
|  | Zn |  | 1 ppm or less | — | 1 ppm or less | 1 ppm or less | 1 ppm or less | 1 ppm or less | 1 ppm or less |
|  | U |  | 1 ppm or less | — | 1 ppm or less | 1 ppm or less | 1 ppm or less | 1 ppm or less | 1 ppm or less |
|  | Th |  | 1 ppm or less | — | 1 ppm or less | 1 ppm or less | 1 ppm or less | 1 ppm or less | 1 ppm or less |
|  | SO4 |  | 1 ppm or less | — | 1 ppm or less | 1 ppm or less | 1 ppm or less | 1 ppm or less | 1 ppm or less |
|  | NO3 |  | 1 ppm or less | — | 1 ppm or less | 1 ppm or less | 1 ppm or less | 1 ppm or less | 1 ppm or less |
|  | Cl |  | 1 ppm or less | — | 1 ppm or less | 1 ppm or less | 1 ppm or less | 1 ppm or less | 1 ppm or less |
|  | F |  | 1 ppm or less | — | 1 ppm or less | 1 ppm or less | 1 ppm or less | 1 ppm or less | 1 ppm or less |

TABLE 3

|  | Measurement target |  | | Example 1 | Example 2 | Example 3 | Example 4 | Example 5 | Example 6 |
|---|---|---|---|---|---|---|---|---|---|
| Ceria-based composite particulate | SiO$_2$ content rate (% by mass) in ceria-based composite particulate | % | | 46.0 | 46.0 | 46.0 | 46.0 | 46.0 | 46.0 |
|  | CeO$_2$ content rate (% by mass) in ceria-based composite particulate | % | | 54.0 | 54.0 | 54.0 | 54.0 | 54.0 | 54.0 |
|  | Parts by mass of ceria relative to 100 parts by mass of silica | % | | 117.4 | 117.4 | 117.4 | 117.4 | 117.4 | 117.4 |
|  | Calcination temperature | °C. | | 1090 | 1090 | 1090 | 1090 | 1090 | 1090 |
|  | Crystallite size | nm | | 15 | 15 | 15 | 15 | 15 | 15 |
|  | Average particle diameter of child particle | nm | | 18 | 18 | 18 | 18 | 18 | 18 |
|  | Specific surface area of composite particulate | m2/g | | 37 | 37 | 37 | 37 | 37 | 37 |
|  | Crystalline form | — | | Cerianite | Cerianite | Cerianite | Cerianite | Cerianite | Cerianite |
|  | Average particle diameter | μm | | 0.102 | 0.102 | 0.102 | 0.102 | 0.102 | 0.102 |
| Impurities in ceria-based composite particulate | Na | ppm | | 1 ppm or less | 1 ppm or less | 1 ppm or less | 1 ppm or less | 1 ppm or less | 1 ppm or less |
|  | Ag | ppm | | 1 ppm or less | 1 ppm or less | 1 ppm or less | 1 ppm or less | 1 ppm or less | 1 ppm or less |
|  | Al | ppm | | 1 ppm or less | 1 ppm or less | 1 ppm or less | 1 ppm or less | 1 ppm or less | 1 ppm or less |
|  | Ca | ppm | | 1 ppm or less | 1 ppm or less | 1 ppm or less | 1 ppm or less | 1 ppm or less | 1 ppm or less |
|  | Cr | ppm | | 1 ppm or less | 1 ppm or less | 1 ppm or less | 1 ppm or less | 1 ppm or less | 1 ppm or less |
|  | Cu | ppm | | 1 ppm or less | 1 ppm or less | 1 ppm or less | 1 ppm or less | 1 ppm or less | 1 ppm or less |
|  | Fe | ppm | | 1 ppm or less | 1 ppm or less | 1 ppm or less | 1 ppm or less | 1 ppm or less | 1 ppm or less |
|  | K | ppm | | 1 ppm or less | 1 ppm or less | 1 ppm or less | 1 ppm or less | 1 ppm or less | 1 ppm or less |
|  | Mg | ppm | | 1 ppm or less | 1 ppm or less | 1 ppm or less | 1 ppm or less | 1 ppm or less | 1 ppm or less |
|  | Ni | ppm | | 1 ppm or less | 1 ppm or less | 1 ppm or less | 1 ppm or less | 1 ppm or less | 1 ppm or less |
|  | Ti | ppm | | 1 ppm or less | 1 ppm or less | 1 ppm or less | 1 ppm or less | 1 ppm or less | 1 ppm or less |
|  | Zn | ppm | | 1 ppm or less | 1 ppm or less | 1 ppm or less | 1 ppm or less | 1 ppm or less | 1 ppm or less |

TABLE 3-continued

|  |  |  | Example 7 | Example 8 | Example 9 | Comp. Example 1 | Comp. Example 2 | Comp. Example 3 |
|---|---|---|---|---|---|---|---|---|
|  | U | ppm | 1 ppm or less | 1 ppm or less | 1 ppm or less | 1 ppm or less | 1 ppm or less | 1 ppm or less |
|  | Th | ppm | 1 ppm or less | 1 ppm or less | 1 ppm or less | 1 ppm or less | 1 ppm or less | 1 ppm or less |
|  | SO4 | ppm | 1 ppm or less | 1 ppm or less | 1 ppm or less | 1 ppm or less | 1 ppm or less | 1 ppm or less |
|  | NO3 | ppm | 1 ppm or less | 1 ppm or less | 1 ppm or less | 1 ppm or less | 1 ppm or less | 1 ppm or less |
|  | Cl | ppm | 1 ppm or less | 1 ppm or less | 1 ppm or less | 1 ppm or less | 1 ppm or less | 1 ppm or less |
|  | F | ppm | 1 ppm or less | 1 ppm or less | 1 ppm or less | 1 ppm or less | 1 ppm or less | 1 ppm or less |

| | Measurement target | Example 7 | Example 8 | Example 9 | Comp. Example 1 | Comp. Example 2 | Comp. Example 3 |
|---|---|---|---|---|---|---|---|
| Ceria-based composite particulate | $SiO_2$ content rate (% by mass) in ceria-based composite particulate | 46.0 | 0.0 | 0.0 | 46.0 | — | 100 |
| | $CeO_2$ content rate (% by mass) in ceria-based composite particulate | 54.0 | 100.0 | 100.0 | 54.0 | — | 0 |
| | Parts by mass of ceria relative to 100 parts by mass of silica | 117.4 | — | — | 117.4 | — | — |
| | Calcination temperature | 1090 | 700 | 700 | 1090 | — | — |
| | Crystallite size | 15 | 46.3 | 46.3 | 15 | — | — |
| | Average particle diameter of child particle | 18 | — | — | 18 | — | — |
| | Specific surface area of composite particulate | 37 | 18 | 18 | 37 | — | — |
| | Crystalline form | Cerianite | Cerianite | Cerianite | Cerianite | — | Amorphous |
| | Average particle diameter | 0.102 | 0.103 | 0.103 | 0.102 | — | 0.108 |
| Impurities in ceria-based composite particulate | Na | 1 ppm or less | 1 ppm or less | 1 ppm or less | 1 ppm or less | — | 1 ppm or less |
| | Ag | 1 ppm or less | 1 ppm or less | 1 ppm or less | 1 ppm or less | — | 1 ppm or less |
| | Al | 1 ppm or less | 1 ppm or less | 1 ppm or less | 1 ppm or less | — | 1 ppm or less |
| | Ca | 1 ppm or less | 1 ppm or less | 1 ppm or less | 1 ppm or less | — | 1 ppm or less |
| | Cr | 1 ppm or less | 1 ppm or less | 1 ppm or less | 1 ppm or less | — | 1 ppm or less |
| | Cu | 1 ppm or less | 1 ppm or less | 1 ppm or less | 1 ppm or less | — | 1 ppm or less |
| | Fe | 1 ppm or less | 1 ppm or less | 1 ppm or less | 1 ppm or less | — | 1 ppm or less |
| | K | 1 ppm or less | 1 ppm or less | 1 ppm or less | 1 ppm or less | — | 1 ppm or less |
| | Mg | 1 ppm or less | 1 ppm or less | 1 ppm or less | 1 ppm or less | — | 1 ppm or less |
| | Ni | 1 ppm or less | 1 ppm or less | 1 ppm or less | 1 ppm or less | — | 1 ppm or less |
| | Ti | 1 ppm or less | 1 ppm or less | 1 ppm or less | 1 ppm or less | — | 1 ppm or less |
| | Zn | 1 ppm or less | 1 ppm or less | 1 ppm or less | 1 ppm or less | — | 1 ppm or less |
| | U | 1 ppm or less | 1 ppm or less | 1 ppm or less | 1 ppm or less | — | 1 ppm or less |
| | Th | 1 ppm or less | 1 ppm or less | 1 ppm or less | 1 ppm or less | — | 1 ppm or less |
| | SO4 | 1 ppm or less | 1 ppm or less | 1 ppm or less | 1 ppm or less | — | 1 ppm or less |
| | NO3 | 1 ppm or less | 1 ppm or less | 1 ppm or less | 1 ppm or less | — | 1 ppm or less |
| | Cl | 1 ppm or less | 1 ppm or less | 1 ppm or less | 1 ppm or less | — | 1 ppm or less |
| | F | 1 ppm or less | 1 ppm or less | 1 ppm or less | 1 ppm or less | — | 1 ppm or less |

| | Measurement target | Comp. Example 4 | Comp. Example 5 | Comp. Example 6 | Comp. Example 7 |
|---|---|---|---|---|---|
| Ceria-based composite particulate | $SiO_2$ content rate (% by mass) in ceria-based composite particulate | 46.0 | 46.0 | 46.0 | 46.0 |
| | $CeO_2$ content rate (% by mass) in ceria-based composite particulate | 54.0 | 54.0 | 54.0 | 54.0 |
| | Parts by mass of ceria relative to 100 parts by mass of silica | 117.4 | 117.4 | 117.4 | 117.4 |

TABLE 3-continued

|  |  |  |  |  |  |
|---|---|---|---|---|---|
| Calcination temperature |  | 1090 | 1090 | 1090 | 1090 |
| Crystallite size |  | 15 | 15 | 15 | 15 |
| Average particle diameter of child particle |  | 18 | 18 | 18 | 18 |
| Specific surface area of composite particulate |  | 37 | 37 | 37 | 37 |
| Crystalline form |  | Cerianite | Cerianite | Cerianite | Cerianite |
| Average particle diameter |  | 0.102 | 0.102 | 0.102 | 0.102 |
| Impurities in ceria-based composite particulate | Na | 1 ppm or less | 1 ppm or less | 1 ppm or less | 1 ppm or less |
|  | Ag | 1 ppm or less | 1 ppm or less | 1 ppm or less | 1 ppm or less |
|  | Al | 1 ppm or less | 1 ppm or less | 1 ppm or less | 1 ppm or less |
|  | Ca | 1 ppm or less | 1 ppm or less | 1 ppm or less | 1 ppm or less |
|  | Cr | 1 ppm or less | 1 ppm or less | 1 ppm or less | 1 ppm or less |
|  | Cu | 1 ppm or less | 1 ppm or less | 1 ppm or less | 1 ppm or less |
|  | Fe | 1 ppm or less | 1 ppm or less | 1 ppm or less | 1 ppm or less |
|  | K | 1 ppm or less | 1 ppm or less | 1 ppm or less | 1 ppm or less |
|  | Mg | 1 ppm or less | 1 ppm or less | 1 ppm or less | 1 ppm or less |
|  | Ni | 1 ppm or less | 1 ppm or less | 1 ppm or less | 1 ppm or less |
|  | Ti | 1 ppm or less | 1 ppm or less | 1 ppm or less | 1 ppm or less |
|  | Zn | 1 ppm or less | 1 ppm or less | 1 ppm or less | 1 ppm or less |
|  | U | 1 ppm or less | 1 ppm or less | 1 ppm or less | 1 ppm or less |
|  | Th | 1 ppm or less | 1 ppm or less | 1 ppm or less | 1 ppm or less |
|  | SO4 | 1 ppm or less | 1 ppm or less | 1 ppm or less | 1 ppm or less |
|  | NO3 | 1 ppm or less | 1 ppm or less | 1 ppm or less | 1 ppm or less |
|  | Cl | 1 ppm or less | 1 ppm or less | 1 ppm or less | 1 ppm or less |
|  | F | 1 ppm or less | 1 ppm or less | 1 ppm or less | 1 ppm or less |

TABLE 4

| | | Measurement target | | Example 1 | Example 2 | Example 3 | Example 4 | Example 5 | Example 6 |
|---|---|---|---|---|---|---|---|---|---|
| Polishing slurry | Abrasive grain | Type | — | Ceria-based composite particulate | Ceria-based composite particulate | Ceria-based composite particulate | Ceria-based composite particulate | Ceria-based composite particulate | Ceria-based composite particulate |
| | Cellulose-based additive | Type | — | Cellulose fiber (A) | Cellulose fiber (A) | Cellulose fiber (A) | Cellulose fiber (A) | Cellulose fiber (A) | Cellulose fiber (A) |
| | | Long diameter | μm | 0.4 | 0.4 | 0.4 | 0.4 | 0.4 | 0.4 |
| | | Short diameter | nm | 6.4 | 6.4 | 6.4 | 6.4 | 6.4 | 6.4 |
| | | Long diameter/short diameter ratio | — | 63 | 63 | 63 | 63 | 63 | 63 |
| | | Carboxyl group content (NaOH titration method) | mmol/g | 1.7 | 1.7 | 1.7 | 1.7 | 1.7 | 1.7 |
| | | Carboxyl group content (Colloid titration method) | mmol/g | 1.5 | 1.5 | 1.5 | 1.5 | 1.5 | 1.5 |
| | | Concentration of cellulose-based additive in slurry | ppm | 1000 | 2000 | 3000 | 4000 | 1000 | 1000 |
| | Additive (acid/alkali) | Additive: acid type | — | Nitric acid | Nitric acid | Nitric acid | Nitric acid | Nitric acid | Nitric acid |
| | | Acid concentration in slurry | mol/l | 0.0014 | 0.0014 | 0.0013 | 0.0012 | 0.0009 | 0.0006 |
| | | Additive: alkali type | — | Ammonia | Ammonia | Ammonia | Ammonia | Ammonia | Ammonia |
| | | Alkali concentration in slurry | mol/l | 0.035 | 0.035 | 0.035 | 0.035 | 0.035 | 0.035 |
| | pH of slurry | | — | 5 | 5 | 5 | 5 | 6 | 7 |
| | Concentration of abrasive grain | | % | 0.6 | 0.6 | 0.6 | 0.6 | 0.6 | 0.6 |

TABLE 4-continued

| | | | | Example 1 | Example 2 | Example 3 | Example 4 | Example 5 | Example 6 |
|---|---|---|---|---|---|---|---|---|---|
| Polishing evaluation | SiO2 film | Polishing rate | nm/min | 556 | 702 | 888 | 1051 | 637 | 627 |
| | | Surface roughness | — | 0.10 | 0.10 | 0.09 | 0.09 | 0.10 | 0.10 |
| | | Polishing flaw | — | Not clear | Not clear | Not clear | Not clear | Not clear | Not clear |
| | Aluminum hard disk | Scratch | — | Very few | Very few | Very few | Very few | Very few | Very few |

| | Measurement target | | | Example 7 | Example 8 | Example 9 | Comparative Example 1 | Comparative Example 2 |
|---|---|---|---|---|---|---|---|---|
| Polishing slurry | Abrasive grain | Type | — | Ceria-based composite particulate | Ceria | Ceria | Ceria-based composite particulate | Not added |
| | Cellulose-based additive | Type | — | Cellulose fiber (A) | Cellulose fiber (A) | Cellulose fiber (A) | Not added | Cellulose fiber (A) |
| | | Long diameter | μm | 0.4 | 0.4 | 0.4 | — | 0.4 |
| | | Short diameter | nm | 6.4 | 6.4 | 6.4 | — | 6.4 |
| | | Long diameter/short diameter ratio | — | 63 | 63 | 63 | — | 63 |
| | | Carboxyl group content (NaOH titration method) | mmol/g | 1.7 | 1.7 | 1.7 | — | 1.7 |
| | | Carboxyl group content (Colloid titration method) | mmol/g | 1.5 | 1.5 | 1.5 | — | 1.5 |
| | | Concentration of cellulose-based additive in slurry | ppm | 1000 | 2000 | 4000 | 0 | 1000 |
| | Additive (acid/alkali) | Additive: acid type | — | Acetic acid | Nitric acid | Nitric acid | Nitric acid | Nitric acid |
| | | Acid concentration in slurry | mol/l | 0.0084 | 0.0014 | 0.0012 | 0.0013 | 0.0002 |
| | | Additive: alkali type | — | Ammonia | Ammonia | Ammonia | Ammonia | Ammonia |
| | | Alkali concentration in slurry | mol/l | 0.035 | 0.035 | 0.035 | 0.035 | 0 |
| | pH of slurry | | — | 5 | 5 | 5 | 5 | 5 |
| | Concentration of abrasive grain | | % | 0.6 | 0.6 | 0.6 | 0.6 | 0 |
| Polishing evaluation | SiO2 film | Polishing rate | nm/min | 588 | 674 | 1010 | 430 | 33 |
| | | Surface roughness | — | 0.10 | 0.11 | 0.1 | 0.11 | 0.15 |
| | | Polishing flaw | — | Not clear | Not clear | Not clear | Not clear | Not clear |
| | Aluminum hard disk | Scratch | — | Very few | Very few | Very few | Few | Few |

| | Measurement target | | | Comparative Example 3 | Comparative Example 4 | Comparative Example 5 | Comparative Example 6 | Comparative Example 7 |
|---|---|---|---|---|---|---|---|---|
| Polishing slurry | Abrasive grain | Type | — | 108 nm silica | Ceria-based composite particulate | Ceria-based composite particulate | Ceria-based composite particulate | Ceria-based composite particulate |
| | Cellulose-based additive | Type | — | Not added | Cellulose fiber (B) | Cellulose fiber (C) | CMC | Chitin |
| | | Long diameter | μm | — | 12.5 | 1.5 | Not measurable due to not being fiber | 0.5 |
| | | Short diameter | nm | — | 25 | 33 | | 30 |
| | | Long diameter/short diameter ratio | — | — | 500 | 45 | | 17 |
| | | Carboxyl group content (NaOH titration method) | mmol/g | — | <0.1 | <0.1 | <0.1 | <0.1 |
| | | Carboxyl group content (Colloid titration method) | mmol/g | — | <0.1 | <0.1 | <0.1 | <0.1 |
| | | Concentration of cellulose-based additive in slurry | ppm | 0 | 1000 | 1000 | 60 | 1000 |
| | Additive (acid/alkali) | Additive: acid type | — | Nitric acid | Nitric acid | Nitric acid | Nitric acid | Nitric acid |
| | | Acid concentration in slurry | mol/l | 0.0003 | 0.0012 | 0.0012 | 0.0014 | 0.0011 |
| | | Additive: alkali type | — | Ammonia | Ammonia | Ammonia | Ammonia | Ammonia |
| | | Alkali concentration in slurry | mol/l | 0.037 | 0.035 | 0.035 | 0.035 | 0.035 |
| | pH of slurry | | — | 5 | 5 | 5 | 5 | 5 |
| | Concentration of abrasive grain | | % | 0.6 | 0.6 | 0.6 | 0.6 | 0.6 |
| Polishing evaluation | SiO2 film | Polishing rate | nm/min | 28 | 454 | 446 | 172 | 93 |
| | | Surface roughness | — | 0.13 | 0.11 | 0.11 | 0.12 | 0.13 |
| | | Polishing flaw | — | Not clear | Not clear | Not clear | Not clear | Not clear |
| | Aluminum hard disk | Scratch | — | Very few | Few | Few | Few | Few |

Table 4 shows that the polishing composition comprising a combination of a ceria-based particulate (abrasive grain) and a modified microfibril cellulose according to the present invention (Examples 1 to 9) is improved in the polishing speed, has less scratches and is excellent in smoothness (surface roughness), as compared with a ceria-based particulate alone (Comparative Example 1).

Example 10

The polishing test was performed with the device shown in FIG. 4.
<Preparation>
Ion-exchanged water and nitric acid were added to the ceria-based composite particulate dispersion obtained in Preparatory Example 1 to obtain an abrasive grain dispersion having an abrasive grain concentration of 0.667% by mass and a pH of 5.0. 450 g of the abrasive grain dispersion was charged into a particulate holding means 1.

On the other hand, 50 g of 2.0% by mass cellulose fiber (A) obtained in Preparatory Example 2 was charged into a cellulose holding means 2.

A filter CCS-3-D1B (nominal pore diameter: 3 μm) manufactured by Advantec Toyo Kaisha, Ltd. was used as a filtering means 4.
<First Stage Polishing>
After opening two switch cocks 6, two pumps 7 were activated, and the abrasive grain dispersion was fed at a rate of 45 ml/min and the cellulose fiber (A) was fed at a rate of 5 ml/min. The abrasive grain dispersion and the cellulose fiber (A) were mixed in a mixing section 3 to provide a first polishing composition, and dropped on a polishing pad by a discharging means 5. Polishing was performed for 1 minute while feeding the first polishing composition.
<Second Stage Polishing>
Next, on the side of the cellulose holding means 2, the pump 7 was stopped and the switch cock 6 was closed to stop feeding the cellulose fiber (A). Only the abrasive grain dispersion was continued to be fed for 1 minute.

The polishing speed, surface roughness and polishing flaws were observed for the substrate after the second stage polishing.

The polishing speed for the substrate in the first stage polishing was determined by performing the first stage polishing separately from the above experiment.

Example 11

Example 10 was repeated except for using an abrasive grain dispersion having an abrasive grain concentration of 0.75% by mass and feeding it at a rate of 40 ml/L in the first stage polishing and feeding the cellulose fiber (A) at a rate of 10 ml/L in the second stage polishing.

Example 12

The polishing test was performed with the device shown in FIG. 5.
<Preparation>
The polishing slurry (first polishing composition) of Example 2 was charged into a first polishing composition holding means 11.

On the other hand, ion-exchanged water and nitric acid were added to the ceria-based composite particulate dispersion obtained in Preparatory Example 1 to obtain an abrasive grain dispersion (second polishing composition) having an abrasive grain concentration of 0.3% by mass and a pH of 5.0. 450 g pf the abrasive grain dispersion was charged into a second polishing composition holding means 12.

A filter CCS-3-D1B (nominal pore diameter: 3 μm) manufactured by Advantec Toyo Kaisha, Ltd. was used as a filtering means 4.
<First Stage Polishing>
On the side of the first polishing composition holding means 11, the switch cock 16 was opened and the pump 17 was activated, and polishing was performed for 1 minute while dropping the first polishing composition on a polishing pad at a rate of 50 ml/min.
<Second Stage Polishing>
Next, on the side of the first polishing composition holding means 11, the pump 17 was stopped and the switch cock 16 was closed to stop feeding the first polishing composition. At the same time, on the side of the second polishing composition holding means 12, the switch cock 16 was opened and the pump 17 was activated, and polishing was performed while dropping the second polishing composition on the polishing pad at a rate of 50 ml/min.

The polishing speed, surface roughness and polishing flaws were observed for the substrate after the second stage polishing.

The polishing speed for the substrate in the first stage polishing was determined by performing the first stage polishing separately from the above experiment.

Example 13

Example 12 was repeated except for charging the polishing slurry of Example 4 into the first polishing composition holding means 11 and charging, into the second polishing composition holding means 12, an abrasive grain dispersion having an abrasive grain concentration of 0.4% by mass and a pH of 5.0 prepared by adding ion-exchanged water and nitric acid to the ceria-based composite particulate dispersion obtained in Preparatory Example 1.

Table 5 shows data of each abrasive grain, each additive (modified microfibril cellulose) and each polishing composition as well as the results of its polishing evaluation in Examples 10 and 11. Table 6 shows data of each abrasive grain, each additive (modified microfibril cellulose) and each polishing composition as well as the results of its polishing evaluation in Examples 12 and 13.

TABLE 5

| | | Measurement target | | Example 10 | Example 11 |
|---|---|---|---|---|---|
| Abrasive grain Additive Polishing composition | Abrasive grain (Particulate holding means) | Type | — | Ceria-based composite particulate | Ceria-based composite particulate |
| | | Concentration of abrasive grain | % | 0.667 | 0.75 |
| | | pH | — | 5.0 | 5.0 |
| | | Feed rate | ml/min | 45 | 40 |
| | Callulose-based additive | Type | — | Cellulose fiber (A) | Cellulose fiber (A) |

TABLE 5-continued

| | Measurement target | | | Example 10 | Example 11 |
|---|---|---|---|---|---|
| | (Cellulose holding means) | Concentration of cellulose-based additive | % | 2.0 | 2.0 |
| | | pH | — | 5.0 | 5.0 |
| | | Feed rate | ml/min | 5 | 10 |
| | First polishing composition (Composition in discharging means) | Concentration of abrasive grain | % | 0.6 | 0.6 |
| | | Concentration of cellulose fiber (A) | ppm | 2000 | 4000 |
| | | pH of slurry | — | 5.0 | 5.0 |
| | | Additive: acid type | — | Nitric acid | Nitric acid |
| | | Acid concentration in slurry | mol/l | 0.0014 | 0.0014 |
| | | Additive: alkali type | — | Ammonia | Ammonia |
| | | Alkali concentration in slurry | mol/l | 0.035 | 0.035 |
| | Second polishing composition | Composition, pH, etc. | — | Same as those of abrasive grain | Same as those of abrasive grain |
| Polishing evaluation | SiO2 film | First polishing composition | Polishing rate | nm/min | 702 | 1051 |
| | | Second polishing composition | Polishing rate (in the case of second polishing composition only) | nm/min | 435 | 440 |
| | | | Surface roughness | nm | 0.10 | 0.09 |
| | | | Polishing flaw | — | Not clear | Not clear |
| | | Ratio of polishing rates (first polishing composition/second polishing composition) | | — | 1.61 | 2.39 |

TABLE 6

| | | Measurement target | | | Example 12 | Example 13 |
|---|---|---|---|---|---|---|
| Abrasive grain Additive Polishing composition | First polishing composition holding means | Type | | — | Ceria-based composite particulate + Cellulose fiber (A) | Ceria-based composite particulate + Cellulose fiber (A) |
| | | Detail | | % | Slurry of Example 2 | Slurry of Example 4 |
| | | Feed rate | | ml/min | 50 | 50 |
| | Second polishing composition holding means | Type | | — | Ceria-based composite particulate | Ceria-based composite particulate |
| | | Concentration of abrasive grain | | % | 0.3 | 0.4 |
| | | pH | | — | 5 | 5 |
| | | Feed rate | | ml/min | 50 | 50 |
| Polishing evaluation | SiO2 film | First polishing composition | Polishing rate | nm/min | 702 | 1051 |
| | | Second polishing composition | Polishing rate (in the case of second polishing composition only) | nm/min | 210 | 282 |
| | | | Surface roughness | nm | 0.09 | 0.08 |
| | | | Polishing flaw | — | Not clear | Not clear |
| | | Ratio of polishing rates (first polishing composition/second polishing composition) | | — | 3.34 | 3.73 |

Tables 5 and 6 show that polishing in two stages made it possible to finish the surface with less scratches and good smoothness (surface roughness) in a short time.

Example 14

Example 1 was repeated except that the high-purity cellulose fiber (A1) was used and the ammonia concentration in the polishing slurry was 0.048 mol/L.

Example 15

Example 14 was repeated except that the amount of the high-purity cellulose fiber (A1) added in the polishing slurry was 2000 ppm.

Example 16

Ion-exchanged water was added to the high-purity cellulose fiber (A1) obtained in Preparatory Example 2 to adjust its concentration to 0.5% by mass.

Example 14 was repeated except that the concentration of the high-purity cellulose fiber (A1) in the polishing slurry was 0.5% by mass and the amount of the high-purity cellulose fiber added was 4000 ppm relative to the liquid weight.

Example 17

Ion-exchanged water was added to the high-purity cellulose fiber (A1) obtained in Preparatory Example 2 to adjust its concentration to 0.25% by mass.

Next, 70 g of ion-exchanged water was added to 4.5 g (dry mass: 0.9 g) of the ceria-based composite particulate dispersion obtained in Preparatory Example 1, and 60 g of 0.25% high purity cellulose fiber (dry mass: 0.15 g) was further added thereto under stirring. Then, 10% acetic acid and 3% aqueous ammonia were added thereto, and ion-exchanged water was finally added thereto to obtain 150 g of a polishing slurry having a pH of 5.0 and an abrasive grain concentration of 0.6% by mass.

The polishing slurry has an acetic acid concentration of 0.0084 mol/L and an ammonia concentration of 0.048 mol/L, and the amount of the high-purity cellulose fiber added therein was 1000 ppm.

The polishing test was performed using the obtained slurry.

Example 18

Example 14 was repeated except for using the ceria particulate obtained in Preparatory Example 3-2.

Comparative Example 8

The polishing test was performed using the polishing slurry obtained by adding ion-exchanged water to the ceria particulate obtained in Preparatory Example 3-2 to adjust its concentration to 0.6% by mass and adjusting the pH to 5.0 with 3% nitric acid.

Comparative Example 9

The polishing test was performed using the polishing slurry obtained by adding ion-exchanged water to the high-purity cellulose fiber (A1) obtained in Preparatory Example 2 to adjust its concentration to 1000 pm and adjusting the pH to 5.0 with 3% nitric acid.

Tables 7 to 9 show various results of Examples 14 to 18 and Comparative Examples 8 and 9. The results of Comparative Example 1 are also shown for comparison. Table 7 shows data of the silica mother particle of each ceria-based composite particulate. Table 8 shows data of each ceria-based composite particulate and its child particle. Table 9 shows data of each slurry used for the polishing test and results of its polishing evaluation.

TABLE 7

| | Measurement target | | | Example 14 | Example 15 | Example 16 | Example 17 |
|---|---|---|---|---|---|---|---|
| Silica mother particle | Average particle diameter of silica mother particle | | nm | 108 | 108 | 108 | 108 |
| | Property of silica mother particle | | — | Amorphous | Amorphous | Amorphous | Amorphous |
| | Impurities in silica mother particle | Na | ppm | 1 ppm or less | 1 ppm or less | 1 ppm or less | 1 ppm or less |
| | | Ag | ppm | 1 ppm or less | 1 ppm or less | 1 ppm or less | 1 ppm or less |
| | | Al | ppm | 1 ppm or less | 1 ppm or less | 1 ppm or less | 1 ppm or less |
| | | Ca | ppm | 1 ppm or less | 1 ppm or less | 1 ppm or less | 1 ppm or less |
| | | Cr | ppm | 1 ppm or less | 1 ppm or less | 1 ppm or less | 1 ppm or less |
| | | Cu | ppm | 1 ppm or less | 1 ppm or less | 1 ppm or less | 1 ppm or less |
| | | Fe | ppm | 1 ppm or less | 1 ppm or less | 1 ppm or less | 1 ppm or less |
| | | K | ppm | 1 ppm or less | 1 ppm or less | 1 ppm or less | 1 ppm or less |
| | | Mg | ppm | 1 ppm or less | 1 ppm or less | 1 ppm or less | 1 ppm or less |
| | | Ni | ppm | 1 ppm or less | 1 ppm or less | 1 ppm or less | 1 ppm or less |
| | | Ti | ppm | 1 ppm or less | 1 ppm or less | 1 ppm or less | 1 ppm or less |
| | | Zn | ppm | 1 ppm or less | 1 ppm or less | 1 ppm or less | 1 ppm or less |
| | | U | ppm | 1 ppm or less | 1 ppm or less | 1 ppm or less | 1 ppm or less |
| | | Th | ppm | 1 ppm or less | 1 ppm or less | 1 ppm or less | 1 ppm or less |
| | | SO4 | ppm | 1 ppm or less | 1 ppm or less | 1 ppm or less | 1 ppm or less |
| | | NO3 | ppm | 1 ppm or less | 1 ppm or less | 1 ppm or less | 1 ppm or less |
| | | Cl | ppm | 1 ppm or less | 1 ppm or less | 1 ppm or less | 1 ppm or less |
| | | F | ppm | 1 ppm or less | 1 ppm or less | 1 ppm or less | 1 ppm or less |

TABLE 7-continued

| | Measurement target | | | Example 18 | Comparative Example 1 | Comparative Example 8 | Comparative Example 9 |
|---|---|---|---|---|---|---|---|
| Silica mother particle | Average particle diameter of silica mother particle | | nm | — | 108 | — | — |
| | Property of silica mother particle | | | — | Amorphous | — | — |
| | Impurities in silica mother particle | Na | ppm | — | 1 ppm or less | — | — |
| | | Ag | ppm | — | 1 ppm or less | — | — |
| | | Al | ppm | — | 1 ppm or less | — | — |
| | | Ca | ppm | — | 1 ppm or less | — | — |
| | | Cr | ppm | — | 1 ppm or less | — | — |
| | | Cu | ppm | — | 1 ppm or less | — | — |
| | | Fe | ppm | — | 1 ppm or less | — | — |
| | | K | ppm | — | 1 ppm or less | — | — |
| | | Mg | ppm | — | 1 ppm or less | — | — |
| | | Ni | ppm | — | 1 ppm or less | — | — |
| | | Ti | ppm | — | 1 ppm or less | — | — |
| | | Zn | ppm | — | 1 ppm or less | — | — |
| | | U | ppm | — | 1 ppm or less | — | — |
| | | Th | ppm | — | 1 ppm or less | — | — |
| | | SO4 | ppm | — | 1 ppm or less | — | — |
| | | NO3 | ppm | — | 1 ppm or less | — | — |
| | | Cl | ppm | — | 1 ppm or less | — | — |
| | | F | ppm | — | 1 ppm or less | — | — |

TABLE 8

| | Measurement target | | | Example 14 | Example 15 | Example 16 | Example 17 |
|---|---|---|---|---|---|---|---|
| Ceria-based composite particulate | $SiO_2$ content rate (% by mass) in ceria-based composite particulate | | % | 46.0 | 46.0 | 46.0 | 46.0 |
| | $CeO_2$ content rate (% by mass) in ceria-based composite particulate | | % | 54.0 | 54.0 | 54.0 | 54.0 |
| | Parts by mass of ceria relative to 100 parts by mass of silica | | % | 117.4 | 117.4 | 117.4 | 117.4 |
| | Calcination temperature | | °C. | 1090 | 1090 | 1090 | 1090 |
| | Crystallite size | | nm | 15 | 15 | 15 | 15 |
| | Average particle diameter of child particle | | nm | 18 | 18 | 18 | 18 |
| | Specific surface area of composite particulate | | m2/g | 37 | 37 | 37 | 37 |
| | Crystalline form | | — | Cerianite | Cerianite | Cerianite | Cerianite |
| | Average particle diameter | | μm | 0.102 | 0.102 | 0.102 | 0.102 |
| | Impurities in ceria-based composite particulate | Na | ppm | 1 ppm or less | 1 ppm or less | 1 ppm or less | 1 ppm or less |
| | | Ag | ppm | 1 ppm or less | 1 ppm or less | 1 ppm or less | 1 ppm or less |
| | | Al | ppm | 1 ppm or less | 1 ppm or less | 1 ppm or less | 1 ppm or less |
| | | Ca | ppm | 1 ppm or less | 1 ppm or less | 1 ppm or less | 1 ppm or less |
| | | Cr | ppm | 1 ppm or less | 1 ppm or less | 1 ppm or less | 1 ppm or less |
| | | Cu | ppm | 1 ppm or less | 1 ppm or less | 1 ppm or less | 1 ppm or less |
| | | Fe | ppm | 1 ppm or less | 1 ppm or less | 1 ppm or less | 1 ppm or less |

TABLE 8-continued

|  |  |  | Example 18 | Comparative Example 1 | Comparative Example 8 | Comparative Example 9 |
|---|---|---|---|---|---|---|
|  | K | ppm | 1 ppm or less | 1 ppm or less | 1 ppm or less | 1 ppm or less |
|  | Mg | ppm | 1 ppm or less | 1 ppm or less | 1 ppm or less | 1 ppm or less |
|  | Ni | ppm | 1 ppm or less | 1 ppm or less | 1 ppm or less | 1 ppm or less |
|  | Ti | ppm | 1 ppm or less | 1 ppm or less | 1 ppm or less | 1 ppm or less |
|  | Zn | ppm | 1 ppm or less | 1 ppm or less | 1 ppm or less | 1 ppm or less |
|  | U | ppm | 1 ppm or less | 1 ppm or less | 1 ppm or less | 1 ppm or less |
|  | Th | ppm | 1 ppm or less | 1 ppm or less | 1 ppm or less | 1 ppm or less |
|  | SO4 | ppm | 1 ppm or less | 1 ppm or less | 1 ppm or less | 1 ppm or less |
|  | NO3 | ppm | 1 ppm or less | 1 ppm or less | 1 ppm or less | 1 ppm or less |
|  | Cl | ppm | 1 ppm or less | 1 ppm or less | 1 ppm or less | 1 ppm or less |
|  | F | ppm | 1 ppm or less | 1 ppm or less | 1 ppm or less | 1 ppm or less |

| | Measurement target | | | Example 18 | Comparative Example 1 | Comparative Example 8 | Comparative Example 9 |
|---|---|---|---|---|---|---|---|
| Ceria-based composite particulate | SiO$_2$ content rate (% by mass) in ceria-based composite particulate | % | | — | 46.0 | — | — |
| | CeO$_2$ content rate (% by mass) in ceria-based composite particulate | % | | 100.0 | 54.0 | 100.0 | — |
| | Parts by mass of ceria relative to 100 parts by mass of silica | % | | — | 117.4 | — | — |
| | Calcination temperature | °C. | | 710 | 1090 | 710 | — |
| | Crystallite size | nm | | 34.7 | 15 | 34.7 | — |
| | Average particle diameter of child particle | nm | | — | 18 | — | — |
| | Specific surface area of composite particulate | m2/g | | 10 | 37 | 10 | — |
| | Crystalline form | — | | Cerianite | Cerianite | Cerianite | — |
| | Average particle diameter | μm | | 0.117 | 0.102 | 0.117 | — |
| Impurities in ceria-based composite particulate | | Na | ppm | 1 ppm or less | 1 ppm or less | 1 ppm or less | — |
| | | Ag | ppm | 1 ppm or less | 1 ppm or less | 1 ppm or less | — |
| | | Al | ppm | 1 ppm or less | 1 ppm or less | 1 ppm or less | — |
| | | Ca | ppm | 1 ppm or less | 1 ppm or less | 1 ppm or less | — |
| | | Cr | ppm | 1 ppm or less | 1 ppm or less | 1 ppm or less | — |
| | | Cu | ppm | 1 ppm or less | 1 ppm or less | 1 ppm or less | — |
| | | Fe | ppm | 1 ppm or less | 1 ppm or less | 1 ppm or less | — |
| | | K | ppm | 1 ppm or less | 1 ppm or less | 1 ppm or less | — |
| | | Mg | ppm | 1 ppm or less | 1 ppm or less | 1 ppm or less | — |
| | | Ni | ppm | 1 ppm or less | 1 ppm or less | 1 ppm or less | — |
| | | Ti | ppm | 1 ppm or less | 1 ppm or less | 1 ppm or less | — |
| | | Zn | ppm | 1 ppm or less | 1 ppm or less | 1 ppm or less | — |
| | | U | ppm | 1 ppm or less | 1 ppm or less | 1 ppm or less | — |
| | | Th | ppm | 1 ppm or less | 1 ppm or less | 1 ppm or less | — |
| | | SO4 | ppm | 1 ppm or less | 1 ppm or less | 1 ppm or less | — |
| | | NO3 | ppm | 1 ppm or less | 1 ppm or less | 1 ppm or less | — |
| | | Cl | ppm | 1 ppm or less | 1 ppm or less | 1 ppm or less | — |
| | | F | ppm | 1 ppm or less | 1 ppm or less | 1 ppm or less | — |

TABLE 9

| Measurement target | | | | Example 14 | Example 15 | Example 16 | Example 17 |
|---|---|---|---|---|---|---|---|
| Polishing Slurry | Abrasive grain | Type | — | Ceria-based composite particulate | Ceria-based composite particulate | Ceria-based composite particulate | Ceria-based composite particulate |
| | Cellulose-based additive | Type | — | High-purity cellulose fiber (A1) | High-purity cellulose fiber (A1) | High-purity cellulose fiber (A1) | High-purity cellulose fiber (A1) |
| | | Concentration of cellulose-based additive in slurry | ppm | 1000 | 2000 | 4000 | 1000 |
| | Additive (Acid/alkai) | Additive: acid type | — | Nitric acid | Nitric acid | Nitric acid | Acetic acid |
| | | Acid concentration in slurry | mol/l | 0.0014 | 0.0014 | 0.0012 | 0.0084 |
| | | Additive: alkali type | — | Ammonia | Ammonia | Ammonia | Ammonia |
| | | Ammonia concentration in slurry | mol/l | 0.048 | 0.048 | 0.048 | 0.048 |
| | pH of slurry | | — | 5 | 5 | 5 | 5 |
| | Na/solids weight | | ppm | 1 or less | 1 or less | 1 or less | 1 or less |
| | K/solids weight | | ppm | 1 or less | 1 or less | 1 or less | 1 or less |
| | Concentration of abrasive grain | | % | 0.6 | 0.6 | 0.6 | 0.6 |
| Polishing evaluation | SiO2 film | Polishing rate | nm/min | 609 | 768 | 1150 | 694 |
| | | Surface roughness | — | 0.10 | 0.10 | 0.09 | 0.10 |
| | | Polishing flaw | — | Not clear | Not clear | Not clear | Not clear |
| | Aluminum hard disk | Scratch | — | Very few | Very few | Very few | Very few |

| Measurement target | | | | Example 18 | Comparative Example 1 | Comparative Example 8 | Comparative Example 9 |
|---|---|---|---|---|---|---|---|
| Polishing Slurry | Abrasive grain | Type | — | Ceria particulate | Ceria-based composite particulate | Ceria particulate | Not added |
| | Cellulose-based additive | Type | — | High-purity cellulose fiber (A1) | Not added | Not added | High-purity cellulose fiber (A1) |
| | | Concentration of cellulose-based additive in slurry | ppm | 1000 | 0 | 0 | 1000 |
| | Additive (Acid/alkai) | Additive: acid type | — | Nitric acid | Nitric acid | Nitric acid | Nitric acid |
| | | Acid concentration in slurry | mol/l | 0.014 | 0.0013 | 0.0013 | 0.0002 |
| | | Additive: alkali type | — | Ammonia | Ammonia | Ammonia | Ammonia |
| | | Ammonia concentration in slurry | mol/l | 0.048 | 0.035 | 0.048 | 0.013 |
| | pH of slurry | | — | 5 | 5 | 5 | 5 |
| | Na/solids weight | | ppm | 1 or less | 1 or less | 1 or less | 1 or less |
| | K/solids weight | | ppm | 1 or less | 1 or less | 1 or less | 1 or less |
| | Concentration of abrasive grain | | % | 0.6 | 0.6 | 0.6 | 0 |
| Polishing evaluation | SiO2 film | Polishing rate | nm/min | 335 | 430 | 259 | 32 |
| | | Surface roughness | — | 0.13 | 0.11 | 0.14 | 0.15 |
| | | Polishing flaw | — | Not clear | Not clear | Not clear | Not clear |
| | Aluminum hard disk | Scratch | — | Very few | Few | Few | Few |

Table 9 shows that each of the polishing compositions of the present invention (Examples 14 to 18) with an ammonium-type high-purity cellulose fiber (A1) has less impurities, is improved in the polishing speed, has less scratches and is excellent in smoothness (surface roughness). As shown in Example 14 and Example 1 (see Table 4), it can be seen that the polishing composition of the present invention with an ammonium-type high-purity cellulose fiber (A1) is further improved in the polishing speed as compared with the polishing composition with the cellulose fiber (A).

<Test Example>

The polishing slurry containing the ceria-based composite particulate obtained in Example 1 (Preparatory Example 1) was subjected to measurement of flow potential and cationic colloidal titration. An automatic titration device AT-510 (manufactured by Kyoto Electronics Manufacturing Co., Ltd.) equipped with a flow potential titration unit (PCD-500) was used as a titration device.

First, a 0.05% aqueous hydrochloric acid solution was added to the polishing slurry containing the ceria-based composite particulate of Example 1 (Preparatory Example 1) in which the solids concentration had been adjusted to 1% by mass, to adjust to pH 6. The amount of the liquid equivalent to 0.8 g in terms of solids content was placed in a cell of the flow potential measuring device and was subjected to measurement of flow potential. Then, titration was performed by adding a cation colloid titrant (a 0.0025 N poly(diallyldimethylammonium chloride) solution). The amount (ml) of the cation colloid titrant added was plotted on the X axis, and the flow potential (mV) of the polishing slurry containing the ceria-based composite particulate was plotted on the Y axis. The flow potential I (mV) at the start point on the flow potential curve, and the flow potential C (mV) and the amount V (ml) of the cation colloid titrant added at the knick were read, and $\Delta PCD/V = (I-C)/V$ was calculated.

For the polishing slurry of the following Comparative Example 10 described below, $\Delta PCD/V = (I-C)/V$ was similarly calculated.

Comparative Example 10

Preparatory Example 1 was repeated except the pH during disintegration was 8.4. The abrasive grain was diluted with ion-exchanged water and was subjected to pH adjustment with 3% nitric acid to prepare a polishing slurry having an abrasive grain concentration of 0.6% by mass and a pH of 5.0. The polishing speed for the polishing slurry was 300 nm/min as measured in the same manner as in Example 1.

The results are shown in Table 10.

TABLE 10

|  | Example 1 | Comparative Example 10 |
|---|---|---|
| Initial flow potential (mV) | −580 | −568 |
| ΔPCD/V | −65 | −132 |

It was confirmed form the flow potential curve that the initial flow potential (at the point in which the flow potential is 0 ml and pH is 6, for the titration amount of the cationic colloid of 0 ml) in Example 1 was a negative flow potential of −580 mV and ΔPCD/V was −65 which was in the range of −110.0 to −15.0.

REFERENCE SIGNS LIST

1 Particulate holding means
2 Cellulose holding means
3 Mixing section
4 Filtering means
5 Discharging means
6 Switching cock
7 Pump
11 First polishing composition holding means
12 Second polishing composition holding means
13 Junction
14 Filtering means
15 Discharging means
16 Switching cock
17 Pump

The invention claimed is:

1. A polishing composition comprising an abrasive grain, a modified microfibril cellulose in which a cellulose unit has a carboxyl group, and a dispersion medium, wherein the modified microfibril cellulose is an ammonium-type modified microfibril cellulose in which a hydrogen atom of the carboxyl group is replaced by ammonium, wherein the ammonium in the ammonium-type modified microfibril cellulose is $NH^{4+}$.

2. The polishing composition according to claim 1, wherein the modified microfibril cellulose is a modified microfibril cellulose in which at least a part of the cellulose units has a hydroxyl group at the C6 position oxidized to a carboxyl group.

3. The polishing composition according to claim 1, wherein each content of Na and K is 100 ppm or less relative to the solids weight.

4. The polishing composition according to claim 1, wherein each content of Ag, Al, Ca, Cr, Cu, Fe, Mg, Ni, Ti, Zn and Zr is 100 ppm or less relative to the solids weight.

5. The polishing composition according to claim 1, wherein the modified microfibril cellulose has a carboxyl group content of 0.5 to 2.8 mmol/g.

6. The polishing composition according to claim 1, wherein the modified microfibril cellulose is a cellulose fiber having a number average fiber diameter of 1 to 100 nm, a number average fiber length of 0.01 to 300 μm, and a ratio of the number average fiber length to the number average fiber diameter (number average fiber length/number average fiber diameter) of 10 to 3000.

7. The polishing composition according to claim 1, wherein the abrasive grain comprises at least one of cerium oxide, chromium oxide, silica, aluminum oxide, titanium oxide and iron oxide.

8. The polishing composition according to claim 1, wherein the abrasive grain is a ceria-based composite particulate having a mother particle having amorphous silica as a main component and a silica layer having amorphous silica as a main component provided on the surface of the mother particle, the silica layer having a child particle having crystalline ceria as a main component dispersed therein.

9. The polishing composition according to claim 8, wherein the ceria-based composite particulate has:
an average particle diameter of 50 to 350 nm,
a mass ratio of silica to ceria ($M_{SiO2}:M_{CeO2}$) of 100:11 to 100:316, and
an average crystallite size of ceria of 10 to 50 nm.

10. The polishing composition according to claim 8, wherein a flow potential curve obtained by cationic colloid titration is a curve in which the ratio of the amount of change in flow potential (ΔPCD) to the amount (V) of a cation colloid titrant (ΔPCD/V) added at the knick represented by the following formula (1) is −110.0 to −15.0:

$$\Delta PCD/V = (I-C)/V \qquad \text{Formula (1)}$$

wherein C represents a flow potential (mV) at the knick; I represents a flow potential (mV) at the starting point of the flow potential curve; and V represents the amount (ml) of the cation colloid titrant added at the knick.

11. The polishing composition according to claim 1, wherein the polishing composition comprises:
an acid component comprising 0.0001 to 0.13 mol/L of an acetic acid group or nitric acid group; and
a base component comprising 0.003 to 0.13 mol/L of ammonium or an amine.

12. The polishing composition according to claim 1, wherein the polishing composition is used for polishing a semiconductor substrate having a silica film formed thereon.

13. The polishing composition according to claim 1, wherein a mass ratio of the modified microfibril cellulose to the abrasive grain (modified microfibril cellulose/abrasive grain) is 0.002 to 20.

14. A method of producing the polishing composition according to claim 1, comprising:
subjecting to ion exchange using an ion exchange resin, a dispersion comprising a modified microfibril cellulose in which at least a part of the cellulose units has a hydroxyl group at the C6 position oxidized to a carboxyl group; and then
adding ammonia or an amine and adding an abrasive grain,
to produce a polishing composition comprising a modified microfibril cellulose in which a cellulose unit has a carboxyl group, wherein the modified microfibril cellulose is an ammonium-type modified microfibril cellulose in which a hydrogen atom of the carboxyl group is replaced by ammonium, wherein the ammonium in the ammonium-type modified microfibril cellulose is $NH^{4+}$.

15. A method of producing the polishing composition according to claim 1, comprising:
subjecting to ion exchange with an ion exchange resin, a dispersion comprising a modified microfibril cellulose in which at least a part of the cellulose units has a hydroxyl group at the C6 position oxidized to a carboxyl group and an abrasive grain; and then
adding ammonia or an amine,
to produce a polishing composition comprising a modified microfibril cellulose in which a cellulose unit has a carboxyl group, wherein the modified microfibril cellulose is an ammonium-type modified microfibril cellulose in which a hydrogen atom of the carboxyl group is replaced by ammonium, wherein the ammonium in the ammonium-type modified microfibril cellulose is $NH^{4+}$.

16. A method for producing a polished substrate comprising:
first polishing a substrate with a first polishing composition comprising the polishing composition according to claim 1; and
second polishing the substrate with a second polishing composition comprising an abrasive grain and a dispersion medium.

17. The method for producing a polished substrate according to claim 16, wherein the abrasive grain in the first polishing composition and/or the second polishing composition has an average particle diameter of 10 nm or more and 350 nm or less and a number of coarse particles of 0.51 μm or more 100 million particles/mL or less of the abrasive grain on dry basis.

18. The method for producing a polished substrate according to claim 16, wherein the polishing speed with the first polishing composition is higher by 1.2 times or more than that with the second polishing composition.

19. The method of producing a polished substrate according to claim 16, comprising using a polishing composition feeding device comprising: a particulate holding means for holding a dispersion comprising an abrasive grain; a cellulose holding means for holding a dispersion comprising a modified microfibril cellulose; a mixing section in communication with the particulate holding means and the cellulose holding means; a discharging means provided downstream of the mixing section; and a filtering means provided between the particulate holding means and the mixing section;
wherein the first polishing feeds the dispersion comprising the abrasive grain from the particulate holding means through the filtering means to the mixing section while feeding the dispersion comprising the modified microfibril cellulose from the cellulose holding means to the mixing section to form the first polishing composition in the mixing section; and feeds the first polishing composition on a polishing pad from the discharging means to polish the first polishing composition; and
wherein the second polishing feeds the dispersion comprising the abrasive grain as the second polishing composition from the particulate holding means and passing it through the filtering means, and then feeds the second polishing composition from the discharging means onto the polishing pad to polish the second polishing composition.

20. The method for producing a polished substrate according to claim 16, comprising using a polishing composition feeding device comprising: a first polishing composition holding means for holding the first polishing composition; a second polishing composition holding means for holding the second polishing composition; a discharging means in communication with the first polishing composition holding means and the second polishing composition holding means; and a filtering means provided between the second polishing composition holding means and the discharging means;
wherein the first polishing feeds the first polishing composition from the first polishing composition holding means and feeds the first polishing composition from the discharging means onto a polishing pad to polish the first polishing composition; and
wherein the second polishing feeds the second polishing composition from the second polishing composition holding means and passes it through the filtering means, and then feeds the second polishing composition from the discharging means onto the polishing pad to polish the second polishing composition.

21. A method for producing a polished substrate, comprising polishing a substrate by dropping the polishing composition according to claim 1 onto a polishing pad.

22. The method for producing a polished substrate according to claim 21, wherein an abrasive grain has an average particle diameter of 10 nm or more and 350 nm or less and a number of coarse particles of 0.51 μm or more of 100 million particles/mL or less of the abrasive grain on dry basis.

* * * * *